United States Patent
Owen et al.

(10) Patent No.: US 10,767,112 B2
(45) Date of Patent: *Sep. 8, 2020

(54) METHODS OF PRODUCING METAL SULFIDES, METAL SELENIDES, AND METAL SULFIDES/SELENIDES HAVING CONTROLLED ARCHITECTURES USING KINETIC CONTROL

(71) Applicants: THE TRUSTEES OF COLUMBIA UNIVERSITY IN THE CITY OF NEW YORK, New York, NY (US); Gregory T. Cleveland, Missouri City, TX (US); Ilan Jen-La Plante, New York, NY (US); Leslie Sachiyo Hamachi, New York, NY (US)

(72) Inventors: Jonathan S. Owen, New York, NY (US); Mark P. Hendricks, Richland, WA (US); Michael P. Campos, New York, NY (US); Gregory T. Cleveland, Missouri City, TX (US); Ilan Jen-La Plante, New York, NY (US); Leslie Sachiyo Hamachi, New York, NY (US)

(73) Assignee: The Trustees of the Columbia University in the City of New York, New York, NY (US)

( * ) Notice: Subject to any disclaimer, the term of this patent is extended or adjusted under 35 U.S.C. 154(b) by 384 days.

This patent is subject to a terminal disclaimer.

(21) Appl. No.: 15/541,937

(22) PCT Filed: Jan. 15, 2016

(86) PCT No.: PCT/US2016/013518
§ 371 (c)(1),
(2) Date: Jul. 6, 2017

(87) PCT Pub. No.: WO2016/115416
PCT Pub. Date: Jul. 21, 2016

(65) Prior Publication Data
US 2017/0369779 A1 Dec. 28, 2017

Related U.S. Application Data

(60) Provisional application No. 62/104,041, filed on Jan. 15, 2015, provisional application No. 62/174,491, (Continued)

(51) Int. Cl.
*C09K 11/88* (2006.01)
*C01G 19/00* (2006.01)
(Continued)

(52) U.S. Cl.
CPC .......... *C09K 11/883* (2013.01); *C01B 19/007* (2013.01); *C01B 19/04* (2013.01);
(Continued)

(58) Field of Classification Search
CPC ........ C01G 11/02; C01G 13/00; C01G 15/00; C01G 9/00; C01G 3/12; C01G 3/112;
(Continued)

(56) References Cited

U.S. PATENT DOCUMENTS 8,470,636 B2 * 6/2013 Radu ............... B82Y 30/00
257/E31.004
10,253,256 B2 * 4/2019 Owen .................. C01G 21/21
(Continued)

FOREIGN PATENT DOCUMENTS

CN 1645559 * 7/2005
CN 101402468 A1 4/2009
(Continued)

OTHER PUBLICATIONS

Translation of CN 1645559, Jul. 27, 2005.*
(Continued)

*Primary Examiner* — C Melissa Koslow
(74) *Attorney, Agent, or Firm* — BakerHostetler

(57) ABSTRACT

The present invention is directed to methods of preparing metal sulfide, metal selenide, or metal sulfide/selenide nanoparticles and the products derived therefrom. In various embodiments, the nanoparticles are derived from the reaction between precursor metal salts and certain sulfur- and/or selenium-containing precursors each independently having a structure of Formula (I), (II), or (III), or an isomer, salt, or tautomer thereof, where $Q^1$, $Q^2$, $Q^3$, $R^1$, $R^2$, $R^3$, $R^5$, and X are defined within the specification.

42 Claims, 34 Drawing Sheets

Related U.S. Application Data filed on Jun. 11, 2015, provisional application No. 62/185,088, filed on Jun. 26, 2015.

(51) Int. Cl.

| | |
|---|---|
| *C01G 21/21* | (2006.01) |
| *C01G 53/11* | (2006.01) |
| *C01G 3/12* | (2006.01) |
| *C01G 9/08* | (2006.01) |
| *C01G 11/02* | (2006.01) |
| *C01B 19/00* | (2006.01) |
| *C01G 1/12* | (2006.01) |
| *C01B 19/04* | (2006.01) |
| *C09K 11/56* | (2006.01) |
| *C09K 11/58* | (2006.01) |
| *C09K 11/60* | (2006.01) |
| *C09K 11/66* | (2006.01) |
| *B82Y 30/00* | (2011.01) |
| *B82Y 20/00* | (2011.01) |
| *B82Y 40/00* | (2011.01) |
| *H01L 33/04* | (2010.01) |

(52) U.S. Cl.
CPC ............... *C01G 1/12* (2013.01); *C01G 3/12* (2013.01); *C01G 9/08* (2013.01); *C01G 11/02* (2013.01); *C01G 19/00* (2013.01); *C01G 19/006* (2013.01); *C01G 21/21* (2013.01); *C01G 53/11* (2013.01); *C09K 11/565* (2013.01); *C09K 11/582* (2013.01); *C09K 11/602* (2013.01); *C09K 11/661* (2013.01); *C09K 11/881* (2013.01); *B82Y 20/00* (2013.01); *B82Y 30/00* (2013.01); *B82Y 40/00* (2013.01); *C01P 2002/72* (2013.01); *C01P 2002/84* (2013.01); *C01P 2004/04* (2013.01); *C01P 2004/16* (2013.01); *C01P 2004/24* (2013.01); *C01P 2004/32* (2013.01); *C01P 2004/64* (2013.01); *C01P 2004/80* (2013.01); *H01L 33/04* (2013.01); *Y10S 977/774* (2013.01); *Y10S 977/824* (2013.01); *Y10S 977/825* (2013.01); *Y10S 977/892* (2013.01); *Y10S 977/896* (2013.01); *Y10S 977/95* (2013.01)

(58) Field of Classification Search
CPC ........ C01G 39/06; C01G 45/00; C01G 49/12; C09K 11/883; C09K 11/881; C09K 11/564; C09K 11/562; C01B 19/04; B82Y 20/00; B82Y 40/00
See application file for complete search history.

(56) References Cited

U.S. PATENT DOCUMENTS

| | | |
|---|---|---|
| 2005/0036938 A1 | 2/2005 | Hyeon |
| 2005/0254528 A1 | 11/2005 | Galun et al. |
| 2009/0289233 A1* | 11/2009 | Jang ............... C01B 17/20 |
| | | 252/519.4 |
| 2011/0001096 A1 | 1/2011 | Mokari et al. |
| 2014/0110640 A1* | 4/2014 | Kamiya ............ C01G 19/006 |
| | | 252/519.14 |

FOREIGN PATENT DOCUMENTS

| | | | |
|---|---|---|---|
| CN | 101402468 | * | 8/2009 |
| EP | 2669409 | * | 12/2013 |
| EP | 2669409 A1 | | 12/2013 |
| WO | WO 2010/118279 A1 | | 10/2010 |
| WO | WO 2013/091114 | * | 6/2013 |
| WO | WO 2013/091114 A1 | | 6/2013 |
| WO | WO 2015/048460 A1 | | 4/2015 |
| WO | WO 2016/115416 A1 | | 7/2016 |

OTHER PUBLICATIONS

Translation for CN 101402468, Aug. 4, 2009. labeled as "Description CN1317737".*
Ajibade, "Synthesis and Use of [Cd(Detu)2(OOCCH3)2]-H2O as Single Molecule Precursor for Cds Nanoparticles", The Scientific World Journal, 2013, vol. 2013, 1-6.
Hendricks et al., "A tunable library of substituted thiourea precursors to metal sulfide nanocrystals", Science, Jun. 12, 2015, vol. 348, 1226-1230.
Pradhan et al., "Synthesis of High-Quality Metal Sulfide Nanoparticles from Alkyl Xanthate Single Precursors in Alkylamine Solvents", J. Phys. Chem B, Nov. 20, 2003, vol. 107, 13843-13854.
Yong et al., "Control of the Morphology and Size of PbS Nanowires Using Gold Nanoparticles", Chemistry of Materials, Nov. 16, 2006, vol. 18, 5965-5972.

* cited by examiner

| Precursor | | $R_1$ | $R_2$ | $R_3$ | $R_4$ | $k_{obs}$ (s$^{-1}$) | Emission Peak, nm |
|---|---|---|---|---|---|---|---|
| ![thiourea structure with R1,R2-N-C(=S)-N-R3,R4] | 1 | Ph | H | C$_4$H$_9$ | C$_4$H$_9$ | 0.043 | 384 |
| | 2 | Ph | H | Ph | CH$_3$ | 0.038 | 395 |
| | 3 | CH$_3$ | CH$_3$ | CH$_3$ | CH$_3$ | 0.00064 | 457 |
| | 4 | -[pyrrolidine]- | | -[pyrrolidine]- | | 0.00034 | 472 |
| ![imidazolidine-2-thione structure] | 5 | Ph | Ph | -- | -- | -- | |
| | 6 | t-Bu | t-Bu | -- | -- | -- | |
| | 7 | CH$_3$ | CH$_3$ | -- | -- | 0.00013 | 482 |
| | 8 | CH$_2$CH$_3$ | CH$_2$CH$_3$ | -- | -- | -- | |
| | 9 | i-Pr | i-Pr | -- | -- | 0.00001 | |
| ![thiocarbonate R1-O-C(=S)-O-R2] | 10 | 4-MeO-Ph | 4-MeO-Ph | -- | -- | 0.053 | 405 |
| | 11 | 4-Me-Ph | 4-MeO-Ph | -- | -- | 0.028 | 414 |
| | 12 | 4-Me-Ph | Ph | -- | -- | 0.017 | 428 |
| | 13 | 4-Me-Ph | 4-CF$_3$-Ph | -- | -- | 0.010 | 437 |
| | 14 | octadecyl | octadecyl | -- | -- | -- | |
| ![imidazolidine-2-selone structure] | 15 | Ph | Ph | -- | -- | 0.025 | 531 |
| | 16 | t-Bu | t-Bu | -- | -- | 0.0074 | 606 |
| | 17 | CH$_3$ | CH$_3$ | -- | -- | 0.0033 | 620 |
| | 18 | CH$_2$CH$_3$ | CH$_2$CH$_3$ | -- | -- | 0.0013 | 630 |
| | 19 | i-Pr | i-Pr | -- | -- | 0.00012 | 636 |

| | R₁ | R₂ | R₃ |
|---|---|---|---|
| 1 | 3,5-(CF₃)₂Ph | Ph | H |
| 2 | Ph | Ph | " |
| 3a | 4-CN-Ph | C₁₂H₂₅ | " |
| 3b | 4-CF₃-Ph | " | " |
| 3c | 4-Cl-Ph | " | " |
| 3d | Ph | " | " |
| 3e | 4-Me-Ph | " | " |
| 3f | 4-MeO-Ph | " | " |
| 4 | Ph | C₆H₁₃ | " |
| 5 | t-butyl | C₁₂H₂₅ | " |
| 6 | i-propyl | " | " |
| 7 | cyclohexyl | " | " |
| 8 | C₆H₁₃ | " | " |
| 9 | C₆H₁₃ | C₄H₉ | C₄H₉ |
| 10 | " | C₈H₁₇ | C₈H₁₇ |
| 11 | Ph | C₄H₉ | C₄H₉ |

(A)

(B)

FIG. 13C-E
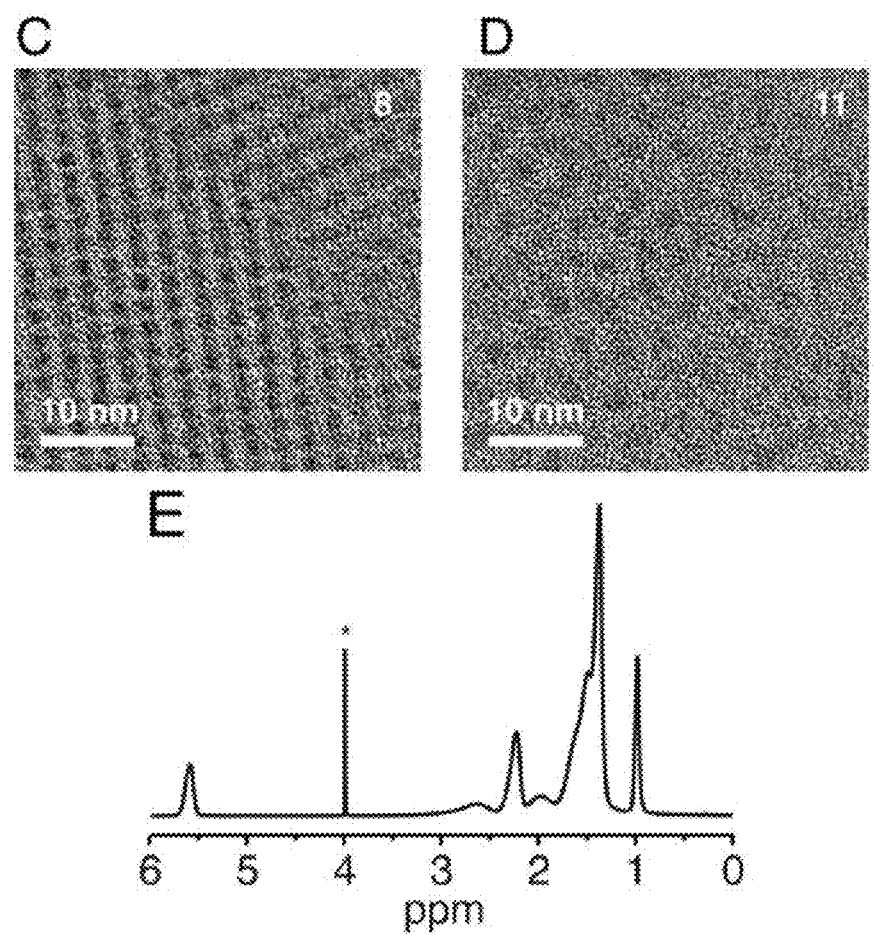

| | $R_1$ | $R_2$ | T(°C) | $k_{rel}$ |
|---|---|---|---|---|
| 1 | 3,5-CF$_3$-Ph | Ph | 90 | 4000 |
| 2 | Ph | Ph | 90 | 1100 |
| 3a | p-CN-Ph | C$_{12}$H$_{25}$ | 120 | 200 |
| 3b | p-CF$_3$-Ph | C$_{12}$H$_{25}$ | 90, 120 | 91 |
| 3c | p-Cl-Ph | C$_{12}$H$_{25}$ | 120 | 45 |
| 3d | Ph | C$_{12}$H$_{25}$ | 120 | 21 |
| 3e | p-Me-Ph | C$_{12}$H$_{25}$ | 120 | 16 |
| 3f | p-OMe-Ph | C$_{12}$H$_{25}$ | 120, 150 | 11 |
| 5 | t-butyl | C$_{12}$H$_{25}$ | 150 | 19 |
| 6 | i-propyl | C$_{12}$H$_{25}$ | 150 | 2.6 |
| 7 | cyclohexyl | C$_{12}$H$_{25}$ | 150 | 2.3 |
| 8 | hexyl | C$_{12}$H$_{25}$ | 150 | 1 |

METHODS OF PRODUCING METAL SULFIDES, METAL SELENIDES, AND METAL SULFIDES/SELENIDES HAVING CONTROLLED ARCHITECTURES USING KINETIC CONTROL

CROSS-REFERENCE TO RELATED APPLICATIONS

This application is a National Stage Application filed under 35 U.S.C. 371 of International Application No. PCT/US2016/013518, filed Jan. 15, 2016, which claims the benefit of priority of U.S. Patent Application Ser. Nos. 62/104,041, filed Jan. 15, 2015; 62/174,491, filed Jun. 11, 2015; and 62/185,088, filed Jun. 26, 2015, the contents of which are incorporated by reference herein in their entireties for all purposes.

GOVERNMENT RIGHTS

This invention was made with government support under Grant No. DE-SC0001085 and Grant No. DE-SC0006410 awarded by the Department of Energy, Grant No. CHE1151172 awarded by the National Science Foundation, and Grant No. RR017528 awarded by the National Institutes of Health. The government has certain rights in the invention.

TECHNICAL FIELD

This disclosure relates to novel methods of preparing monodispersed metal sulfides and selenides, useful in quantum dot applications.

BACKGROUND

Quantum dots (QDs) emit narrow-band luminescence that is tunable across the visible spectrum. For this reason, QDs are a cost-effective front-runner among developing down-converting technologies. One class of QDs is core-shell QDs, which can contain two or more distinct semiconductor materials (e.g., CdS and CdSe). Graded alloy core-shell interfaces—interfaces between two materials that vary smoothly from one material to the other—can be used, but synthesis of QDs, including graded core-shell QDs, can be challenging to control and to scale to large quantities. Existing QD synthesis is also limited by two intertwined factors: (1) lack of knowledge concerning the ideal QD structure required for stable luminescence under "on-chip" operating conditions, and (2) poorly understood syntheses that suffer from highly variable reactivity. Both can make it difficult to increase the scale of QD synthesis. Therefore, there is a need for controlled, scalable, reliable processes for preparing compositionally graded nanostructured materials, including graded core-shell QDs.

The present disclosure addresses at least some of these long-felt problems.

SUMMARY

The present invention is directed to methods of preparing metal sulfide, metal selenide, metal sulfide/selenide, mixed metal sulfide, mixed metal selenide, and mixed metal sulfide/selenide nanoparticles with controlled compositions/architectures and the products derived therefrom. Certain embodiments comprise contacting (a) at least two precursor metal salts with a sulfur- or selenium-containing precursor or (b) a precursor metal salt with a sulfur-containing precursor, a selenium-containing precursor, or a mixture of sulfur- and selenium-containing precursor, simultaneously or sequentially in a solution, each precursor metal salt being capable of reacting with each sulfur- and selenium-containing precursor to form the corresponding metal sulfide and metal selenide. Separate embodiments provide methods comprising contacting two or more precursor metal salts (preferably two) with a sulfur-containing precursor, a selenium-containing precursor, or a combination of sulfur- and selenium-containing precursors to form the nanoparticles. Other embodiments to prepare these nanoparticles are described elsewhere herein. Further, the contacting gives rise to reaction conditions sufficient to control the particle size, particle distribution, and particle composition of the nanoparticles to predetermined architecture. In the embodiments, the sulfur- or selenium-containing precursor each independently has a structure of Formula (I), (II), or (III), or an isomer, salt, or tautomer thereof,

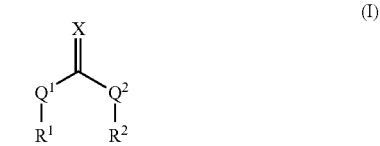

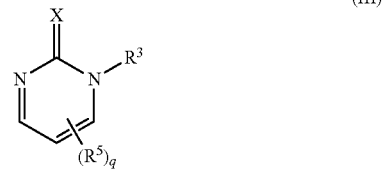

wherein
$Q^1$ is independently —O—, —S—, Se—, —$CR^3R^4$—, —$N(R^4)$— or $P(R^4)$—;
$Q^2$ is independently —O—, —S—, Se—, —$CR^3R^4$—, —$N(R^3)$— or $P(R^3)$—;
$Q^3$ is an optionally substituted aryl or optionally substituted heteroaryl;
$R^1$, $R^2$, $R^3$, and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;
or optionally any two of $R^1$, $R^2$, $R^3$, and $R^4$ are, within the same structure, linked to form an optionally substituted 5- to 10-membered (preferably 5-membered or 6-membered) comprising an optionally substituted alkylene or an optionally substituted and/or conjugated alkenylene linkage;
or optionally, one or more of $R^1$, $R^2$, and $R^3$ is not H;
$R^5$ is halogen, —CN, —$NO_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;

X is S or Se; and

Y is a bond, —O—, —S—, or —N($R^3$)—.

These structures of Formulae (I), (II), or (III) exhibit kinetics favorable to the formation of monodispersed nanoparticles of the corresponding metal sulfide and/or selenide, the specific properties of these nanoparticles depending on the relative reaction kinetics, which in turn depend on the substituents.

Other embodiments provide methods of preparing metal sulfide, metal selenide, or metal sulfide/selenide nanoparticles comprising contacting a precursor metal salt with a sulfur- or selenium-containing precursor or a mixture of sulfur- and selenium-containing precursor, each sulfur- or selenium-containing precursor independently having a structure of Formula (IA), (II), or (III), or an isomer, salt, or tautomer thereof, in solution under controlled nucleation and growth conditions for the formation of the monodispersed nanoparticles:

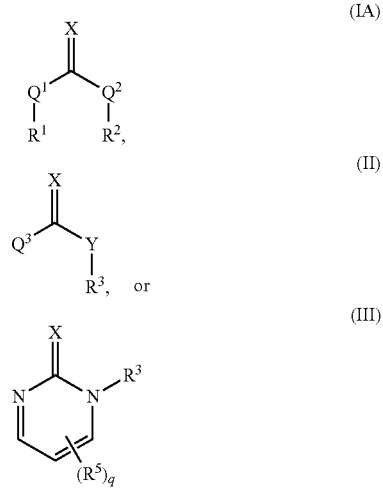

wherein $Q^1$ is independently —O—, —S—, Se—, —$CR^3R^4$—, —N($R^4$)— or P($R^4$)—;

$Q^2$ is independently —O—, —S—, Se—, —$CR^3R^4$—, —N($R^3$)— or P($R^3$)—;

$Q^3$ is optionally substituted aryl or optionally substituted heteroaryl;

$R^1$ and $R^2$ are independently at each occurrence optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

$R^3$ and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

or optionally any two of $R^1$, $R^2$, $R^3$, and $R^4$ are, within the same structure, linked to form an optionally substituted 5- to 10-membered (preferably 5-membered or 6-membered) heterocycle comprising an optionally substituted alkylene or an optionally substituted and/or conjugated alkenylene linkage;

or optionally, one or more of $R^1$, $R^2$, and $R^3$ is not H; $R^5$ is halogen, —CN, —NO2, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;

X is S or Se; and

Y is a bond, —O—, —S—, or —N($R^3$)—.

In those embodiments where mixtures of sulfur- and selenium-containing precursors are used, in further aspects, the specific sulfur- and selenium-containing precursors are chosen such that their reaction kinetics with the precursor metal salt are matched. In such aspects, the ratio of the respective pseudo first order rate constants with the precursor metal salt are in a range of from 1 to 1.1, from 1.1 to 1.2, from 1.2 to 1.3, from 1.3 to 1.4, from 1.4 to 1.5, from 1.5 to 1.6, from 1.6 to 1.7, from 1.7 to 1.8, from 1.8 to 1.9, from 1.9 to 2, from 2 to 2.2, from 2.2 to 2.4, from 2.4 to 2.6, from 2.6 to 2.8, from 2.8 to 3, from 3 to 4, from 4 to 5, from 5 to 10, or any combination of two or more of these ranges, under the reaction conditions employed. Such conditions provide homogeneous or graded alloys as described elsewhere herein.

In those embodiments where mixtures of sulfur- and selenium-containing precursors are used, in further aspects, the specific sulfur- and selenium-containing precursors are chosen such that their reaction kinetics with the precursor metal salt are deliberately mismatched. In such aspects, the ratio of the respective pseudo first order rate constants of the sulfur- and selenium-containing precursors with the precursor metal salt are in a range of from 10 to 100, from 100 to 1000, from 1000 to 10,000, or any combination of two or more of these ranges, under the reaction conditions employed.

Convenient values for these pseudo-first order rate constants, $k_{obs}$ ($s^{-1}$) range from $1\times10^{-4}$ to $5\times10^{-4}$, from $5\times10^{-4}$ to $1\times10^{-3}$, from $1\times10^{-3}$ to to $5\times10^{-3}$, from $5\times10^{-3}$ to $1\times10^{-2}$, from $1\times10^{-2}$ to $5\times10^{-2}$, from $5\times10^{-2}$ to $1\times10^{-1}$, from $1\times10^{-1}$ to 0.5, from 0.5 to 1, or any combination of two or more of these ranges.

The sulfur- and/or selenium-containing precursors may comprise aliphatic, olefinic, and aromatic structures as described herein.

In certain embodiments, X is S. In other embodiments, X is Se. Mixtures of S and Se structures are included within the scope of the present invention. All of the precursor structures described here are independent embodiments when used individually, and all combinations or permutations of these precursor structures are individual embodiments when combined with any other precursor structure to form metal sulfides, metal selenides, or mixed sulfides/selenides.

In certain of these embodiments, the precursor metal salt comprises a $C_{2-30}$ carboxylate (preferably, but not limited to, oleate), thiocarboxylate, (alkyl)phosphonate, alkylsulfonate, alkylphosphate, alkylsulfate, alkylphosphonamide, or halide (e.g., F, Cl, Br, or I) counterion, or any counterion or combination of counterions described in this application. Other anions may be used, as long as they do not adversely impact the controlled nucleation and growth of the nanoparticles. The precursor metal salts may also comprise Cd, Cu, Fe, Ga, Hg, In, Mn, Mo, or Zn, preferably Cd, Cu, Ga, In, Ni, Pb, or Zn. Cd and Pb are individually preferred. Other metals capable of forming sulfides and selenides may also be considered.

In related embodiments, the metal salts may be contacted with the sulfur- and/or selenium-containing precursor in solution at the same time or sequentially, or as a combination of concurrent or sequential contacts.

In still other embodiments, the methods may provide for spontaneous nucleation of the metal-sulfide/selenide nanoparticles, of the methods may be applied to one or more metal, metal oxide, metal phosphide metal sulfide, metal selenide nucleants, these nucleants forming the core of a core-shell arrangement.

The invention also provide that the methods result in the formation of nanoparticles containing a single metal sulfide, a single metal selenide, or a mixed metal sulfide and/or selenide. Where the nanoparticles contain a mixed metal sulfide and/or selenide, the composition may contain the same or different amounts of the different metal sulfide and metal selenide distributed throughout each individual structure. This distribution of composition may vary continuously (e.g., graded in a linear or non-linear fashion) throughout its structure, reflective of the kinetics of the reactions between combinations of metal and sulfur-/selenide precursors). The composition of metal sulfide/metal selenide may also vary discontinuously (i.e., in a core-shell arrangement or other arrangement having discrete, discontinuous transitions) throughout its structure. In some embodiments, the particles may have alternating layers. These different structures represent choices made in the syntheses employed.

Structures may be reflective of the reaction kinetics or the sequential processing of the precursors, and the use of various precursors, salts, kinetics, and process conditions enable one of skill in the art to construct nanomaterials (nanoparticles, nanocrystals, nanowires, nanotubes, and the like) having a desired structure based on the teachings herein.

The methods are useful for preparing populations of monodispersed nanoparticles, including those having substantially spherical, cylindrical, or nanosheet shapes.

In some embodiments, the nanoparticles are crystalline or quasi-crystalline. In some embodiments, the metal sulfide, metal selenide, or metal sulfide/selenide nanoparticles exhibit the characteristics of quantum dots. Exemplary compositions include those comprising CdS, CdSe, CuS, CuSe, GaS, GaSe, InS, InSe, NiS, NiSe, PbS, PbSe, ZnS, ZnSe or any combination, alloy, or mixture thereof, including graded and discontinuously graded core shell structures.

In some embodiments, the nanocrystals have diameters greater than their exciton Bohr radii. In other embodiments, the nanocrystals have diameters less than their exciton Bohr radii.

Those devices and applications (e.g., electronic applications, including electronic displays, television screens, transistors, solar cells, light emitting diodes (LEDs), and diode lasers) containing the nanoparticles provided by these methods are also considered to be within the scope of the disclosure.

BRIEF DESCRIPTION OF THE DRAWINGS

The present application is further understood when read in conjunction with the appended drawings (including those in the Appendices). For the purpose of illustrating the subject matter, exemplary embodiments of the subject matter are shown in these drawings; however, the presently disclosed subject matter is not limited to the specific methods, devices, and systems disclosed. In addition, the drawings are not necessarily drawn to scale. In the drawings:

FIG. 1 further illustrates how the products of one pot syntheses of graded core-shell QD with intermixing at interface is determined by the relative conversion rates of the selenium and sulfur (C-1 and C2).

Figure 29:
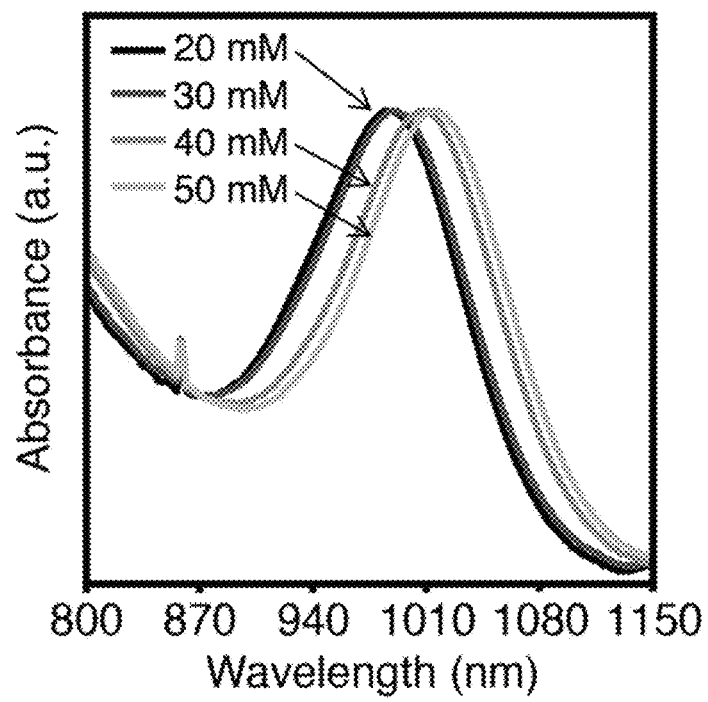
Figure 30:
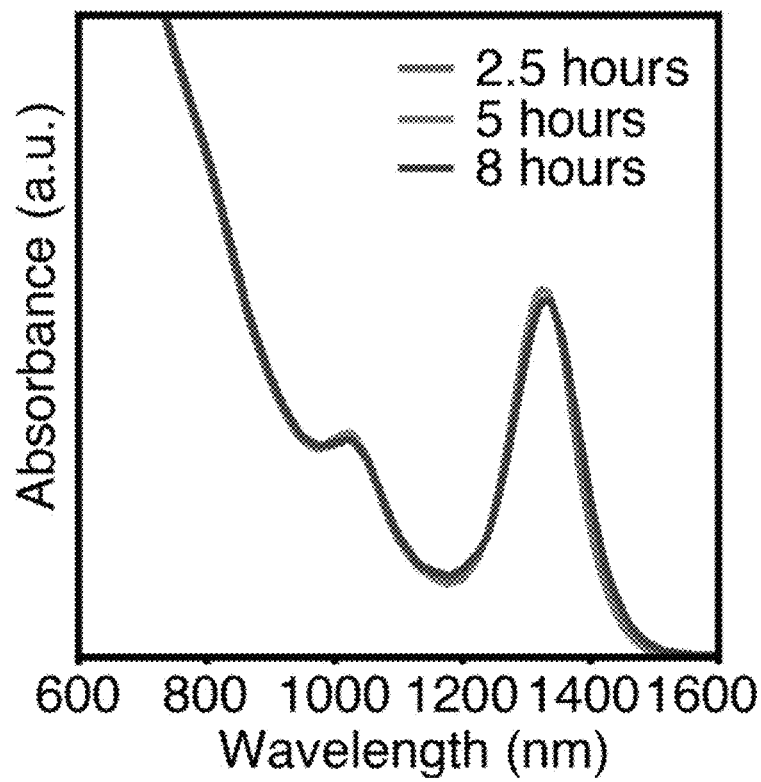

FIG. 29 shows the UV-Vis-NIR spectra of aliquots removed from four PbSe nanocrystal synthesis reactions shown in Example 3.12.5 at completion, each of which was conducted at a different concentration FIG. 30 shows the UV-Vis-NIR spectra of aliquots removed from the PbSe nanocrystal synthesis reaction showing the slowness of Ostwald ripening under the conditions of Example 3.12.6.

Figure 31:
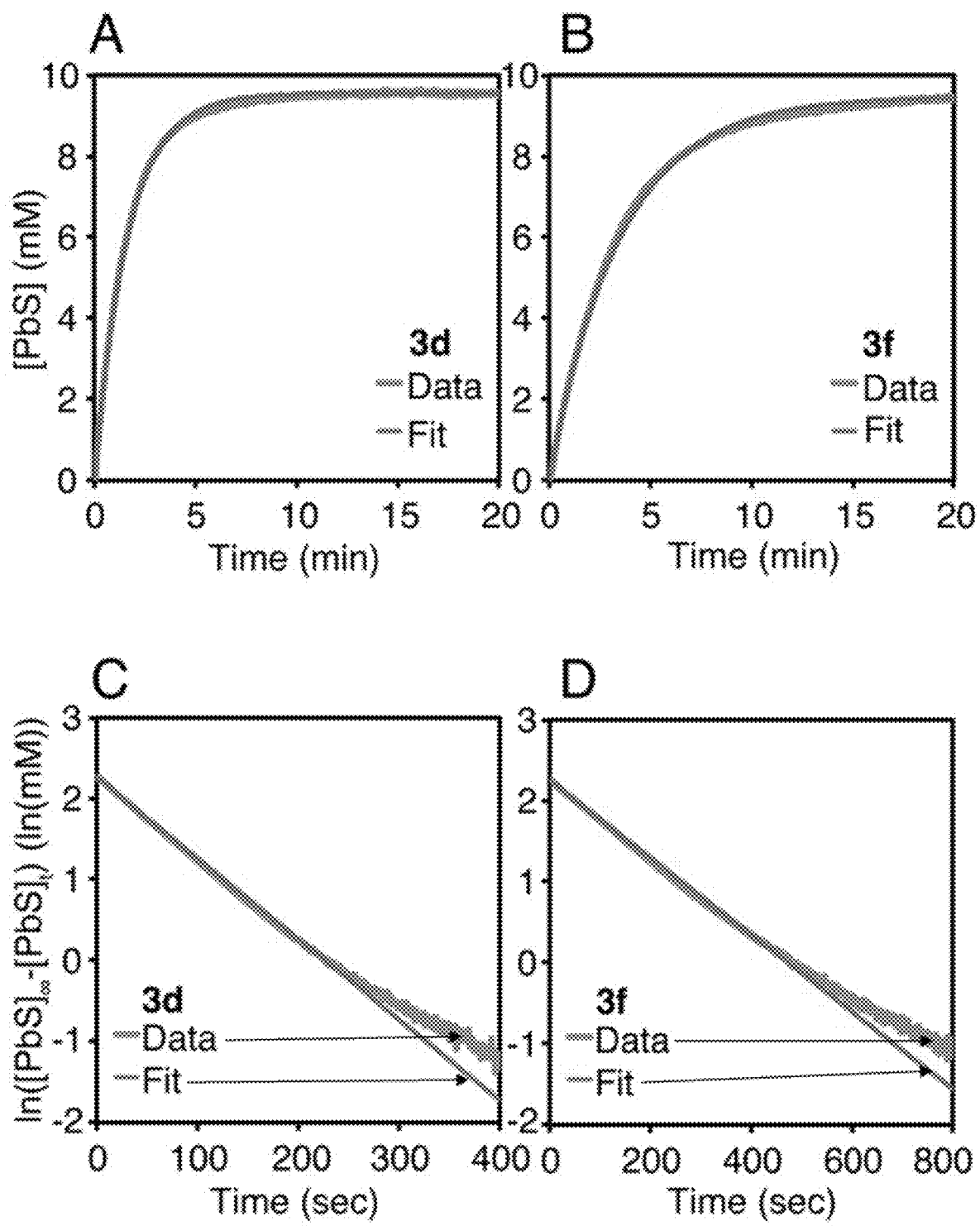

FIG. 31 shows exemplary first-order fits to kinetics data, derived from reactions run as described for kinetics experiments with N-phenyl-N'-n-clodecylthiourea 3d) (left) and N-(p-methoxyphenyl)-N'-n-dodecylthiourea (3f) (right). The upper plots show the formation of PbS as a function of time, fit with a first order trace in red. The lower plots show the same data plotted against ln([PbS]), the linearity of which supports the ability to model the data as first order.

Figure 32:
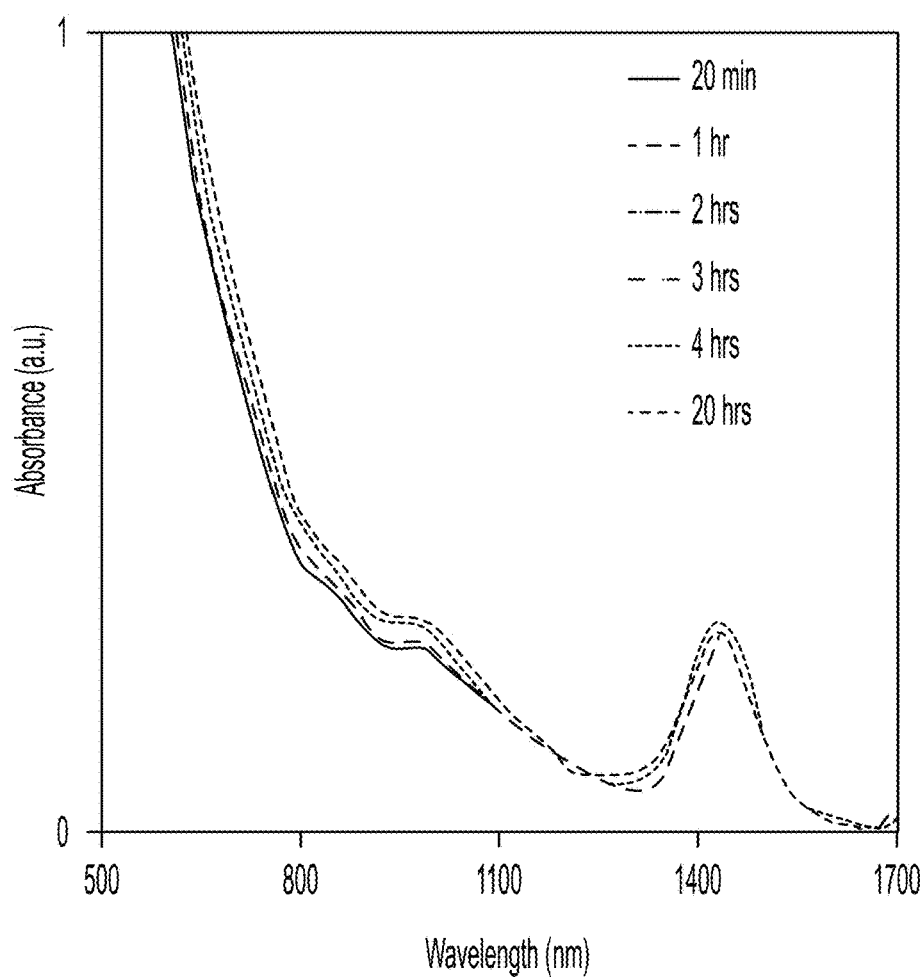

FIG. 32 shows absorbance spectra of aliquots illustrating slow Ostwald ripening for the PbS system described in Example 4.1.

Figure 33:
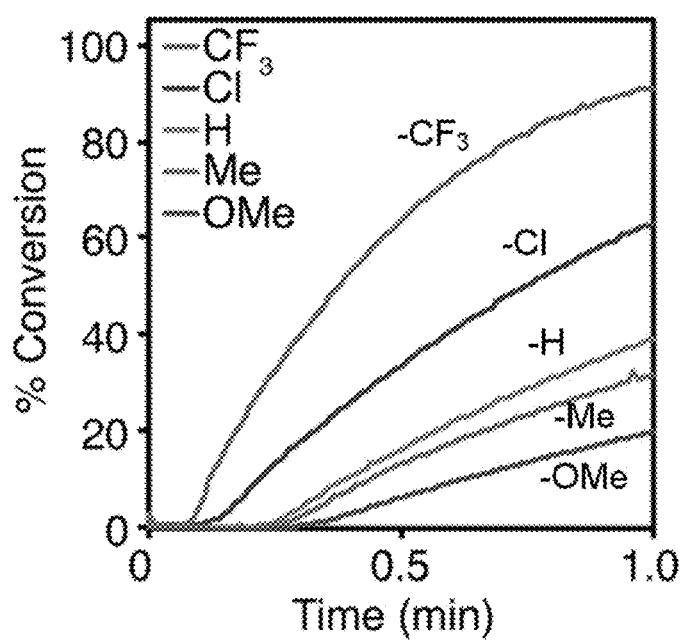
Figure 34:
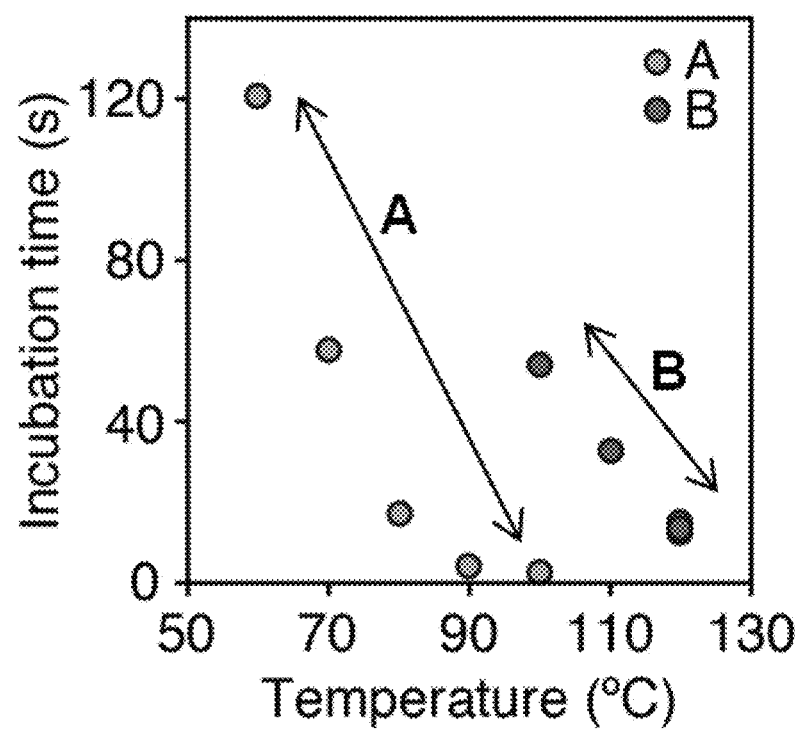

FIG. 33 shows kinetics traces showing the incubation time of various N-p-X-phenyl-N'-n-dodecylthioureas reacting with lead oleate under standard kinetics conditions FIG. 34 shows the relationship between reaction temperature and incubation time for A) N-phenyl-N'-o-tolylthiourea and B) N-dodecyl-N'-(p-(trifluoromethyl)phenyl)thiourea at various temperatures, as described in Example 4.1.3.

Figure 35:
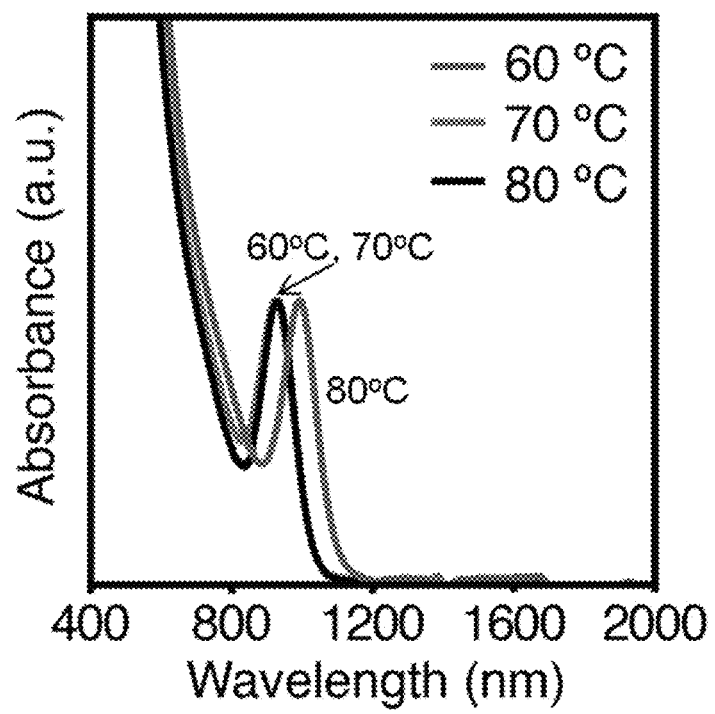

FIG. 35 shows the UV-Vis-NIR absorbance spectra of aliquots removed from PbS nanocrystal synthesis reactions conducted at 80° C., 70° C., and 60° C. under conditions described in Example 4.1.4.

Figure 36:
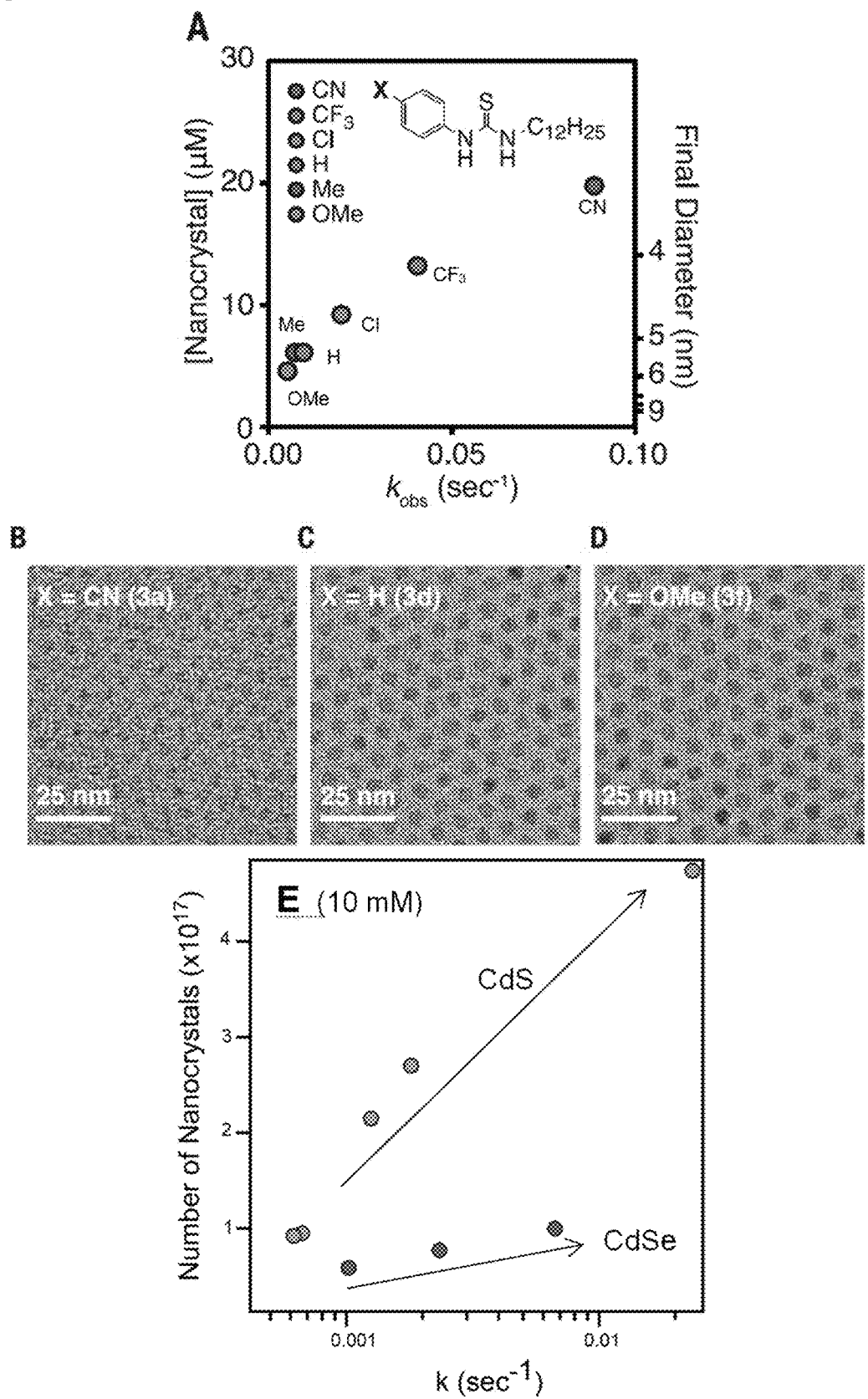

FIG. 36 illustrates the smooth relationship between the nanocrystal size (d=2.5-7.2 nm) and the conversion rate constant. (A)-(D) show data for the phenyl thiourea system described in Example 4.2. (E) compares the relationship of nanoparticles formed as a function of $k_{obs}$ for various CdS and CdSe systems.

Figure 37:
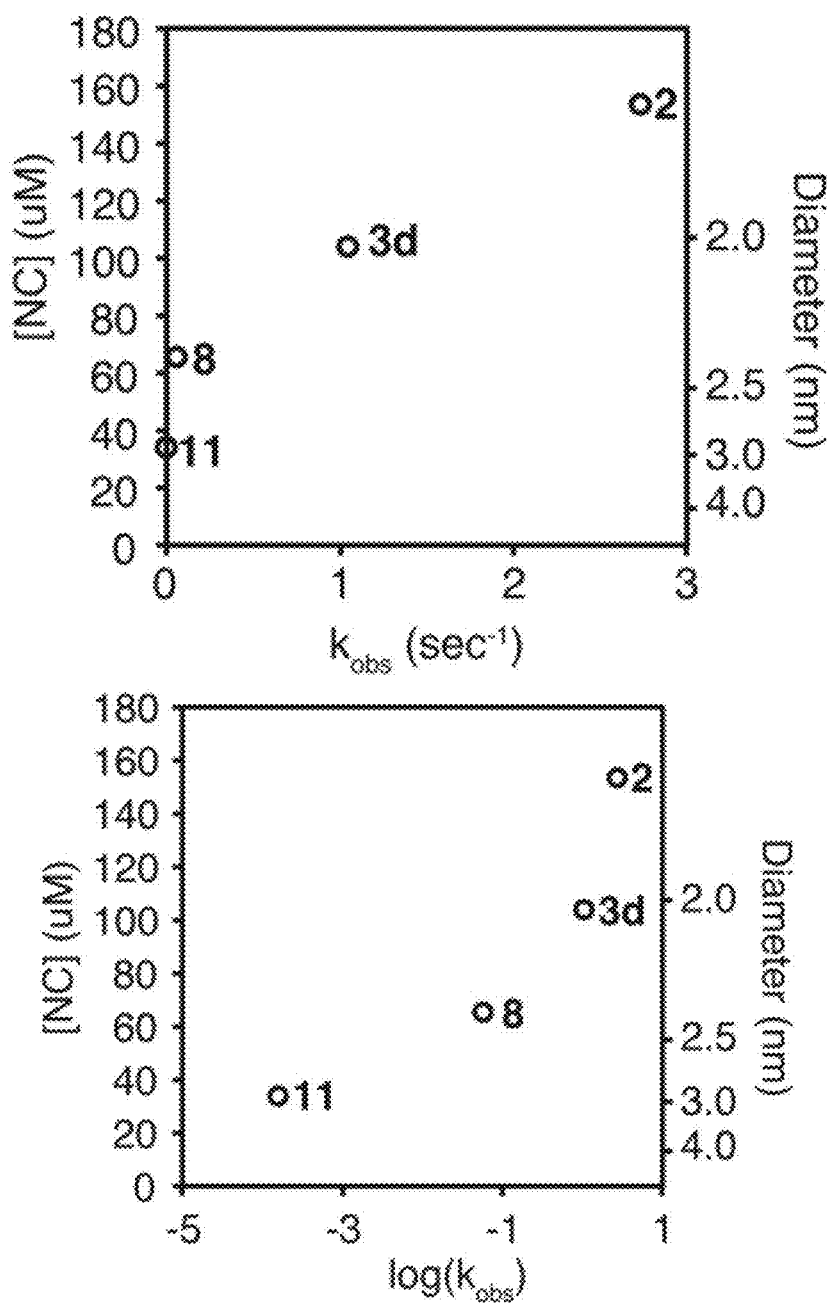

FIG. 37 shows CdS nanocrystal number and size as a function of rate. See Example 4.2.

Figure 38:
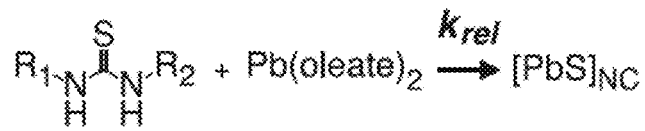
Figure 38:
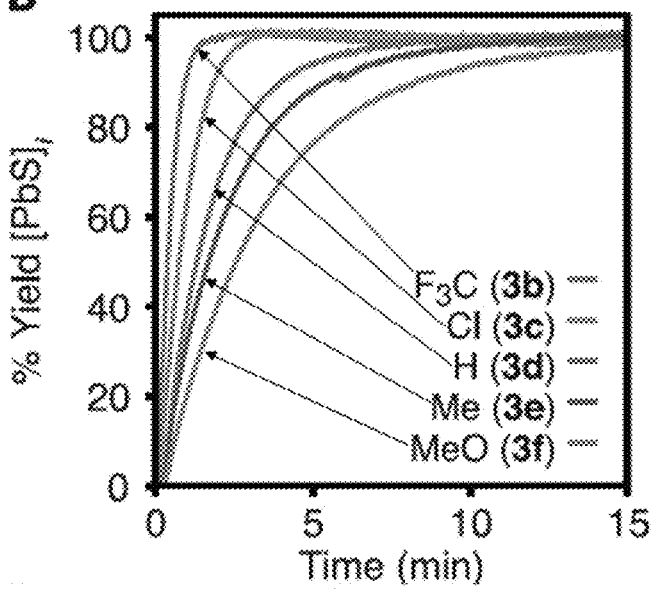
Figure 38:
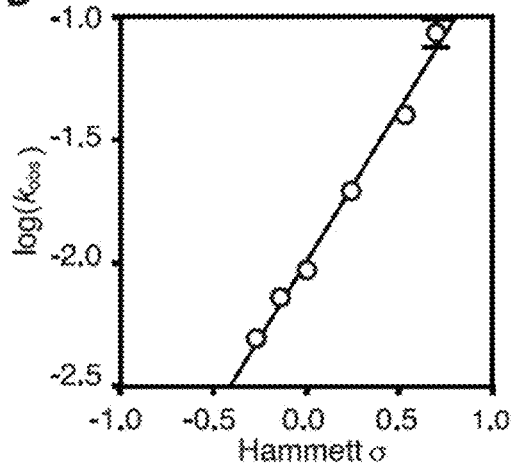

FIG. 38 shows a scheme of the reaction of di-substituted thioureas with lead oleate in hexadecane and diphenyl ether follows single exponential kinetics, allowing the conversion rate constants to be quantitatively compared. (A) Schematic of PbS formation reaction used to measure conversion kinetics at 90° to 150° C. (B) Kinetics of lead sulfide formation as measured in situ by the absorbance at λ=400 nm. (C) Effect of thiourea substitution pattern on the relative thiourea conversion rate constants [krel(1) to krel(8), e.g., $k_{rel}(7)=k(7)/k(8)$]. The wide range of reactivity requires that kinetics are measured at multiple temperatures. To account for the temperature dependence of the conversion rate constant, 3b and 3f were measured at two temperatures, and the change in rate constant was used to normalize the relative rate constants of the respective temperatures {e.g., $k_{rel}(3b)=[k(3b)120°\ C./k(8)^{150°\ C.}]\times[k(3f)^{150°\ C.}/k(3f)^{120°\ C.}]$}. (D) Hammett plot illustrating the well-defined relationship between the electronic structure of the thiourea and the rate of lead sulfide formation.

Figure 39:
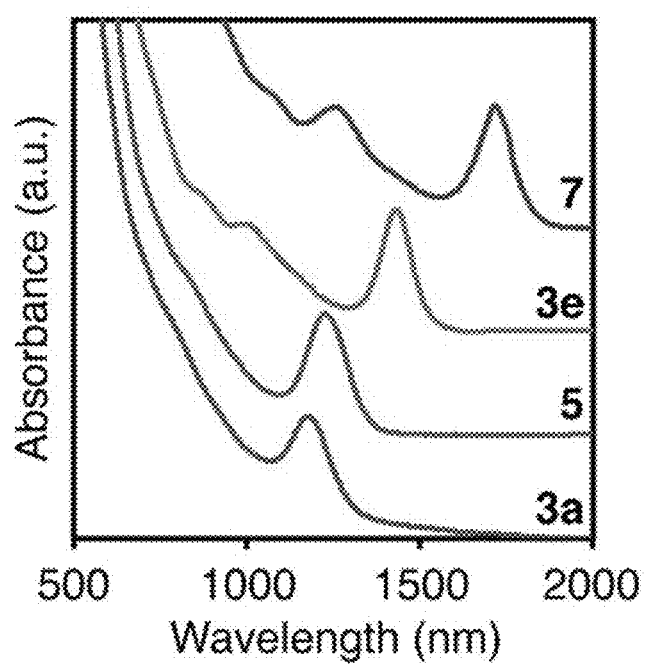

FIG. 39 shows UV-Vis-NIR absorbance spectra of PbS nanocrystals; all reactions were run as described in the synthesis of PbS nanocrystals for absorbance and photoluminescence spectroscopies at the following temperatures: 3a: 120° C.; 5: 150° C.; 3e: 120° C.; 7: 150° C. The spectrum of nanocrystals synthesized with precursor 3a shows scattering from insoluble co-products.

DETAILED DESCRIPTION OF ILLUSTRATIVE EMBODIMENTS

The present invention may be understood more readily by reference to the following description taken in connection with the accompanying Figures and Examples, all of which form a part of this disclosure. It is to be understood that this invention is not limited to the specific products, methods, conditions or parameters described or shown herein, and that the terminology used herein is for the purpose of describing particular embodiments by way of example only and is not intended to be limiting of any claimed invention. Similarly, unless specifically otherwise stated, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer to compositions and methods of making and using said compositions. That is, where the disclosure describes or claims a feature or embodiment associated with a composition or a method of making or using a composition, it is appreciated that such a description or claim is intended to extend these features or embodiment to embodiments in each of these contexts (i.e., compositions, methods of making, and methods of using).

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth. More specifically, in the present case, reference to "a precursor metal salt" also includes those independent embodiments where two, three, or more precursor metal salts are used, reference to "a sulfur-containing precursor" or "selenium-containing precursor" includes those independent embodiments where two, three, or more of each precursor are independently employed.

When a value is expressed as an approximation by use of the descriptor "about," it will be understood that the particular value forms another embodiment. In general, use of the term "about" indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, references to values stated in ranges include every value within that range.

It is to be appreciated that certain features of the invention which are, for clarity, described herein in the context of separate embodiments, may also be provided in combination in a single embodiment. That is, unless obviously incompatible or specifically excluded, each individual embodiment is deemed to be combinable with any other embodiment(s) and such the combination is considered to be another embodiment. Conversely, various features of the invention that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

The transitional terms "comprising," "consisting essentially of" and "consisting" are intended to connote their generally in accepted meanings in the patent vernacular; that is, (i) "comprising," which is synonymous with "including," "containing," or "characterized by," is inclusive or open-ended and does not exclude additional, unrecited elements or method steps; (ii) "consisting of" excludes any element, step, or ingredient not specified in the claim; and (iii) "consisting essentially of" limits the scope of a claim to the specified materials or steps "and those that do not materially affect the basic and novel characteristic(s)" of the claimed invention. Embodiments described in terms of the phrase "comprising" (or its equivalents), also provide, as embodiments, those which are independently described in terms of "consisting of" and "consisting essentially of." For those embodiments provided in terms of "consisting essentially of," the basic and novel characteristic(s) is the facile operability of the methods (and the systems used in such methods and the compositions derived therefrom) to prepare and use the inventive materials, and the materials themselves, where the methods and materials are capable of delivering the highlighted properties using only the elements provided in the claims. That is, while other materials may also be present in the inventive compositions, the presence of these extra materials is not necessary to provide the described benefits of those compositions or devices (i.e., the effects may be additive) and/or these additional materials do not compromise the performance of the product compositions or devices. Similarly, where additional steps may also be employed in the methods, their presence is not necessary to achieve the described effects or benefits and/or they do not compromise the stated effect or benefit.

When a list is presented, unless stated otherwise, it is to be understood that each individual element of that list, and every combination of that list, is a separate embodiment. For example, a list of embodiments presented as "A, B, or C" is to be interpreted as including the embodiments, "A," "B," "C," "A or B," "A or C," "B or C," or "A, B, or C." This includes, without limitation, that a genus presenting multiple parameters, each parameter presenting multiple options, represents that collection of individual embodiments including any and every combination of these variables and options. By means of illustration only, a composition described in terms of two variables A and B, each variable presenting two options (a) and (b), includes, as independent embodiments, the subgenera A(a)-B(a), A(a)-B(b), A(b)-B(a), and A(b)-B(b). This principle can be applied to larger numbers of variables and options, such that any one or more of these variable or options can be independently claimed or excluded. Likewise, a definition such as $C_{1-3}$-alkyl includes $C_1$-alkyl, $C_2$-alkyl, $C_3$-alkyl, $C_{1-2}$-alkyl, $C_{2-3}$-alkyl, and $C_{1-3}$-alkyl as separate embodiments.

Because each individual element of a list, and every combination of that list, is a separate embodiment, it should be apparent that any description of a genus or subgenus also included those embodiments where one or more of the elements are excluded, without the need for the disclosure of the exclusion. For example, a genus described as containing elements "A, B, C, D, E, or F" also includes the embodiments excluding one or more of these elements, for example "A, C, D, E, or F;" "A, B, D, E, or F;" "A, B, C, E, or F;" "A, B, C, D, or F;" "A, B, C, D, or E;" "A, D, E, or F;" "A, B, C, or F;" "A, E, or F;" "A, C, E, or F;" "A or F;" etc., without the need to explicitly delineate the exclusions.

The present invention is directed to methods of preparing nanoparticles, including metal sulfide, metal selenide, metal sulfide/selenide, mixed metal sulfides, mixed metal selenides, or mixed metal sulfide/selenide nanoparticles, including monodispersed nanoparticles and monodispersed nanocrystals, and the products derived from these methods. In certain embodiments, the methods comprise:

(a) contacting at least two precursor metal salts with a sulfur- or selenium-containing precursor or (b) contacting a precursor metal salt with a sulfur-containing precursor and a selenium-containing precursor, or a mixture of sulfur- and selenium-containing precursors, in each case, the contacting being done simultaneously or sequentially in a solution.

Each precursor metal salt is capable of reacting with each sulfur- and selenium-containing precursor, or a mixture of the sulfur- and selenium-containing precursor, to form the corresponding metal sulfide and metal selenide and metal sulfide/selenide.

In these embodiments, the contacting giving rise to reaction conditions sufficient to control the at least one parameter of particle size, particle distribution, and particle composition of the nanoparticles to a predetermined architecture.

In these embodiments, the sulfur- or selenium-containing precursor each independently have a structure of Formula (I), (II), or (III), or an isomer, salt, or tautomer thereof,

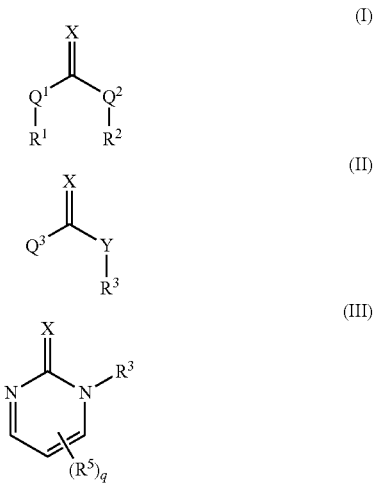

wherein $Q^1$ is independently —O—, —S—, Se—, —$CR^3R^4$—, —$N(R^4)$— or $P(R^4)$—;

$Q^2$ is independently —O—, —S—, Se—, —$CR^3R^4$—, —$N(R^3)$— or $P(R^3)$—;

$Q^3$ is an optionally substituted aryl or optionally substituted heteroaryl;

$R^1$, $R^2$, $R^3$, and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl; and or optionally any two of $R^1$, $R^2$, $R^3$, and $R^4$ are, within the same structure, linked to form an optionally substituted 5- to 10-membered (preferably 5-membered or 6-membered) heterocycle comprising an optionally substituted alkylene or an optionally substituted and/or conjugated alkenylene linkage;

or optionally, one or more of $R^1$, $R^2$, and $R^3$ is not H;

$R^5$ is halogen, —CN, —$NO_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;

X is S or Se; and

Y is a bond, —O—, —S—, or —N($R^3$)—.

These structures of Formulae (I), (II), or (III) exhibit kinetics favorable to the formation of nanoparticles of the corresponding metal sulfide and/or selenide, the specific properties of these nanoparticles depending on the relative reaction kinetics, which in turn depend on the substituents. The specific substituents, then, are chosen to provide the desired kinetic and, so, properties of the nanoparticle products.

The situation in which (a) at least two precursor metal salts are contacted with a sulfur- or selenium-containing precursor is considered a separate embodiment from that where (b) a precursor metal salt is contacted with a sulfur-containing precursor and a selenium-containing precursor (or a combination of sulfur-containing precursor and a selenium-containing precursors), as are the cases where each of the precursor metal salts is contacted with the sulfur-containing or selenium-containing precursor either simultaneously or sequentially. Separate embodiments provide methods comprising contacting two or more precursor metal salts (preferably two) with a sulfur-containing precursor, a selenium-containing precursor, or a combination of sulfur- and selenium-containing precursors to form the nanoparticles. Additional independent embodiments provide methods comprising contacting a precursor metal salt with a combination of a sulfur-containing precursor and a selenium-containing precursor to form the composite or alloyed nanoparticles.

Beyond this, and again, each permutation of this genus is considered a separate embodiment.

It is recognized that the use of thioureas and certain dithiocarbamates are known in the preparation of individual metal sulfides, it is not previously recognized that these reagents may be used in the preparation of mixed metal sulfides or mixed metal sulfides/selenides, provided the kinetics of the reactions can be properly managed. To the extent that a given reagent, such as thiourea or (alkyl or dialkyl)dithiocarbamate, is known in the present context, it is specifically excluded from the scope of the present invention.

In a similar regard, certain additional embodiments provide methods of preparing metal sulfide, metal selenide, or mixed metal sulfide/selenide nanoparticles, the method comprising contacting a precursor metal salt with a sulfur-containing precursor, a selenium-containing precursor, or a mixture of sulfur- and selenium-containing precursors, each independently having a structure of Formula (IA), (II), or (III), or an isomer, salt, or tautomer thereof, in solution under controlled nucleation and growth conditions for the formation of the monodispersed nanoparticles:

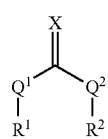

(IA)

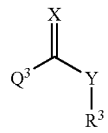

(II)

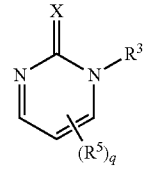

(III)

wherein $Q^1$ is independently —O—, —S—, Se—, —$CR_3R_4$—, —N($R^4$)— or P($R^4$)—;

$Q^2$ is independently —O—, —S—, Se—, —$CR_3R_4$—, —N($R^3$)— or P($R^3$)—;

$Q^3$ is optionally substituted aryl or optionally substituted heteroaryl;

$R^1$ and $R^2$ are independently at each occurrence optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

$R^3$ and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

or optionally any two of $R^1$, $R^2$, $R^3$, and $R^4$ are, within the same structure, linked to form an optionally substituted 5- to 10-membered (preferably 5-membered or 6-membered) heterocycle comprising an optionally substituted alkylene or an optionally substituted and/or conjugated alkenylene linkage;

or optionally at least one of $R^1$, $R^2$, and $R^3$ is not H;

$R^5$ is halo, —CN, —$NO_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;

X is S or Se; and

Y is a bond, —O—, —S—, or —N($R^3$)—.

In certain of embodiment, the methods produce nanoparticles which are crystalline, capable of functioning as quantum dots. The methods also provide for populations of nanoparticles which size distribution is monodispersed.

As described further below, the relative kinetics of the formation of the sulfide and selenide elements of the resulting nanoparticles are important features of the disclosure. In certain embodiments, the precursor metal salt or salts and the individual sulfur- or selenium-containing precursor are chosen such that the reactions between each of the precursor metal salt or salts and the individual sulfur- or selenium-containing precursor are matched so as to be the same or predictably different from one another, thereby providing nanoparticles with controlled architectures. For example, for a given Cd precursor, by judicious choice of a sulfur-containing precursor and a selenium-containing precursor having known relative rate constants with the Cd precursor can be used to provide predictable CdS/CdSe ratios in the final nanoparticles. Indeed, the wide array of sulfur- or selenium-containing precursors described herein provides the opportunity for specific selections of these rate constants.

Again, each permutation of this genus is considered a separate embodiment. For example, in any or all of the previously described genera, in some embodiments, the methods using the compounds of Formula (I), of Formula (II), and of Formula (III) are independent embodiments. In other independent embodiments, the sulfur- or selenium-containing precursor independently individually, or in any combination, has a structure according to:

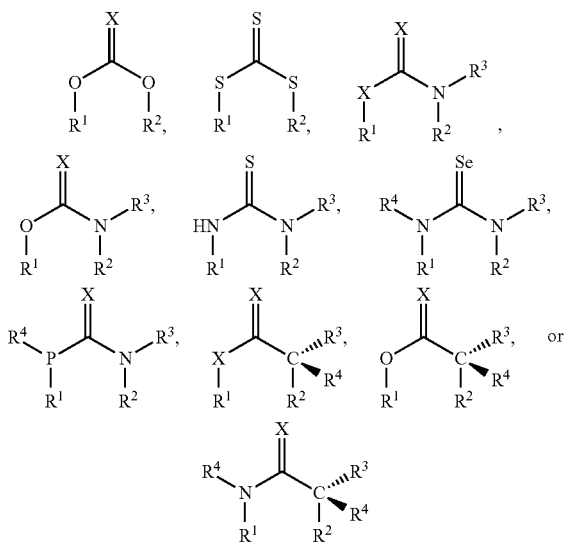

or an isomer, salt, or tautomer thereof,

In other aspects of the invention, the sulfur- and/or selenium precursor independently has the structure the structure of Formula (IB), (IC), (ID), (IE), (IF), (IG), or (IH).

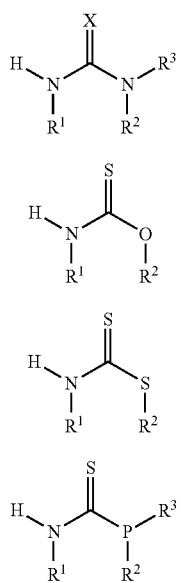

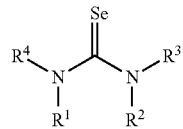

(IF)

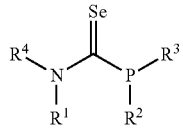

(IG)

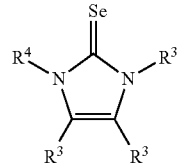

(IH)

wherein in each case, $R^1$, $R^2$, $R^3$, and X are defined in terms of the substituents of either Formula (I) or (IA), including the cyclic derivatives of (IB) through (IG). Additionally, in other embodiments, these compounds are individually or in any combination excluded from the genera of Formula (I) or (IA) (e.g., the non-cyclic derivatives of (IB) through (IG)). In still other embodiments, the compounds described in International Application No. PCT/US2014/057740 can be selectively and independently excluded from any of the methods described herein, depending on the nature of the claimed method.

In other exemplary embodiments of each of the previously described genera, the sulfur- or selenium-containing precursor independently individually, or in any combination, has a structure according to:

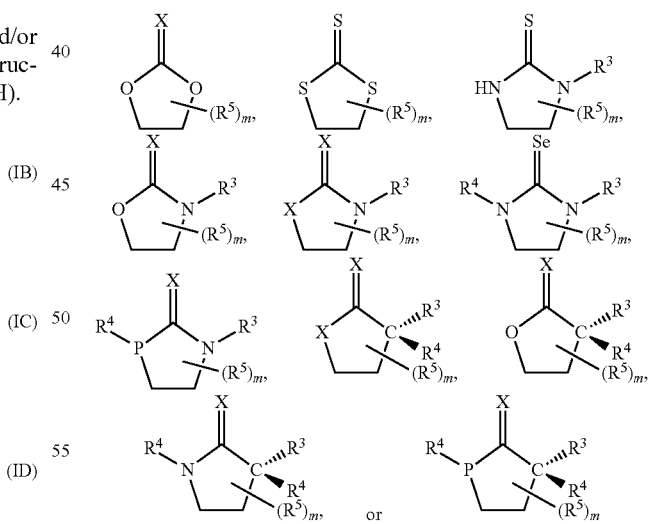

or an isomer, salt, or tautomer thereof, wherein $R^5$ is halogen, —CN, —NO$_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl; and m is 0, 1, 2, 3, or 4.

In still other exemplary embodiment of each of the previously described genera, the sulfur- or selenium-containing precursor independently individually, or in any combination, has a structure according to:

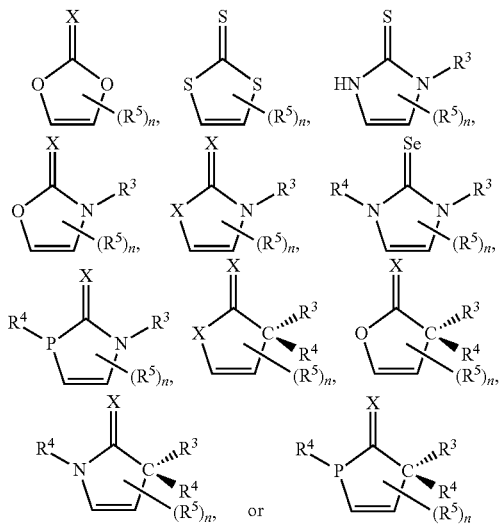

or an isomer, salt, or tautomer thereof, wherein $R^5$ is halogen, —CN, —NO2, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl; and n is 0, 1, or 2.

In still other exemplary embodiment of each of the previously described genera, the sulfur- or selenium-containing precursor independently individually, or in any combination, has a structure according to:

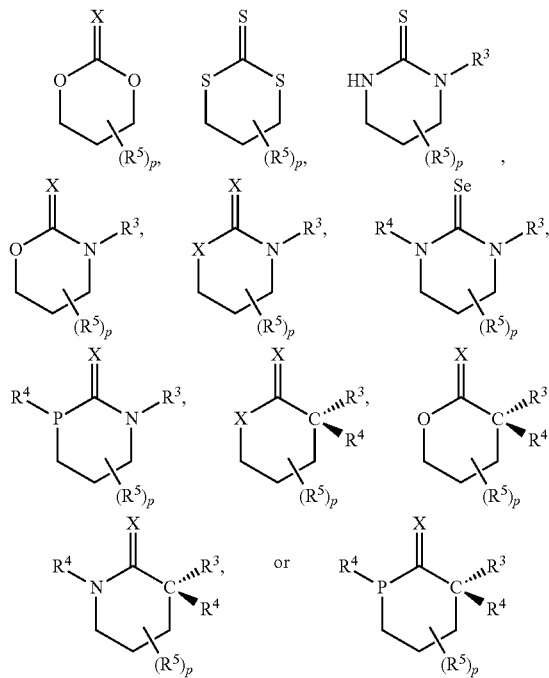

or an isomer, salt, or tautomer thereof, wherein $R^5$ is halogen, —CN, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl; and p is 0, 1, 2, 3, 4, 5, or 6.

In still other exemplary embodiment of each of the previously described genera, the sulfur- or selenium-containing precursor independently individually, or in any combination, has a structure according to:

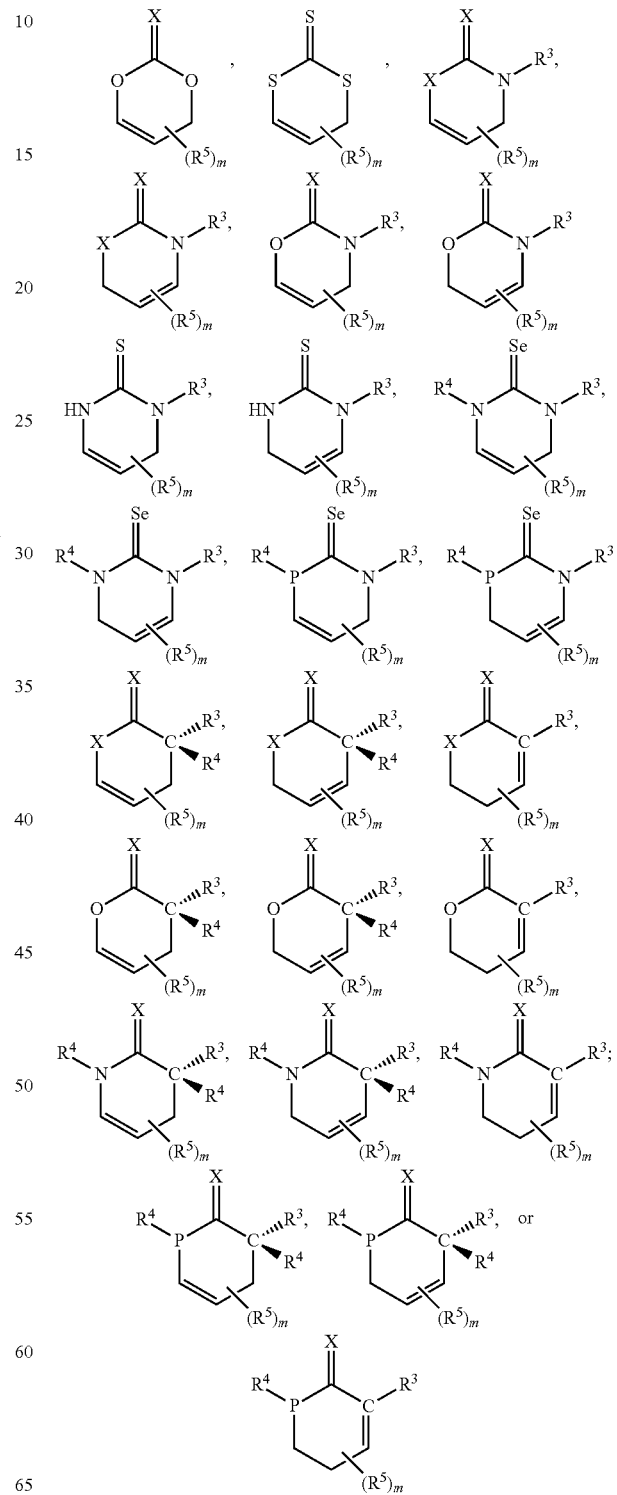

or an isomer, salt, or tautomer thereof,
wherein $R^5$ is halogen, —CN, —NO$_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl, and m is 0, 1, 2, 3, or 4.

In still other exemplary embodiment of each of the previously described genera, the sulfur- and/or selenium-containing precursor(s) individually, or in any combination, has a structure according to:

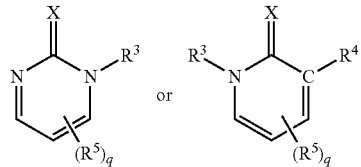

wherein q is 0, 1, 2, or 3.

For each of the individual compounds and genera presented, the structures presented are also intended to include those salts and tautomers of the structures provided. Note that this particular compound also may be described as its tautomer, having structures:

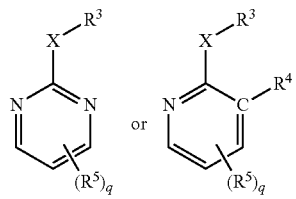

respectively, especially when X is S and $R^3$ is H. In these cases, then, the compounds may also be individually or collectively described in terms of

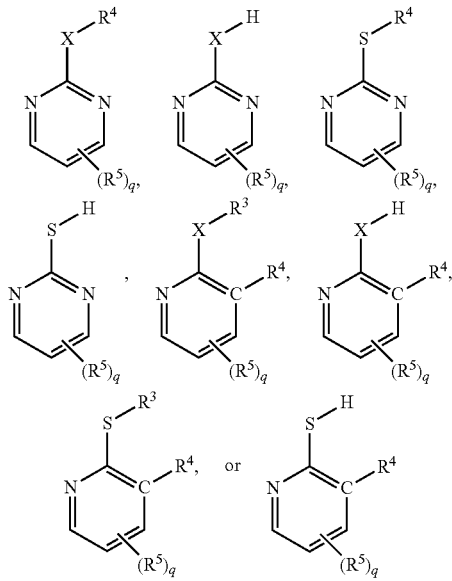

wherein $R^3$, $R^4$, $R^5$ and q are defined elsewhere herein.

In still other exemplary embodiment of the previously described genera, the sulfur- or selenium-containing precursor independently individually, or in any combination, has a structure according to:

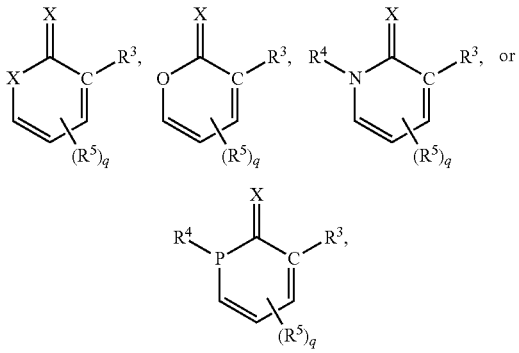

or an isomer, salt, or tautomer thereof, wherein q is 0, 1, 2, or 3.

The preceding chemistries can be accessed by methods such as those described in the Appendices, for example, using the reactions of thiocyanates or selenocyanates, isothiocyanates or isoselenocyanates, orthoformates, thiophosgenes, or thioacyl chlorides with appropriate precursors:

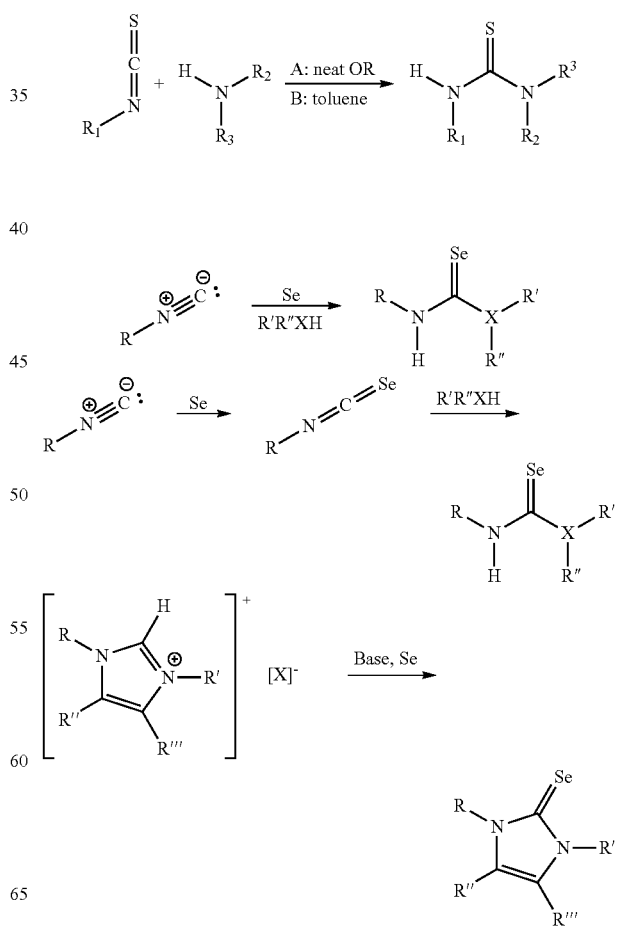

-continued

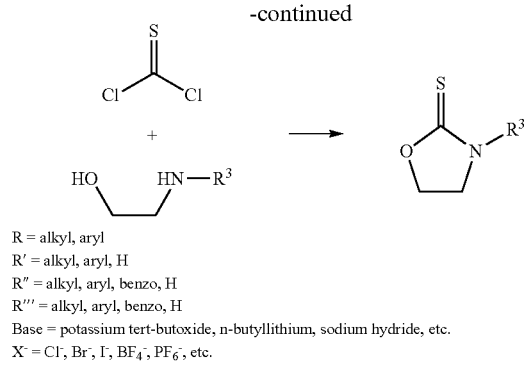

R = alkyl, aryl
R' = alkyl, aryl, H
R" = alkyl, aryl, benzo, H
R''' = alkyl, aryl, benzo, H
Base = potassium tert-butoxide, n-butyllithium, sodium hydride, etc.
X⁻ = Cl⁻, Br⁻, I⁻, BF$_4^-$, PF$_6^-$, etc.

Referring also to the structures of Formula (III), presented above, in certain specific embodiments, at least one of the sulfur- or selenium-containing precursors has a structure according to:

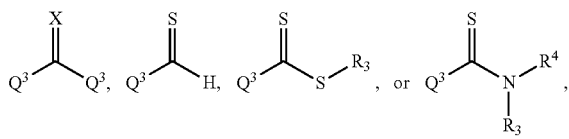

or an isomer, salt, or tautomer thereof. Such representations are intended to include the structures derived from any of the substituents corresponding to $Q^3$, $R^3$, and $R^4$, as described above. Particular exemplars of these structures include those where $Q^3$ is an optionally substituted furanyl, thiophenyl, pyrrolyl, phenyl, naphthyl, pyridinyl, quinolinyl, benzofuranyl, benzothophenyl, or indolyl, especially an optionally substituted phenyl or pyridinyl (for example, optionally substituted with 0, 1, 2, 3, or 4 halogen (e.g., Cl, Br, I, or F), —CN, —NO$_2$, C$_{1-6}$ alkoxy, C$_{1-6}$ alkyl, C$_{3-6}$ cycloalkyl, C$_{2-6}$ alkenyl, optionally substituted aryl, optionally substituted aralkyloxy, optionally substituted aralkyl, optionally substituted heteroaryl, or optionally substituted heteroaralkyl). Other exemplars include those where $R^3$ is H and $R^4$ is optionally substituted C$_{1-12}$ alkyl, optionally substituted C$_{3-6}$ cycloalkyl, optionally substituted C$_{2-12}$ alkenyl, optionally substituted aryl, optionally substituted aralkyloxy, optionally substituted aralkyl, optionally substituted heteroaryl, or optionally substituted heteroaralkyl.

In some embodiments, $R^1$, $R^2$, $R^3$, $R^4$, and $R^5$ are independently optionally substituted alkyl, optionally substituted aryl, or optionally substituted aralkyl. In some independent embodiments, and where permitted by the definition of the genus, $R^1$, $R^2$, $R^3$, $R^4$, and $R^5$ is H. Any of the substituents described in this application's examples are also considered to be independent embodiments and within the scope of this invention.

Any of the structures designated herein as having a substituent X (or E) is considered to represent independent embodiments where X (or E) is S and where X (or E) is Se.

The methods thus far have been described in terms of one or more precursor metal salt. Such metal salts may individually or collectively comprise Cd, Cu, Fe, Ga, Hg, In, Mn, Mo, or Zn, preferably Cd, Cu, Ga, In, Ni, Pb, or Zn. These precursor metal salts also contain counterions, which may include saturated or unsaturated C$_{2-30}$ carboxylates (preferably C$_{6-30}$ carboxylates, or fatty acid carboxylates, such as oleate), thiocarboxylate, (alkyl)phosphonate, alkylsulfonate, alkylphosphate, alkylsulfate, alkylphosphona- mide, or halide (e.g., F, Cl, Br, or I) counterion, or any counterion or combination of counterions described elsewhere in this application.

The scope of this invention also includes novel methods for the preparation of carboxylate salts of metal oxides, though the use of short-chain fluorinated carboxylic acid/anhydride reagents (e.g., trifluoroacetic acid (TFA)/anhydride mixtures). These methods, which are particularly useful for preparing long chain alkyl carboxylate salts under conditions allowing for the preparation of dry salts, may be exemplified by the equations:

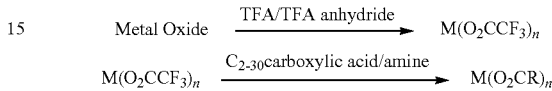

Further exemplary experimental details may be found in the Examples. These methods has been successfully been employed with PbO and CdO (e.g., n=2), but is expected also to work with other metal oxides, by the same principles, such as oxides of Cu, Fe, Ga, Hg, In, Mn, Mo, and or Zn. The method is especially useful for longer chain saturated and unsaturated carboxylic acids, for example C$_8$-C$_{26}$ fatty acids. Tri-n-alkyl amines, for example triethyl amine, are preferred for neutralizing the released TFA.

Interestingly, in the case where certain metal precursors, especially cadmium precursors, comprise fatty acids, such as Cd(oleate)$_2$, it is found that the reaction requires the presence of excess of the fatty acid, in some cases 1, 2, 3, 4, or 5 equivalents of the fatty acid, at elevated temperatures (e.g., in excess of 180° C.) for the reactions for work properly.

Note also that the sulfur- and selenium-containing precursors described herein have also been described in terms of their salts. In some embodiments, the counterions for anionic sulfur- and selenium-containing precursors may comprise ammonium cations, alkali metal cations, or a cation of the one or more precursor metal salt metals.

In principle, the methods described herein may employ any solvent, including aqueous or semi-aqueous solvents (e.g., at least 95 vol % water), but the ability to eliminate the variability caused by poorly defined metal surfactant complexes and to eliminate the effect of water on the conversion rate constant by preparing well-defined metal surfactant complexes ex situ (rather than with the conventional in situ approach that leads to variable water contamination and reactivity) is seen as important. For this reason, the sulfur- and selenium-precursors are described for provide optimal results using non-aqueous solvents, in some cases in the presence of surfactants to provide for homogeneity of the reactants.

Exemplary reactants are described within the Examples, and include high boiling solvents such as alkanes (e.g., hexadecane), alkenes (e.g., 1-octene or 1-octadecene), aromatic hydrocarbons (e.g., toluene or mesitylene), ethers and polyethers (including glymes, diglymes, or diphenyl ether), and trialkyl- or triaylphosphines or trialkylphosphine oxides (e.g., tri-n-octyl phosphine oxide). Generally water levels within these solvents are kept low, and in certain embodiments, the solvents contain less than about 20% water, less than about 15% water, less than about 10% water, less than about 5% water, or less than about 1% water, or substantially anhydrous (e.g., no water added or dried by conventional methods).

Reaction temperatures are also flexible variables in the present methods, though the instant precursors are chosen to provide convenient reaction kinetics at temperatures in a range of about 50° C. to about 400° C., or about 120° C. to about 350° C. or about 120° C. to about 250° C. In independent embodiments, the reactions are conducted at temperatures in a range of from 50 to 60° C., from 60 to 80° C., from 80 to 100° C., from 100 to 120° C., from 120 to 160° C., from 160 to 200° C., from 200 to 240° C., from 240 to 280° C., from 280 to 320° C., from 320 to 360° C., from 360 to 400° C., or any two or more ranges thereof.

It is found that reproducible results are obtained by injecting the various metal, sulfur-containing, and selenium-containing precursors (pre-dissolved in solvent) into preheated volumes of the respective solvent or solvents. Typically, the precursor metal salt is pre-dissolved in the solvent(s) and the sulfur-containing and selenium-containing precursors are injected into the heated solvent, but other embodiments provide that converse (i.e., injecting the metal precursor salts into preheated solutions of the sulfur- and/or selenium containing precursors. In preferred embodiments, the thermal mass of the solutions of the various metal, sulfur-containing, and selenium-containing precursors being injected into the preheated solvents is less than 10% or less than 5%; i.e., upon injection of the various (metal,) sulfur-containing, and selenium-containing precursors into the preheated solvent, the temperature remains within 10% or 5% of the original pre-injected solvent temperature. This effect may also be minimized by preheating the solutions of the various (metal,) sulfur-containing, and selenium-containing precursors prior to injection.

Typically, the metal precursor salts are employed at stoichiometric levels or excess with respect to the sulfur- or selenium-containing precursors. Under the conditions described, the sulfur- or selenium-containing precursors in the final reaction mixture are present at concentrations in a range of from 5 to 10 mM, from 10 to 20 mM, from 20 to 40 mM, from 40 to 80 mM, or any combination of two or more of these ranges.

The methods of the present invention are also flexible in their ability to operate with one or more precursor metal salts and one or more sulfur- or selenium-containing precursors, to form a wide array of metal sulfide, metal selenide, and mixed metal sulfide/selenide materials. The precursors may be combined all at once, sequentially, or stage wise (i.e., first set of precursors added at once, second set of precursors added sequentially, and so forth) in single pot or multi-pot syntheses, where the intermediate structures are optionally isolated between steps.

Non-limiting examples of the flexibility of the methods include:
(a) one precursor metal salt mixed (or contacted) with a sulfur-containing precursor or a selenide-containing precursor in a single pot at the same time;
(b) one precursor metal salt mixed (or contacted) with a sulfur-containing precursor and a selenide-containing precursor in a single pot at the same time;
(c) one precursor metal salt mixed (or contacted) with a sulfur-containing precursor and a selenide-containing precursor in a single pot at staggered times (including options where the order of addition of the sulfur-containing precursor and a selenide-containing precursor are reversed);
(d) two (or more) precursor metal salts mixed (or contacted) with a sulfur-containing precursor or a selenide-containing precursor in a single pot at the same time;
(e) two (or more) precursor metal salts mixed (or contacted) with a sulfur-containing precursor or a selenide-containing precursor in a single pot at staggered times (including options where the order of addition of the metal precursors are reversed);
(f) two (or more) precursor metal salts mixed (or contacted) with a sulfur-containing precursor and a selenide-containing precursor in a single pot at the same time;
(g) two (or more) precursor metal salts mixed (or contacted) with a sulfur-containing precursor and a selenide-containing precursor in a single pot at staggered times; or
(h) any multiple application of two or more of (a) to (g).

Where the concentration of each of the precursors are typically fixed at the beginning of the reaction, the concentration of the precursor metal salts or the sulfur-/selenium precursors (or both) can also be changed or maintained during the course of the reaction (by the addition of new material) to achieve further flexibility and properties.

Figure 1:
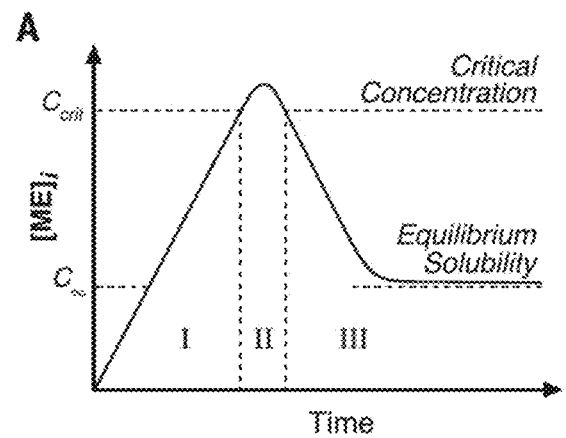
FIG. 1 illustrates a mechanism of precursor-limited homogeneous nucleation and growth of colloidal metal chalcogenide nanocrystals. (A) The time evolution of the monomer concentration, where monomer supersaturation (I) precedes crystal nucleation (II) and is followed by growth (III). (B) Metal and chalcogen precursors ($MX_2$, $ER_2$) react and supply monomers ($[ME]_i$) to the growth medium at a rate that limits the crystallization.
Figure 1:
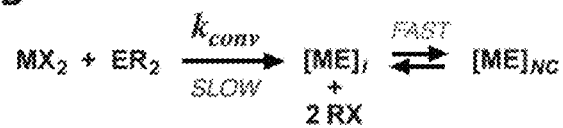
Figure 1:
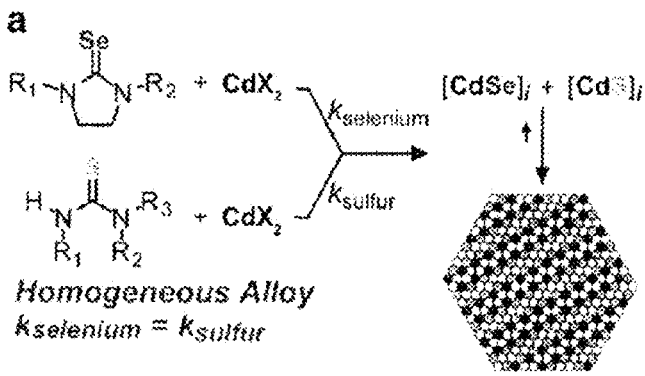
Figure 1:
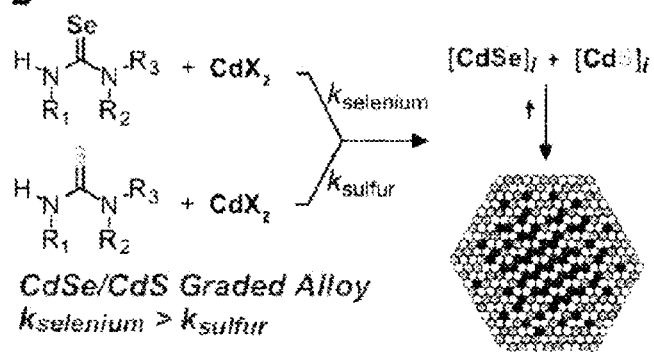
Figure 2:
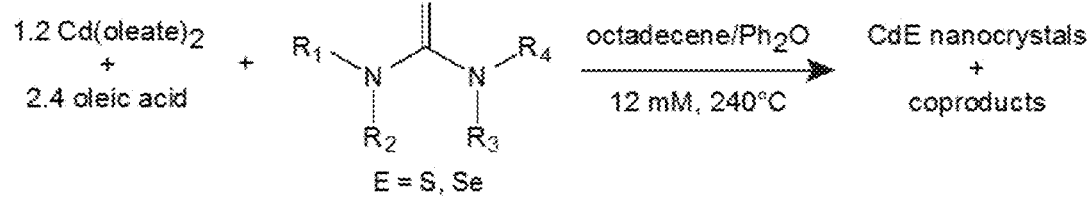
FIG. 2 illustrates a range of sulfide- and selenium-containing precursors and the CdS/CdSe nanocrystals prepared therefrom. (A) shows an exemplary reaction scheme showing the conditions used to extract pseudo first-order rate constants from the reactions of Cd precursors. (B) and (C) illustrate the $k_{obs}$ values extracted from a single exponential fit to the reaction progress for the conversion of each precursor. (D) shows representative emission spectra from representative product nanocrystals.
Figure 2:
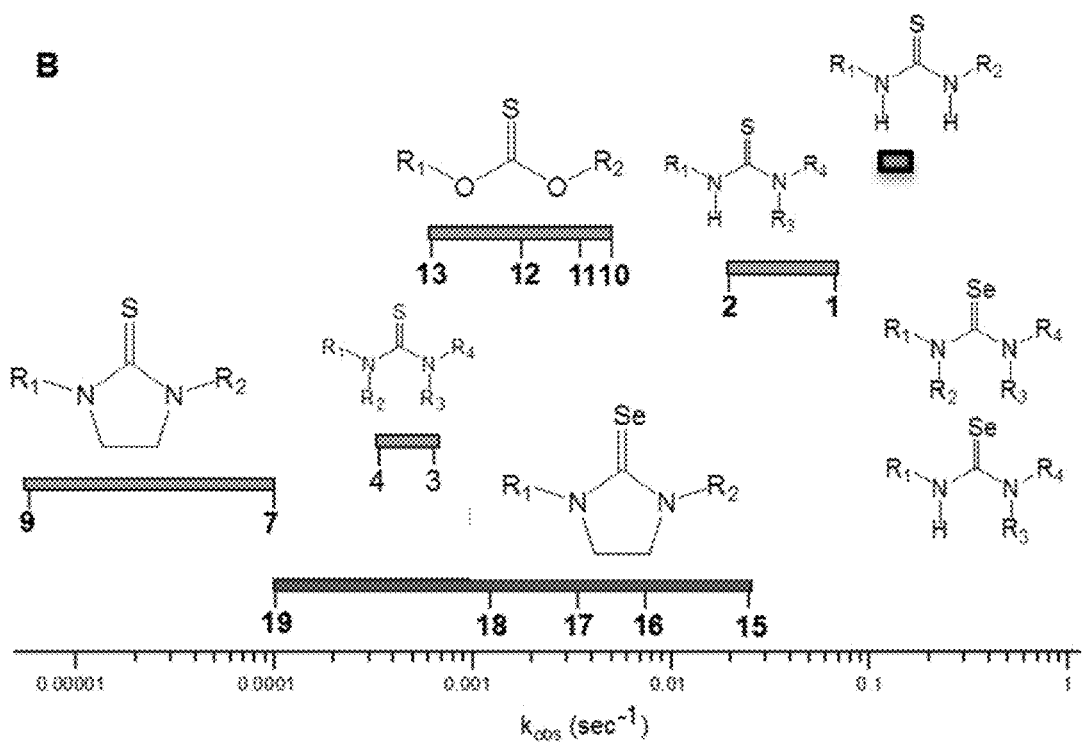
Figure 2:
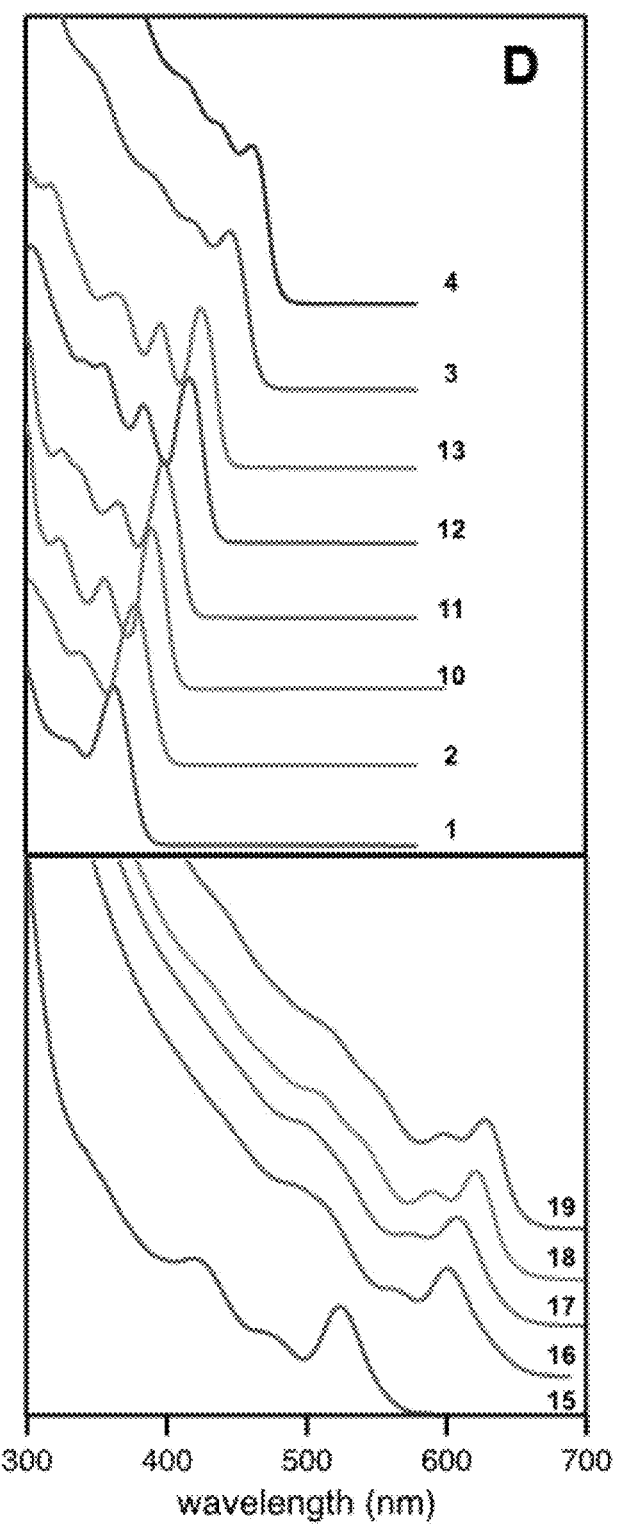

Such flexibility allows for the deliberate design and preparation of nanoparticles having structures of tunable metal/sulfide/selenide levels, and where the composition of each nanoparticle can vary with respect to the absolute levels of metal sulfide or metal selenide or proportion of each within each particle. That is, using the methods described herein, it is possible to prepare nanoparticles having graded cross-sectional compositions, where proportions of both metals and sulfide/selenides can be designed and made to vary either continuously or discontinuously (e.g., stepwise, optionally described as a core-shell arrangement) from the center to the exterior surface of the nanoparticle. The relative conversion kinetics and ratios of the amounts of materials used tailor the grading of the composition as shown in FIGS. 1 and 2.

In many embodiments, especially those related to generating these graded or layered alloys, precise control of the kinetics, both in terms of the concentrations and controlling rate constants of the reactants is important. By specifically controlling the kinetics, it is possible to design the nature of the nanoparticles (see, e.g., FIGS. 1 and 2). Further, such precise size control of the formation of the chalcogenide alloys (for example of lead or cadmium) can improve their luminescence stability and quantum yield under intense illumination. In some embodiments, graded alloys are synthesized from pairs of precursors with matched pseudo-first order rate constants, or nearly matched pseudo-first order rate constants, so as to grade the interface between the two alloys. In particular the interfaces of sulfur and selenium in core shell quantum dots can be tailored by pairs of sulfide and selenide precursors by selecting matched pairs from any of the structures described herein, including those shown in FIG. 2. That is, it is now possible to use the kinetic data now available to rationally design nanoparticles having particular absorbance/emissive properties.

In those embodiments where mixtures of sulfur- and selenium-containing precursors are used, in further aspects, the specific sulfur- and selenium-containing precursors are chosen such that their reaction kinetics with the precursor metal salt are matched or nearly matched. In such aspects, the ratio of the respective pseudo first order rate constants with the precursor metal salt are in a range of from 1 to 1.1, from 1.1 to 1.2, from 1.2 to 1.3, from 1.3 to 1.4, from 1.4 to 1.5, from 1.5 to 1.6, from 1.6 to 1.7, from 1.7 to 1.8, from 1.8 to 1.9, from 1.9 to 2, from 2 to 2.2, from 2.2 to 2.4, from 2.4 to 2.6, from 2.6 to 2.8, from 2.8 to 3, from 3 to 4, from 4 to 5, from 5 to 10, or any combination of two or more of these ranges, under the reaction conditions employed. Such conditions provide homogeneous or graded alloys as described elsewhere herein.

In those embodiments where mixtures of sulfur- and selenium-containing precursors are used, in further aspects, the specific sulfur- and selenium-containing precursors are chosen such that their reaction kinetics with the precursor metal salt are deliberately mismatched. In such aspects, the ratio of the respective pseudo first order rate constants of the sulfur- and selenium-containing precursors with the precursor metal salt are in a range of from 10 to 100, from 100 to 1000, from 1000 to 10,000, or any combination of two or more of these ranges, under the reaction conditions employed.

Convenient values for these pseudo-first order rate constants, $k_{obs}$ ($s^{-1}$) range from $1 \times 10^{-4}$ to $5 \times 10^{-4}$, from $5 \times 10^{-4}$ to $1 \times 10^{-3}$, from $1 \times 10^{-3}$ to $5 \times 10^{-3}$, from $5 \times 10^{-3}$ to $1 \times 10^{-2}$, from $1 \times 10^{-2}$ to $5 \times 10^{-2}$, from $5 \times 10^{-2}$ to $1 \times 10^{-1}$, from $1 \times 10^{-1}$ to 0.5, from 0.5 to 1, or any combination of two or more of these ranges.

Specific examples of matched pairs include the co-reaction of cadmium salts of fatty acids (oleates being preferred; in the presence of excess fatty acid/oleic acid) with diaryl thiocarbonates or aryl thioureas with alkyl or aryl substituted imidazolidine-2-selones:

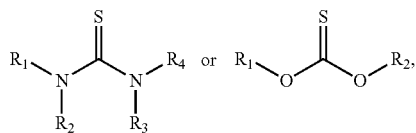

where $R_1$ is optionally substituted aryl and $R_2$, $R_3$, $R_4$ are independently H, $C_{1-12}$ alkyl, optionally substituted aryl or optionally substituted heteroaryl, the optional substituents comprising; and

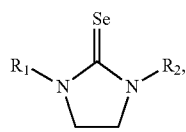

where $R_1$ and $R_2$ are independently $C_{1-12}$ alkyl or optionally substituted aryl or optionally substituted heteroaryl.

Additional embodiments include any and all combinations of the sulfur- and/or selenium-containing precursors described herein.

Figure 3:
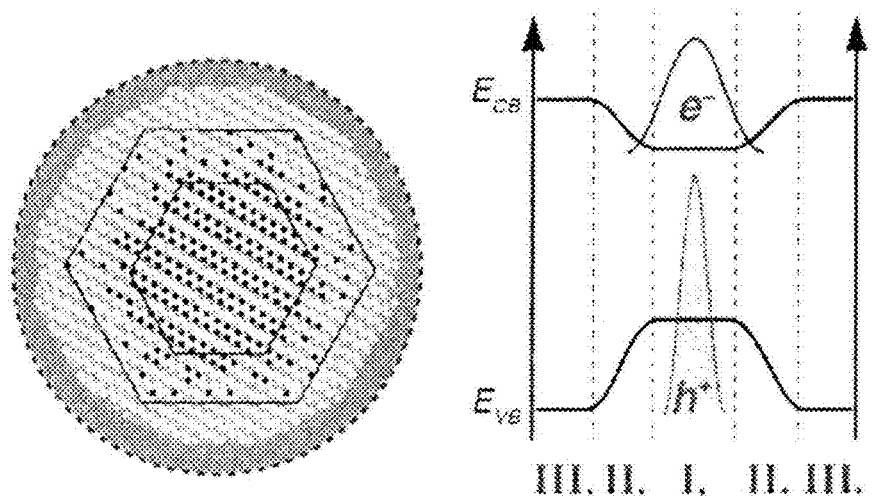
FIG. 3 illustrates a schematic of anatomically defined alloy composition where the homogeneous alloy core is larger than Bohr exciton radius, graded alloy interface, shell, and encapsulant. (I) alloy core with narrow linewidth, synthetic reliability; (II) Graded interface alloy with increased flux stability; (III) Insulating shell with low photoionization. The alloy may also be coated with a thermally robust ultrabarrier (IV, not shown) for protection of the nanoparticle.

In some embodiments, the methods provide homogeneous alloy QDs (e.g., $Cd(Se_{1-x},S_x)$ alloy QDs) that have radii larger than the Bohr radii are especially attractive, both in their own rights and as precursors for graded structures. See, e.g., FIG. 3. For example, homogenously alloyed $Cd(Se_{1-x}, S_x)$ QDs with a luminescence spectrum centered at a given wavelength (e.g., 625 nm) and a diameter greater than the Bohr exciton radius (r≥6 nm) can also serve as a core material around which insulating shells and/or encapsulation layer may be deposited. In either case, if the size of the QD is greater than the exciton Bohr radius, the luminescence wavelength is defined by the ratio of sulfur and selenium rather than the size of the QD. In addition the luminescence linewidth is not heterogeneously broadened by the size polydispersity. This alleviates pervasive problems with synthetic reproducibility because it reduces the control needed with respect to nanocrystal size, as long as it is larger than the Bohr radius. This allows the reaction to be run to completion rather than requiring it be stopped prematurely at a particular size. Moreover, the size polydispersity becomes relatively less important to the linewidth.

Figure 4:
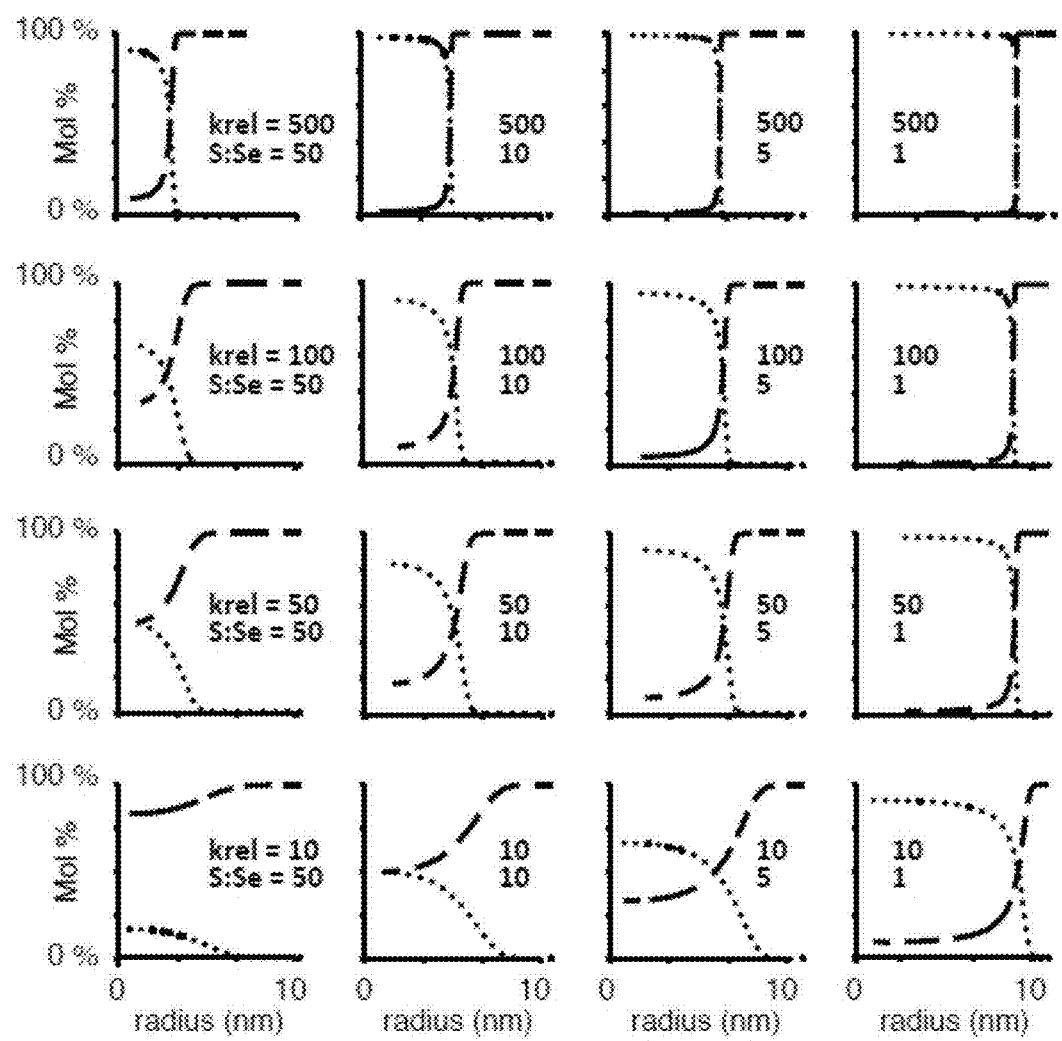
FIG. 4 shows the results of simulations of S/Se alloy grading provided by variations in the relative conversion rate constants ($k_{rel}$=k(selenide)/k(sulfide)). Relative conversion rates may vary by up to 500 to access interfacial structures of interest.

If the concentrations of multiple precursors with different conversion rate constants vary over the course of the crystallization, the composition of the resultant alloy may vary over the course of the crystallization. Kinetics simulations shown in FIG. 1 and FIG. 4 illustrate how the simultaneous reaction of two precursors with different conversion rate constants can tune the grading of the interfacial structure. These simulations demonstrate that changing the ratio of the k(sulfide) and k(selenide) rate constants by a factor of 500 is sufficient to modulate the grading from abruptly to smoothly varying.

By judicious choice of precursors, the methods can provide for populations monodispersed nanoparticles, each nanoparticle exhibiting a variable composition of metal sulfide/metal selenide throughout its structure. Such monodispersity can be realized by controlling the nucleation rates of the nanoparticles, especially through judicious choice of the sulfur-/selenium precursors. Certain precursors, for example, thiourea ($NH_2$—C(=S)—$NH_2$) is simply too reactive under ambient conditions to allow for the controlled nucleation required in the present invention and so this material is excluded from consideration, at least as a nucleant. In the present invention, the degree of monodispersity may be characterized by a standard deviation variance of particle size, and in certain embodiments, this variance is less than about 0.5%, 1%, 1.5%, 2%, 2.5%, 5%, 7.5%, 10%, 15%, or 20% relative to the mean particle size of the nanoparticle, as measured by statistical samples of TEM micrographs.

Again, though, by staggering initiation times, and using the same principles as described herein, it is also possible to provide bimodal or polymodal populations of nanoparticles.

Nanoparticles have been prepared by the inventive methods having shapes which are substantially spherical, cylindrical, or nanosheet. Substantially spherical, monodispersed nanoparticles include those within a having an average mean diameter in a range of from about 1 nm to about 5 nm, from about 5 nm to about 10 nm, from about 10 nm to about 25 nm, from about 25 nm to about 50 nm, from about 50 nm to about 100 nm, or any combination of two or more of these ranges. Cylindrical nanoparticles are those having at least one dimension in a range of from about 1 nm to about 5 nm, from about 5 nm to about 10 nm, from about 10 nm to about 25 nm, from about 25 nm to about 50 nm, from about 50 nm to about 100 nm, or any combination of two or more of these ranges.

The particle sizes and distributions can be defined herein by Transmission Electron Microscopy (TEM) photomicrograph analysis. In this method, a predetermined number of particles (more than 100) are analyzed in representative transmission electron micrographs (typically derived from more than 3 randomly selected powder samples) by measuring the mean diameters of the particles, counting particles within a pre-determined size fraction gradient, and statistically correlating those numbers.

Depending on the specific precursor reactants and the specific reaction conditions, the metal sulfide, metal selenide, or mixed metal sulfides/selenides can present themselves as amorphous, semi-crystalline, or crystalline nanoparticles (i.e., exhibiting no XRD pattern, broadened patterns, or distinct patterns, respectively). In preferred embodiments, the nanoparticles are crystalline. In more preferred embodiments, the methods provide nanoparticles that exhibit the characteristics of quantum dots.

Up to this point, the invention has been described in terms of methods for preparing nanoparticles, but the resulting metal sulfide, metal selenide, or mixed metal sulfide/selenide nanoparticles are also considered within the scope of the invention.

In some embodiments, the nanoparticles are crystalline or quasi-crystalline. In some embodiments, the metal sulfide, metal selenide, or metal sulfide/selenide nanoparticles exhibit the characteristics of quantum dots. Exemplary compositions include those comprising CdS, CdSe, CuS, CuSe, GaS, GaSe, InS, InSe, NiS, NiSe, PbS, PbSe, ZnS, ZnSe or any combination thereof.

In some embodiments, the nanocrystals have dimensions or diameters greater than their exciton Bohr radii. In other embodiments, the nanocrystals have dimensions or diameters less than their exciton Bohr radii. In individual embodiments, the populations of nanoparticles can be tuned to exhibit emissive maxima at any single wavelength within the range of 400 to 2000 nm; e.g., any single wavelength in a range from 400 to 600 nm, from 600 to 800 nm, from 800 to 1200 nm, from 1200 to 1600 nm, from 1600 to 2000 nm, from 2000 to 2400 nm, from 2400 to 2800 nm, from 2800 to 3200 nm, from 3200 nm to 3600 nm, from 3600 to 4000 nm, or any combination of two or more of these ranges.

The ability to prepare homogeneous alloy and graded alloy QD architectures in a single reaction step, as described herein, avoids the problems of previous approaches. The present methods allow reactions to proceed to completion, eliminating the variability caused by terminating reactions early. Moreover, the tunable precursor reactivity eliminates the variability in the conversion reactivity. These advances solve the difficulties that prevent scalable QD manufacture and allow QD manufacturers to rapidly change QD architectures in order to meet the performance needs of the application. Moreover, these methods, optimized QD architectures can be optimized to meet certain important targets. For example, in various embodiments, these nanoparticles exhibit not only the characteristics already described, but also exhibiting any one or more of the bandgap characteristics described in this application. For example, in individual embodiments, the nanoparticles comprise the crystalline quantum dots described above, exhibiting:

(a) quantum yields of at least 75%, at least 80%, at least 85%, at least 90%, at least 95%, or at least 98%;

(b) less than 5% thermal droop at operating temperatures of 100° C., of 125° C., or of 150° C.;

(c) less than 10% flux density saturation at fluxes of 100 mW/mm$^2$, 500 mW/mm$^2$, or 1 W/mm$^2$ (corresponding to 10, 50, and 100 W/cm$^2$);

(d) emission wavelengths within 5 nm, 4 nm, 3 nm, 2 nm, or 1 nm precision while maintaining a linewidth (defined as FWHM, or full width at half magnitude) of less than 30 nm or in a range of 25 nm to 35 nm;

(e) or any combination of two or more of (a)-(d).

Further, the features of the quantum dots available through these inventive methods make them especially suitable for any application where quantum dots are currently used. Exemplary, non-limiting applications include displays, television screens, transistors, solar cells, light emitting diodes (LEDs), or diode lasers. The displays may comprise a plurality of nanoparticles (e.g., quantum dots) according to the present disclosure (e.g., nanoparticles characterized by one or more of size, dispersity, band gap, or any other characteristic provided herein.) The displays may be fixed, portable, or even incorporated into a mobile device.

Terms

Throughout this specification, words are to be afforded their normal meaning, as would be understood by those skilled in the relevant art. However, so as to avoid misunderstanding, the meanings of certain terms will be specifically defined or clarified.

The term "architecture" as with respect to the nanoparticles refers to the size and spatial arrangement of the nanoparticles, with respect to their particle size, particle distribution, and particle composition (including chemical homogeneity and/or presence of compositional gradients or layers). The ability to prepare nanoparticles to meet targeted dimensions, particle size distributions, and internal chemical compositions is a feature of the present invention.

The term "alkyl" as used herein refers to a linear, branched, or cyclic saturated hydrocarbon group typically although not necessarily containing 1 to about 30 carbon atoms, in some cases, from 1 to about 12 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like, or in other cases from about 12 to about 24 or 30 carbon atoms (e.g., oleic and other fatty or saturated acids). Generally, although again not necessarily, alkyl groups herein can also contain 1 to about 12 carbon atoms or 1 to 6 carbon atoms. The term "lower alkyl" intends an alkyl group of 1 to 6 carbon atoms, and the specific term "cycloalkyl" intends a cyclic alkyl group, typically having 4 to 8, preferably 5 to 7, carbon atoms. The term "substituted alkyl" refers to alkyl groups substituted with one or more substituent groups, and the terms "heteroatom-containing alkyl" and "heteroalkyl" refer to alkyl groups in which at least one carbon atom is replaced with a heteroatom. If not otherwise indicated, the terms "alkyl" and "lower alkyl" include linear, branched, cyclic, unsubstituted, substituted, and/or heteroatom-containing alkyl and lower alkyl groups, respectively.

The term "alkylene" as used herein refers to a difunctional linear, branched, or cyclic alkyl group, where "alkyl" is as defined above.

The term "alkenyl" as used herein refers to a linear, branched, or cyclic hydrocarbon group of 2 to about 30 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. In some embodiments, alkenyl groups contain 2 to about 12 carbon atoms. The term "lower alkenyl" intends an alkenyl group of 2 to 6 carbon atoms, and the specific term "cycloalkenyl" intends a cyclic alkenyl group, preferably having 5 to 8 carbon atoms. The term "substituted alkenyl" refers to alkenyl groups substituted with one or more substituent groups, and the terms "heteroatom-containing alkenyl" and "heteroalkenyl" refer to alkenyl groups in which at least one carbon atom is replaced with a heteroatom. If not otherwise indicated, the terms "alkenyl" and "lower alkenyl" include linear, branched, cyclic, unsubstituted, substituted, and/or heteroatom-containing alkenyl and lower alkenyl groups, respectively.

The term "alkenylene" as used herein refers to a difunctional linear, branched, or cyclic alkenyl group, where "alkenyl" is as defined above.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms. Analogously, "alkenyloxy" and "lower alkenyloxy" respectively refer to an alkenyl and lower alkenyl group bound through a single, terminal ether linkage, and "alkynyloxy" and "lower alkynyloxy" respectively refer to an alkynyl and lower alkynyl group bound through a single, terminal ether linkage.

The term "aromatic" refers to the ring moieties which satisfy the Hückel 4n+2 rule for aromaticity, and includes both aryl (i.e., carbocyclic) and heteroaryl (also called heteroaromatic) structures, including aryl, aralkyl, heteroaryl, or heteroaralkyl moieties, or oligomeric or polymeric analogs thereof.

The term "aryl" as used herein, and unless otherwise specified, refers to an aromatic substituent or structure containing a single aromatic ring or multiple aromatic rings that are fused together, directly linked, or indirectly linked (such that the different aromatic rings are bound to a common group such as a methylene or ethylene moiety). Unless otherwise modified, the term "aryl" refers to carbocyclic structures. Preferred aryl groups contain 5 to 24 carbon atoms, and particularly preferred aryl groups contain 5 to 14 carbon atoms. Exemplary aryl groups contain one aromatic ring or two fused or linked aromatic rings, e.g., phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to aryl substituents in which at least one carbon atom is replaced with a heteroatom, as will be described in further detail infra.

The term "aryloxy" as used herein refers to an aryl group bound through a single, terminal ether linkage, wherein "aryl" is as defined above. An "aryloxy" group may be represented as —O-aryl where aryl is as defined above.

The term "aralkyl" refers to an alkyl group with an aryl substituent, wherein "aryl" and "alkyl" are as defined above. In some embodiments, the aralkyl groups contain 6 to 24 carbon atoms, and particularly preferred aralkyl groups contain 6 to 16 carbon atoms. Examples of aralkyl groups include, without limitation, benzyl, 2-phenyl-ethyl, 3-phenyl-propyl, and the like.

The term "acyl" refers to substituents having the formula —(CO)-alkyl, —(CO)-aryl, or —(CO)-aralkyl, and the term "acyloxy" refers to substituents having the formula —O(CO)-alkyl, —O(CO)-aryl, or —O(CO)-aralkyl, wherein "alkyl," "aryl, and "aralkyl" are as defined above.

The terms "cyclic" and "ring" refer to alicyclic or aromatic groups that may or may not be substituted and/or heteroatom-containing, and that may be monocyclic, bicyclic, or polycyclic. The term "alicyclic" is used in the conventional sense to refer to an aliphatic cyclic moiety, as opposed to an aromatic cyclic moiety, and may be monocyclic, bicyclic, or polycyclic. The term "acyclic" refers to a structure in which the double bond is not contained within a ring structure.

The terms "halo," "halide," and "halogen" are used in the conventional sense to refer to a chloro, bromo, fluoro, or iodo substituent.

The term "heteroatom-containing" as in a "heteroatom-containing ring" refers to a hydrocarbon molecule or a molecular fragment in which one or more carbon atoms is replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing, the terms "heteroaryl" and heteroaromatic" respectively refer to "aryl" and "aromatic" substituents that are heteroatom-containing, and the like. It should be noted that a "heterocyclic" group or compound may or may not be aromatic, and further that "heterocycles" may be monocyclic, bicyclic, or polycyclic as described above with respect to the term "aryl." Non-limiting examples of heteroaryl substituents include pyrrolyl, pyrrolidinyl, pyridinyl, quinolinyl, indolyl, pyrimidinyl, imidazolyl, etc., and non-limiting examples of heteroatom-containing alicyclic groups are pyrrolidino, morpholino, piperazino, and piperidino.

The term "kinetics," as understood by those skilled in the art, refers to the rate or speed of the reaction under the chosen reaction conditions. The dependence of this rate of reaction on the concentrations of the various reactants also gives some insight as to the mechanism of the reaction. As described herein, the methods provide reactions exhibiting pseudo first-order kinetics, described in terms of a first order rate constant, $k_{obs}$, measured in reciprocal second. The term "rate constant" refers to this pseudo first order rate constant.

By "substituted" as in "substituted alkyl," "substituted aryl," and the like, as alluded to in some of the aforementioned definitions, is meant that in the alkyl, aryl, heteroaryl, or other moiety, at least one hydrogen atom bound to a carbon (or other) atom is replaced with one or more non-hydrogen substituents. Examples of such substituents include, without limitation halogen (e.g., F, Cl, Br, I), hydroxyl, sulfhydryl, $C_1$-$C_{24}$ alkoxy, $C_5$-$C_{24}$ aryloxy, $C_6$-$C_{24}$ aralkyloxy, acyl (including $C_1$-$C_{24}$ alkylcarbonyl (—CO-alkyl) and $C_6$-$C_{24}$ arylcarbonyl (—CO-aryl)), acyloxy (—O-acyl, including $C_2$-$C_{24}$ alkylcarbonyloxy (—O—CO-alkyl) and $C_6$-$C_{24}$ arylcarbonyloxy (—O—CO-aryl)), $C_2$-$C_{24}$ alkoxycarbonyl ((CO)—O-alkyl), $C_6$-$C_{24}$ aryloxycarbonyl (—(CO)—O-aryl), halocarbonyl (—CO)—X where X is halogen), carboxy (—COOH), carboxylato (—COO—), carbamoyl (—(CO)—NH$_2$), mono-($C_1$-$C_{24}$ alkyl)-substituted carbamoyl (—(CO)NH($C_1$-$C_{24}$ alkyl)), di-($C_1$-$C_{24}$ alkyl)-substituted carbamoyl (—(CO)—N($C_1$-$C_{24}$ alkyl)$_2$), mono-($C_5$-$C_{24}$ aryl)-substituted carbamoyl (—(CO)—NH-aryl), di-($C_5$-$C_{24}$ aryl)substituted carbamoyl (—(CO)—N($C_5$-$C_{24}$ aryl)$_2$), di-N—($C_1$-$C_{24}$ alkyl),N—($C_5$-$C_{24}$ aryl)-substituted carbamoyl, thiocarbamoyl (—(CS)—NH$_2$), mono-($C_1$-$C_{24}$ alkyl)-substituted thiocarbamoyl (—(CS)—NH($C_1$-$C_{24}$ alkyl)), di-($C_1$-$C_{24}$ alkyl)-substituted thiocarbamoyl (—(CS)—N($C_1$-$C_{24}$ alkyl)$_2$), mono-($C_5$-$C_{24}$ aryl)substituted thiocarbamoyl (—(CS)—NH-aryl), di-($C_5$-$C_{24}$ aryl)-substituted thiocarbamoyl (—(CS)—N($C_5$-$C_{24}$ aryl)$_2$), di-N—($C_1$-$C_{24}$ alkyl),N—($C_5$-$C_{24}$ aryl)-substituted thiocarbamoyl, cyano cyanato (—O—C≡N), thiocyanato (—S—C≡N), formyl (—(CO)—H), thioformyl (—(CS)—H), amino (—NH$_2$), mono-($C_1$-$C_{24}$ alkyl)-substituted amino, di-($C_1$-$C_{24}$ alkyl)-substituted amino, mono-($C_5$-$C_{24}$ aryl)substituted amino, di-($C_5$-$C_{24}$ aryl)-substituted amino, $C_1$-$C_{24}$ alkylamido (—NH—(CO)-alkyl), $C_6$-$C_{24}$ arylamido (—NH—(CO)-aryl), nitro (—NO$_2$), nitroso (—NO), $C_1$-$C_{24}$ alkylthio (—S— alkyl), $C_5$-$C_{24}$ arylthio (—S-aryl), $C_1$-$C_{24}$ alkyl (preferably $C_1$-$C_{12}$ alkyl, more preferably $C_1$-$C_6$ alkyl), $C_2$-$C_{24}$ alkenyl (preferably $C_2$-$C_{12}$ alkenyl, more preferably $C_2$-$C_6$ alkenyl), $C_2$-$C_{24}$ alkynyl (preferably $C_2$-$C_{12}$ alkynyl, more preferably $C_2$-$C_6$ alkynyl), $C_5$-$C_{24}$ aryl (preferably $C_5$-$C_{24}$ aryl), and $C_6$-$C_{24}$ aralkyl (preferably $C_6$-$C_{16}$ aralkyl). Within these substituent structures, the "alkyl," "alkylene," "alkenyl," "alkenylene," "alkoxy," "aromatic," "aryl," "aryloxy," and "aralkyl" moieties may be optionally fluorinated or perfluorinated.

By "functionalized" as in "functionalized alkyl," "functionalized aryl or heteroaryl," "functionalized olefin," and the like, is meant that in the alkyl, aryl, heteroaryl, olefin, or other moiety, at least one hydrogen atom bound to a carbon (or other) atom is replaced with one or more functional groups such as those described herein and above. The term "functional group" is meant to include any functional species that is suitable for the uses described herein.

As describe elsewhere herein, separate embodiments include those compounds where the alkyl, alkylene, alkenyl, alkenylene, alkoxy, aromatic, aryl, heteroaryl, and/or acyl groups are functionalized by every combination of any substituents or functional groups described herein (i.e., every individual or subcombination thereof).

The term "nucleation and growth" refers to the formation and growth of the nanoparticles. These two steps may be considered separately or together in individual embodiments. In certain embodiments, the methods provide for spontaneous nucleation (i.e., without extraneous nucleant) and subsequent growth of the metal-sulfide/selenide nanoparticles. In some other embodiments, the methods may be applied in the presence of one or more nanoscale metal, metal oxide, metal phosphide metal sulfide, metal selenide nucleants, in which the methods provide for growth of the nanoparticles (spontaneous nucleation being less efficient when such extraneous nucleants are present), the added nucleant providing the core of a core-shell arrangement. The term "controlled nucleation and growth" is a term understood by those skilled in the art to refer to the selection of conditions in which pluralities of nanoparticles form and grow at substantially the same time and rate, resulting in substantially monodispersed populations of nanoparticles. Such control is achieved by judicious choice and manipulation of at least one kinetic feature of the system and generally involves inductions times (between mixing and nucleation) on the order of at least seconds or minutes, or at least greater than the mixing time of the ingredients.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

With respect to the nanoparticles, the term "nanoscale" or "nanodimensioned," without more refers to a particle or object having at least one dimension (e.g., diameter in the case of spheres or diameter or length in the case of cylinders) in a range of from about 1 nm to about 1000 nm, though in the present case, the range of dimensions is narrower that this definition (see elsewhere herein). With respect to nanoparticle shape, the term "substantially spherical" relates to the shape which may be approximated as spherical. To the extent that a given particle or population of particles deviates from a purely spherical shape, such that each particle can be described as having a major and minor axis, the ratio of the lengths of the major and minor axis of each particle can be less than about 2, less than about 1.5, less than about 1.3, less than about 1.2, less than about 1.1, or less than about 1.05 or less than about 1.02. As used herein, where the particles are other than purely spherical, the term "mean diameter" refers to the arithmetic average of the lengths of the major and minor axes of the particles.

The following listing of embodiments is intended to complement, rather than displace or supersede, the previous descriptions.

Embodiment 1

A method of preparing metal sulfide, metal selenide, or mixed metal sulfide/selenide nanoparticles comprising: (a) contacting at least two precursor metal salts with a sulfur- or selenium-containing precursor, or (b) contacting a precursor metal salt with a sulfur-containing precursor and a selenium-containing precursor, or a mixture of sulfur- and selenium-containing precursors, in each case, the contacting being done simultaneously or sequentially in a solution, each precursor metal salt being capable of reacting with each sulfur- and selenium-containing precursor to form the corresponding metal sulfide and metal selenide, the contacting giving rise to reaction conditions sufficient to control the at least one parameter of particle size, particle distribution, and particle composition of the nanoparticles to a predetermined particle size, distribution, and composition, the sulfur- or selenium-containing precursor each independently having a structure of Formula (I), Formula (II), or Formula (III), or an isomer, salt, or tautomer thereof,

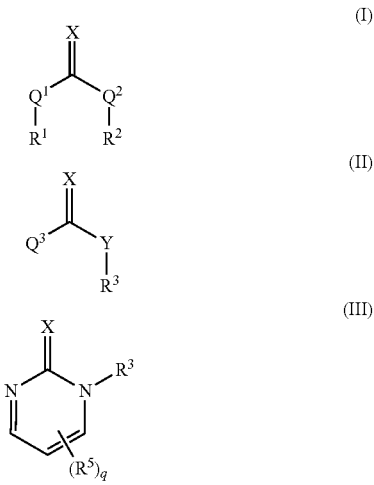

wherein
$Q^1$ is independently —O—, —S—, Se—, —$CR^3R^4$—, —$N(R^4)$— or $P(R^4)$—;
$Q^2$ is independently —O—, —S—, Se—, —$CR^3R^4$—, —$N(R^3)$— or $P(R^3)$—;
$Q^3$ is an optionally substituted aryl or optionally substituted heteroaryl;
$R^1$, $R^2$, $R^3$, and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;
or optionally any two of $R^1$, $R^2$, $R^3$, and $R^4$ are, within the same structure, linked to form an optionally substituted 5- to 10-membered (preferably 5-membered or 6-membered) heterocycle comprising an optionally substituted alkylene or an optionally conjugated alkenylene linkage;
$R^5$ is halogen (e.g., Cl, Br, I, or F), —CN, —$NO_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;
q is 0, 1, 2, or 3;
X is S or Se; and
Y is a bond, —O—, —S—, or —$N(R^3)$—.

As should be apparent, the steps of (a) contacting at least two precursor metal salts with a sulfur- or selenium-containing precursor and (b) contacting a precursor metal salt with a sulfur-containing precursor and a selenium-containing precursor, or a mixture of sulfur- and selenium-containing precursors represent individual aspects of Embodiment 1.

In certain aspects of this Embodiment, the structures of Formulae (I), (II), or (III) exhibit kinetics favorable to the formation of monodispersed nanoparticles of the corresponding metal sulfide and/or selenide under the reaction conditions employed.

Embodiment 2

The method of Embodiment 1, comprising contacting two or more precursor metal salts (preferably two) with a sulfur-containing precursor, a selenium-containing precursor, or a combination of sulfur- and selenium-containing precursors to form the nanoparticles.

Embodiment 3

The method of Embodiment 1, comprising contacting a precursor metal salt with a combination of a sulfur-containing precursor and a selenium-containing precursor to form the nanoparticles.

Embodiment 4

A method of preparing metal sulfide, metal selenide, or mixed metal sulfide/selenide nanoparticles, optionally monodispersed, preferably nanocrystals, the method comprising contacting a precursor metal salt with a sulfur- or selenium-containing precursor each independently having a structure of Formula (IA), Formula (II), or Formula (III), or an isomer, salt, or tautomer thereof, in solution under controlled nucleation and growth conditions for the formation of the monodispersed nanoparticles:

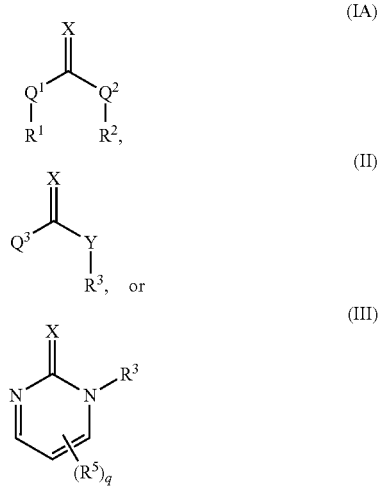

wherein
$Q^1$ is independently —O—, —S—, Se—, —$CR^3R^4$—, —$N(R^4)$— or $P(R^4)$—;
$Q^2$ is independently —O—, —S—, Se—, —$CR^3R^4$—, —$N(R^3)$— or $P(R^3)$—;
$Q^3$ is optionally substituted aryl or optionally substituted heteroaryl;

$R^1$ and $R^2$ are independently at each occurrence optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

$R^3$ and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

or optionally any two of $R^2$, $R^3$, and $R^4$ are, within the same structure, linked to form an optionally substituted 5- to 10-membered (preferably 5-membered or 6-membered) heterocycle comprising an optionally substituted alkylene or an optionally conjugated alkenylene linkage;

$R^5$ is halogen (e.g., Cl, Br, I, or F), —CN, —$NO_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;
X is S or Se; and
Y is a bond, —O—, —S—, or —$N(R^3)$–.

Embodiment 5

The method of any one of claims 1 to 4, wherein a mixture of sulfur- and selenium-containing precursors is used, the sulfur- and selenium-containing precursors exhibiting pseudo first order kinetics with respect to the metal precursor salt, the pseudo first kinetics of each having a pseudo first order rate constant, the ratio of the pseudo first order rate constants being in a range of from 1 to 1.1, from 1.1 to 1.2, from 1.2 to 1.3, from 1.3 to 1.4, from 1.4 to 1.5, from 1.5 to 1.6, from 1.6 to 1.7, from 1.7 to 1.8, from 1.8 to 1.9, from 1.9 to 2, from 2 to 2.2, from 2.2 to 2.4, from 2.4 to 2.6, from 2.6 to 2.8, from 2.8 to 3, from 3 to 4, from 4 to 5, from 5 to 10, or any combination of two or more of these ranges, under the reaction conditions employed. In these cases, the ratio of pseudo first order rate constants is the ratio of the larger to the small of the two rate constants.

Embodiment 6

The method of any one of claims 1 to 4, wherein a mixture of sulfur- and selenium-containing precursors is used, the sulfur- and selenium-containing precursors exhibiting pseudo first order kinetics with respect to the metal precursor salt, the pseudo first kinetics of each having a pseudo first order rate constant, the ratio of the pseudo first order rate constants being in a range of from 10 to 100, from 100 to 1000, from 1000 to 10,000, or any combination of two or more of these ranges, under the reaction conditions employed. In these cases, the ratio of pseudo first order rate constants is the ratio of the larger to the small of the two rate constants.

Embodiment 7

The method of claim 5 or 6, wherein the pseudo-first order rate constants, $k_{obs}$ ($s^{-1}$) associated with at least one of the sulfur- or selenium-containing precursors with the metal containing precursor salt is in a range from $1\times10^{-4}$ to $5\times10^{-4}$, from $5\times10^{-4}$ to $1\times10^{-3}$, from $1\times10^{-3}$ to $5\times10^{-3}$, from $5\times10^{-3}$ to $1\times10^{-2}$, from $1\times10^{-2}$ to $5\times10^{-2}$, from $5\times10^{-2}$ to $1\times10^{-1}$, from $1\times10^{-1}$ to 0.5, from 0.5 to 1, or any combination of two or more of these ranges.

Embodiment 8

The method of any one of Embodiments 1 to 7, wherein at least one of the sulfur- or selenium-containing precursors has a structure according to:

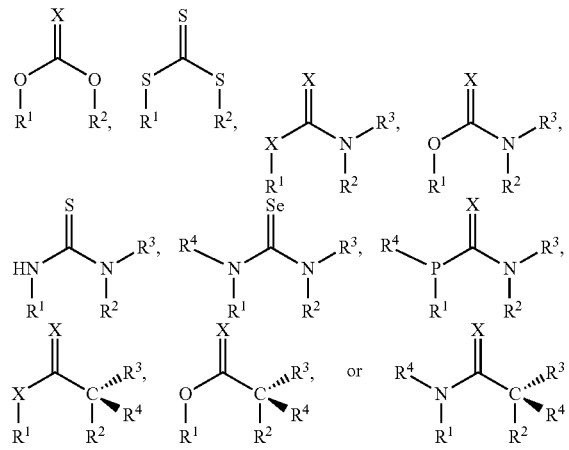

Embodiment 9

The method of any one of Embodiments 1 to 8, wherein $R^1$ and $R^2$ are, within the same structure, linked to form a 5- to 10-membered (preferably 5-membered or 6-membered) heterocycle comprising an optionally substituted alkylene or an optionally substituted and/or conjugated alkenylene linkage.

Embodiment 10

The method of any one of Embodiments 1 to 9, wherein at least one of the sulfur- or selenium-containing precursors has a structure according to:

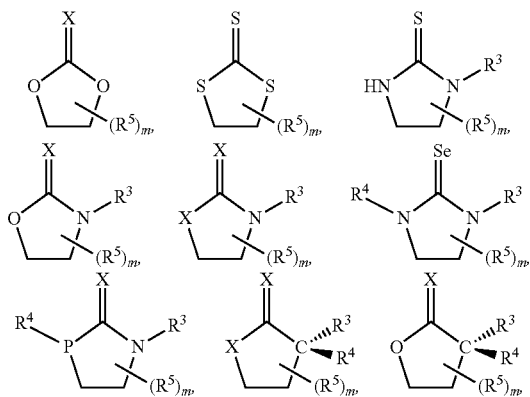

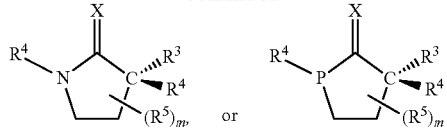

wherein $R^5$ is halogen, —CN, —NO$_2$, C$_{1-6}$ alkoxy, C$_{1-6}$ alkyl, C$_{3-6}$ cycloalkyl, C$_{2-6}$ alkenyl, optionally substituted aryl, optionally substituted aryloxy, optionally substituted aralkyl, optionally substituted heteroaryl, or optionally substituted heteroaralkyl; and m is 0, 1, 2, 3, or 4.

Embodiment 11

The method of any one of Embodiments 1 to 9, wherein at least one of the sulfur- or selenium-containing precursors has a structure according to:

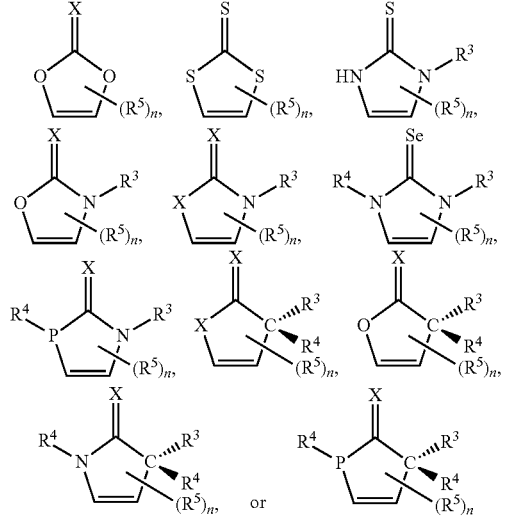

wherein $R^5$ is halogen, —CN, —NO$_2$, C$_{1-6}$ alkoxy, C$_{1-6}$ alkyl, C$_{3-6}$ cycloalkyl, C$_{2-6}$ alkenyl, optionally substituted aryl, optionally substituted aryloxy, optionally substituted aralkyl, optionally substituted heteroaryl, or optionally substituted heteroaralkyl; and n is 0, 1, or 2.

Embodiment 12

The method of any one of Embodiments 1 to 9, wherein at least one of the sulfur- or selenium-containing precursors has a structure according to:

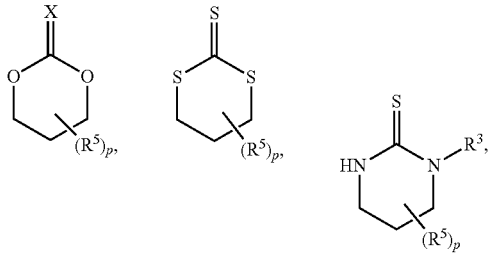

-continued

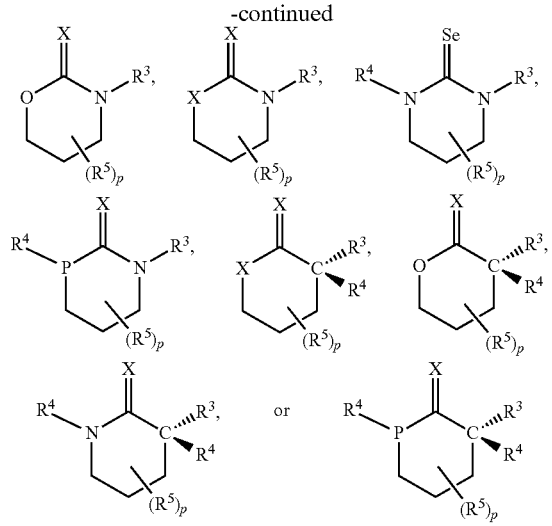

wherein R⁵ is halogen, —CN, —NO₂, C₁₋₆ alkoxy, C₁₋₆ alkyl, C₃₋₆ cycloalkyl, C₂₋₆ alkenyl, optionally substituted aryl, optionally substituted aryloxy, optionally substituted aralkyl, optionally substituted heteroaryl, or optionally substituted heteroaralkyl; and p is 0, 1, 2, 3, 4, 5, or 6.

Embodiment 13

The method of any one of Embodiments 1 to 9, wherein at least one of the sulfur- or selenium-containing precursors has a structure according to:

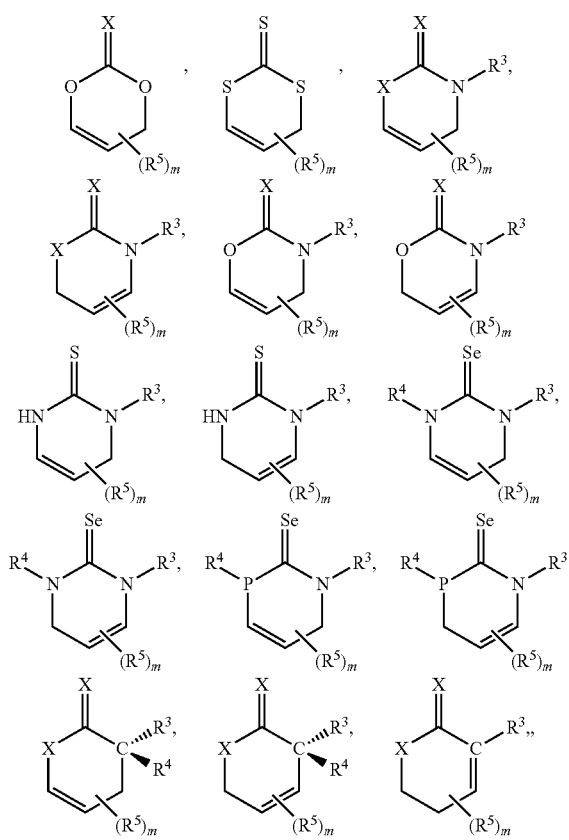

-continued

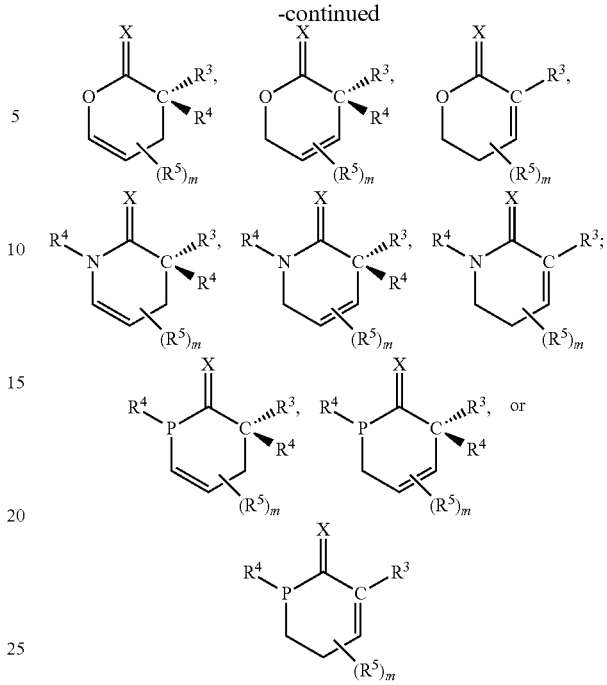

wherein R⁵ is halogen, —CN, —NO₂, C₁₋₆ alkoxy, C₁₋₆ alkyl, C₃₋₆ cycloalkyl, C₂₋₆ alkenyl, optionally substituted aryl, optionally substituted aryloxy, optionally substituted aralkyl, optionally substituted heteroaryl, or optionally substituted heteroaralkyl; and m is 0, 1, 2, 3, or 4.

Embodiment 14

The method of any one of Embodiments 1 to 9, wherein at least one of the sulfur- or selenium-containing precursors has a structure according to:

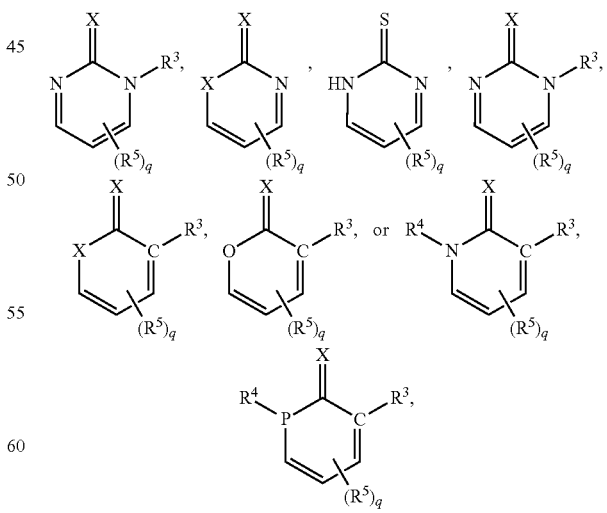

wherein R⁵ is halogen, —CN, —NO₂, C₁₋₆ alkoxy, C₁₋₆ alkyl, C₃₋₆ cycloalkyl, C₂₋₆ alkenyl, optionally substituted aryl, optionally substituted aryloxy, optionally substituted aralkyl, optionally substituted heteroaryl, or optionally substituted heteroaralkyl; and q is 0, 1, 2, or 3.

Embodiment 15

The method of any one of Embodiments 1 to 7, wherein at least one of the sulfur- or selenium-containing precursors has a structure according to:

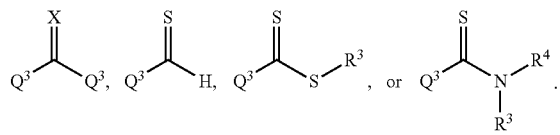

Embodiment 16

The method of Embodiment 12, wherein $Q^3$ is phenyl or pyridinyl, optionally substituted with 0, 1, 2, 3, or 4 halo, —CN, —NO$_2$, $C_{1-6}$ alkoxy, $C_{1-6}$ alkyl, $C_{3-6}$ cycloalkyl, $C_{2-6}$ alkenyl, optionally substituted aryl, optionally substituted aralkyloxy, optionally substituted aralkyl, optionally substituted heteroaryl, or optionally substituted heteroaralkyl Embodiment 17

The method of any one of Embodiments 1 to 16, wherein $R^1$, $R^2$, $R^3$, and $R^4$ are independently optionally substituted alkyl, optionally substituted aryl, or optionally substituted aralkyl.

Embodiment 18

The method of any one of Embodiments 1 to 16, wherein $R^1$, $R^2$, $R^3$, $R^4$, or $R^5$ are independently any of the optionally substituted alkyls, optionally substituted aryls, or optionally substituted aralkyls described in this application.

Embodiment 19

The method of any one of Embodiments 1 to 18, wherein X is S

Embodiment 20

The method of any one of Embodiments 1 to 18, wherein X is Se.

Embodiment 21

The method of any one of Embodiments 1 to 20, wherein the precursor metal salt or salts comprise any one of the metals described in this application.

Embodiment 22

The method of any one of Embodiments 1 to 21, wherein the precursor metal salt or salts comprise a $C_{2-30}$ carboxylate (preferably oleate), thiocarboxylate, (alkyl)phosphonate, alkylsulfonate, alkylphosphate, alkylsulfate, alkylphosphonamide, or halide (e.g., F, Cl, Br, or I) counterion, or any counterion or combination of counterions described in this application.

Embodiment 23

The method of any one of Embodiments 1 to 22, wherein the precursor metal salt or salts comprise Cd, Cu, Fe, Ga, Hg, In, Mn, Mo, or Zn, preferably Cd, Cu, Ga, In, Ni, Pb, or Zn, more preferably Cd or Pb.

Embodiment 24

The method of any one of Embodiments 1 to 23, wherein the method comprises contacting a first and second precursor metal salt with the sulfur- or selenium-containing precursor in solution under controlled nucleation and growth conditions.

Embodiment 25

The method of Embodiment 24, wherein the first and second precursor metal salts are contacted with the sulfur- or selenium-containing precursor at the same time.

Embodiment 26

The method of Embodiment 24, wherein the first and second precursor metal salts are contacted with the sulfur- or selenium-containing precursor sequentially.

Embodiment 27

The method of any one of Embodiments 1 to 23, wherein the method comprises contacting a precursor metal salt with a sulfur-containing precursor and a selenium-containing precursor in solution under controlled nucleation and growth conditions.

Embodiment 28

The method of Embodiment 27, wherein the precursor metal salt is contacted with the sulfur- and selenium-containing precursors, at the same time.

Embodiment 29

The method of Embodiment 27, wherein the precursor metal salt is contacted with the one sulfur- and selenium-containing precursors sequentially. In separate sub-embodiments, the precursor metal salt is contacted with the sulfur-containing precursor first, and in a separate embodiment, the precursor metal salt is contacted with the selenium-containing precursors sequentially first.

Embodiment 30

The method of any one of Embodiments 27 to 29, wherein the metal salt reacts with each of the sulfur- and selenium-containing precursors at different rates under the controlled nucleation and growth conditions, resulting in the nanoparticles having different amounts of metal sulfide and metal selenide therewithin.

Embodiment 31

The method of any one of Embodiments 1 to 30, resulting in a plurality of monodispersed nanoparticles, each nanoparticle exhibiting a variable composition of metal sulfide/metal selenide throughout its structure.

Embodiment 32

The method of Embodiment 31, wherein the composition of each metal sulfide/metal selenide varies continuously (i.e., in a graded structure) throughout its structure.

Embodiment 33

The method of Embodiment 31, wherein the composition of metal sulfide/metal selenide varies discontinuously (i.e., in a simple core-shell arrangement) throughout its structure.

Embodiment 34

The method of any one of Embodiments 1 to 33, wherein the solution is non-aqueous (i.e., containing less than about 5% water, or less than 1% water, or substantially anhydrous) (including any of the solvents as described in this application).

Embodiment 35

The method of any one of Embodiments 1 to 33, wherein the solution is or comprises any solvent described in this application or combination thereof.

Embodiment 36

The method of any one of Embodiments 1 to 35, wherein the nanoparticles are substantially spherical, the plurality of nanoparticles having an average mean diameter in a range of from about 1 nm to about 5 nm, from about 5 nm to about 10 nm, from about 10 nm to about 25 nm, from about 25 nm to about 50 nm, from about 50 nm to about 100 nm, or any combination of two or more of these ranges.

Embodiment 37

The method of any one of Embodiments 1 to 35, wherein the nanoparticles are cylindrical having at least one dimension in a range of from about 1 nm to about 5 nm, from about 5 nm to about 10 nm, from about 10 nm to about 25 nm, from about 25 nm to about 50 nm, from about 50 nm to about 100 nm, or any combination of two or more of these ranges.

Embodiment 38

The method of any one of Embodiments 1 to 36, wherein the monodispersity is characterized by a standard deviation variance of particle size of less than 0.5%, 1%, 1.5%, 2%, 2.5%, 5%, 7.5%, 10%, 15%, or 20% relative to the mean particle size of the nanoparticle, as measured by statistical samples of TEM micrographs.

Embodiment 39

The method of any one of Embodiments 1 to 38, wherein the metal sulfide, metal selenide, or mixed metal sulfide/selenide nanoparticles are crystalline.

Embodiment 40

The method of any one of Embodiments 1 to 39, wherein the metal sulfide, metal selenide, or mixed metal sulfide/selenide nanoparticles exhibit the characteristics of quantum dots.

Embodiment 41

One or more nanoparticles prepared by any one of Embodiments 1 to 40.

Embodiment 42

A plurality of crystalline quantum dots prepared by any one of Embodiments 1 to 40.

Embodiment 43

The nanoparticles of Embodiments 41 or the crystalline quantum dots of Embodiment 39 each comprising CdS, CdSe, CuS, CuSe, GaS, GaSe, InS, InSe, NiS, NiSe, PbS, PbSe, ZnS, ZnSe or any combination thereof.

Embodiment 44

A plurality of nanoparticles, the size of each nanoparticle being greater than the Exciton Bohr radius of that material. An alternative Embodiment comprises a plurality of nanoparticles, the size of each nanoparticle being less than the Exciton Bohr radius of that material.

Embodiment 45

The crystalline quantum dots of Embodiments 42 or 43 that exhibit:
(a) quantum yields of at least 75%, at least 80%, at least 85%, at least 90%, at least 95%, or at least 98%;
(b) less than 5% thermal droop at operating temperatures of 100° C., of 125° C., or of 150° C.;
(c) less than 10% flux density saturation at fluxes of 100 mW/mm$^2$, 500 mW/mm$^2$, or 1 W/mm$^2$;
(d) emission wavelengths within 5 nm, 4 nm, 3 nm, 2 nm, or 1 nm precision while maintaining a linewidth (defined as FWHM, or full width at half magnitude) of less than 30 nm or in a range of 25 nm to 35 nm;
(e) or any combination of two or more of (a)-(d).

Embodiment 46

An electronic display, television screen, transistor, solar cell, light emitting diode (LED), or diode laser comprising the nanoparticles of any one of Embodiments 38 to 42. Emissive devices—including those listed previously—that comprise the nanoparticles disclosed herein (or that comprise nanoparticles made according to any of the disclosed method) are also within the scope of the present disclosure.

EXAMPLES

Example 1. Materials and Methods—General Considerations

All manipulations were performed in air unless otherwise indicated. Toluene (99.5%), tetrachloroethylene (99%), methyl acetate (99%), hexanes (98.5%), methanol (99.8%), ethanol (≥99.8%), dichloromethane (≥99.5%), chloroform (≥99.8%), acetone (≥99.8%), acetonitrile (99.5%), diphenyl ether (99%), 1-octadecene (90%), tetraethylene Glycol dimethyl ether ("tetraglyme"≥99%), isopropanol (≥99.7%), triethylamine (≥99%), tributylamine (≥99.5%), trifluoroacetic acid (99%), trifluoroacetic acid anhydride (tributylamine (≥99.5%), cadmium nitrate tetrahydate (98%), zinc acetate dihydrate (≥99.0%), zinc nitrate hexahydrate (98%), copper iodide (99.999%), tin(IV) chloride pentahydrate (98%), tin (II) chloride (98%) zinc chloride (99.99%), hexyl phosphonic acid (95%), tetramethylthiourea (98%) (12), hexamethyldisilazane (99.9%), myristic acid (≥99%), sodium hydroxide (97-8%), selenium (pellets, <4 mm, ≥99.99%), phenyl isothiocyanate (98%), 4-chlorophenyl isothiocyanate (99%), hexyl isothiocyanate (95%), cyclohexyl isothiocyanate (98%), 4-methoxyphenyl isothiocyanate (98%), isopropyl isothiocyanate (97%), 4-(trifluormethyl)phenyl isothiocyanate (97%), 4-cyanophenyl isothiocyanate (98%), hexylamine (99%), octylamine (99%), dodecyl amine (98%), octadecylamine (99%), oleylamine (technical grade, 70%), oleylamine (98%, primary amine), aniline (99%), dioctylamine (98%), and dibutylamine (99.5%) were obtained from Sigma Aldrich and used without further purification. Oleic acid (99%) was obtained from either Sigma Aldrich or Alfa Aesar and used without further purification. Cadmium oxide (99.99%), copper (II) acetylacetonate (98+%), nickel (II) stearate, tri-n-octylphosphine (min. 97%), and tri-n-butylphosphine (99%) were purchased from Strem Chemicals and used as received. Lead (II) oxide was obtained from either Strem (99.999+%) or Alfa. Aesar (99.9995%) and used without further purification. 3,5-bis (trifluoromethyl)phenyl isothiocyanate (97+%) was obtained from Maybridge and used as received. Hexadecane (99%) was obtained from Sigma Aldrich, stirred with calcium hydride overnight, and distilled prior to use. 1-Octene (99%) was obtained from Acros Organics, stirred with calcium hydride overnight, and distilled prior to use. Diethylene glycol dimethyl ether ("diglyme", anhydrous, 99.5%) was obtained from Sigma Aldrich and shaken with activated alumina prior to use. N,N'-diphenylthiourea (98%) (2) was obtained from Aldrich or synthesized according to the procedure below. Trioctylphosphine oxide (99%) was obtained from Aldrich and recrystallized from hot acetonitrile.

Kinetics experiments were monitored at 400 nm using an Ocean Optics TP300 dip probe (2 mm path length) attached to a Perkin-Elmer Lambda 650 spectrophotometer equipped with deuterium and halogen lamps. UV-Vis-NIR spectra were obtained using a Perkin-Elmer Lambda 950 spectrophotometer equipped with deuterium and halogen lamps and either a PbS or InGaAs detector. UV-Vis-NIR spectra were corrected with a linear baseline correction and an offset at the detector change (860 nm). Samples for UV-Vis-NIR and photoluminescence spectroscopies were dissolved in tetrachloroethylene for PbS, toluene for CdS, and hexanes for ZnS, and a blank with the same solvents at the concentrations of the corresponding sample was used. Photoluminescence measurements in the range 300-800 nm were performed using a Fluoromax 4 from Horiba Scientific, and quantum yields were determined using a quanta-phi integrating sphere accessory. Transmission electron microscopy (TEM) was performed on either a JEOL JEM-100CX or a JEOL 2100 TEM. Powder X-ray diffraction (XRD) was measured on a PANalytical X'Pert Powder X-ray diffractometer. Raman spectra were obtained using a Renishaw inVia Raman Microscope with a 532 nm laser operating at 27 mW and 1% power, in the range of 200-400 cm$^{-1}$ with a resolution of 2 cm-1. Acquisition times were 10 s per scan with the final spectrum from the co-addition of 185 scans.

Example 2. Selected Syntheses

Example 2.1. Synthesis of Substituted Thioureas

A solution of alkylamine (3.0 mmol) in toluene (2.5 mL) was added to a solution of alkyl or aryl isothiocyanate (3.0 mmol) in toluene (2.5 mL). The solution became warm upon the addition and was allowed to stir for a few minutes before the volatiles were removed under vacuum. The product was thoroughly dried under vacuum to remove trace toluene, the duration of which depends on the reaction scale (3-24 hours), resulting in quantitative yield in all cases. These reactions can be run at 30× the scale and 3× the concentration described with no observable changes. A wide variety of N-alkyl-N'-aryl-thioureas (3a-3f) were best obtained from aryl isothiocyanates and alkylamines rather than the corresponding alkyl isothiocyanate, which reacted too sluggishly with anilines to be practical.

Example 2.1.1. Thiourea Synthesis: N-phenyl-N'-dodecylthiourea (3d)

N-dodecyl-N'-phenylthiourea was prepared according to the general procedure from solutions of n-dodecylamine (11.56 g, 62.4 mmol) in toluene (20 mL) and phenyl isothiocyanate (8.44 g, 62.4 mmol) in toluene (20 mL), producing a white powder. Yield: 19.56 g (98%).

Example 2.1.2. N-(3,5-bis(trifluoromethylphenyl))-N'-phenylthiourea (1)

was prepared using the standard procedure. White powder. $^1$H NMR (CD$_2$Cl$_2$, 500 MHz): δ=7.33-7.40 (m, 3H, o-CH and p-CH (unsub.)), 7.48 (m, 2H, m-CH (unsub.)), 7.71 (s, 1H, p-CH (sub.)), 8.01 (s, 2H, o-CH (sub.)), 8.04 (b, 1H, NH (unsub.)), 8.92 (b, 1H, NH (sub.)); $^{13}$C {$^1$H} (125 MHz, CD$_2$Cl$_2$): δ=119.68 (p-C (sub.), p), 123.50 (—CF$_3$, q, JC-F=271 Hz), 125.21 (m-C (sub.), q, JC-F=4 Hz), 125.85 (o-C (unsub.)), 128.33 (p-C (unsub.)), 130.66 (m-C (unsub.)), 132.12 (m-C (sub.), q, JC-F=34 Hz), 136.39 (i-C), 140.25 (i-C), 180.19 (C(S)); Anal. Calc'd for C$_{15}$H$_{10}$F$_6$N$_2$S: C, 49.32, H, 3.04, N, 7.67. Found: C, 49.53; H, 2.89; N, 7.68. MS (FAB) m/z Calc'd for C$_{15}$H$_{11}$F$_6$N$_2$S+: 365.05. Found: 365.07.

Example 2.1.3. N,N'-diphenylthiourea (2)

was prepared using the standard procedure, but at half the concentration reported above. White powder. $^1$H NMR (C$_6$D$_6$, 500 MHz): δ=7.00 (m, 10H, —C$_6$H$_5$), 7.59 (s, 2H, NH); $^{13}$C {1H} (125 MHz, C$_6$D$_6$): δ=124.32 (o-C), 125.94 (p-C), 129.18 (m-C), 137.91 (i-C), 179.56 (C(S)); Anal. Calc'd for C$_{13}$N$_2$SH$_{12}$: C, 68.39; H, 5.30; N, 12.27. Found: C, 68.49; H, 5.46; N, 12.28. MS (FAB) m/z Calc'd for C$_{13}$H$_{13}$N$_2$S+: 229.08. Found: 229.32.

Example 2.1.4. N-(p-cyanophenyl)-N'-dodecylthiourea (3a)

was prepared using the standard procedure. White powder. $^1$H NMR (C$_6$D$_6$, 500 MHz): δ=0.45 (s, 1H, —CN), 0.93 (t, 3H, —CH$_3$), 1.07-1.36 (b, 20H, (CH$_2$)$_{10}$), 3.40 (b, 2H, —CH$_2$), 5.32 (s, 1H, NH), 6.49 (d, 2H, o-CH), 6.83 (d, 2H, m-CH), 7.39 (s, 1H, NH); $^{13}$C{1H} (125 MHz, C$_6$D$_6$): δ=14.39 (—CH$_3$), 23.15 (CH$_2$), 27.23 (CH$_2$), 29.03 (CH$_2$), 29.67 (CH$_2$), 29.84 (CH$_2$), 29.98 (CH$_2$), 30.04 (CH$_2$), 30.13 (CH$_2$), 30.14 (CH$_2$), 32.36 (CH$_2$), 45.53 (NCH$_2$), 108.70 (p-C), 118.38 (—CN), 122.45 (o-C), 133.44 (m-C), 141.29 (i-C), 180.57 (C(S)); Anal. Calc'd for C$_{20}$H$_{31}$N$_3$S: C, 71.80; H, 10.24; N, 8.37. Found: C, 71.57; H, 10.52; N, 8.37. MS (FAB) m/z Calc'd for C$_{20}$H$_{32}$N$_3$S+: 346.23. Found: 346.36.

Example 2.1.5. N-(p-(trifluoromethyl)phenyl)-N'-dodecylthiourea (3b)

was prepared using the standard procedure. White powder. $^1$H NMR (C$_6$D$_6$, 500 MHz): δ=0.93 (t, 3H, —CH$_3$), 1.08-1.32 (m, 20H, (CH$_2$)$_{10}$), 3.47 (b, 2H, —CH$_2$), 5.57 (b, 1H, NH), 6.79 (d, 2H, o-CH), 7.17 (d, 2H, m-CH), 8.53 (b, 1H, NH); $^{13}$C{$^1$H} (125 MHz, C$_6$D$_6$): δ=14.40 (—CH$_3$), 23.15 (CH$_2$), 27.26 (CH$_2$), 29.14 (CH$_2$), 29.70 (CH$_2$), 29.85 (CH$_2$), 30.00 (CH$_2$), 30.06 (CH$_2$), 30.14 (CH$_2$), 30.16 (CH$_2$), 32.37 (CH$_2$), 45.55 (NCH$_2$), 123.57 (o-C), 124.61 (—CF$_3$, d, JC-F=271 Hz), 127.06 (m-C), 127.40 (p-C, d, JC-F=33 Hz), 140.92 (i-C), 180.68 (C(S)); Anal. Calc'd for C$_{20}$H$_{31}$F$_3$N$_2$S: C, 61.83; H, 8.04; N, 7.21. Found: C, 61.73; H, 8.08; N, 7.13. MS (FAB) m/z Calc'd for C$_{20}$H$_{32}$F$_3$N$_2$S+: 389.22. Found: 389.26.

Example 2.1.6. N-(p-chlorophenyl)-N'-dodecylthiourea (3c)

was prepared using the standard procedure. White powder. $^1$H NMR (C$_6$D$_6$, 500 MHz): δ=0.92 (t, 3H, —CH$_3$), 1.06-1.36 (m, 20H, (CH$_2$)$_{10}$), 3.47 (b, 2H, —CH$_2$), 5.47 (b, 1H, NH), 6.58 (d, 2H, o-CH), 6.88 (d, 2H, m-CH), 8.17 (b, 1H, NH); $^{13}$C{$^1$H} (125 MHz, C$_6$D$_6$): δ=14.40 (—CH$_3$), 23.15 (CH$_2$), 27.21 (CH$_2$), 29.24 (CH$_2$), 29.68 (CH$_2$), 29.85 (CH$_2$), 29.98 (CH$_2$), 30.04 (CH$_2$), 30.14 (CH$_2$), 30.15 (CH$_2$), 32.37 (CH$_2$), 45.50 (NCH$_2$), 126.16 (o-C), 130.01 (m-C), 131.86 (p-C), 135.92 (i-C), 181.23 (C(S)); Anal. Calcd for C$_{19}$H$_{31}$ClN$_2$S: C, 64.29; H, 8.80; N, 7.89. Found: C, 63.97; H, 8.62; N, 7.73. MS (FAB) m/z Calcd for C$_{19}$H$_{32}$ClN$_2$S+: 355.20. Found: 355.27.

Example 2.1.7. N-phenyl-N'-dodecylthiourea (3d)

was prepared using the standard procedure. White powder. $^1$H NMR (C$_6$D$_6$, 500 MHz): δ=0.92 (t, 3H, —CH$_3$), 1.05-1.35 (m, 20H, (CH$_2$)$_{10}$), 3.48 (b, 2H, NCH$_2$), 5.67 (b, 1H, NH), 6.83 (t, 1H, p-CH), 6.87 (d, 2H, o-CH), 6.96 (t, 2H, m-CH), 8.51 (b, 1H, NH); $^{13}$C{$^1$H} (125 MHz, C$_6$D$_6$): δ=14.40 (—CH$_3$), 23.15 (CH$_2$), 27.22 (CH$_2$), 29.26 (CH$_2$), 29.67 (CH$_2$), 29.85 (CH$_2$), 29.99 (CH$_2$), 30.04 (CH$_2$), 30.14 (CH$_2$), 30.15 (CH$_2$), 32.37 (CH$_2$), 45.49 (NCH$_2$), 125.00 (o-C), 126.34 (p-C), 129.96 (m-C), 137.55 (i-C), 181.35 (C(S)); Anal. Calcd for C$_{19}$H$_{32}$N$_2$S: C, 71.19; H, 10.06; N, 8.74. Found: C, 71.05; H, 9.74; N, 8.62. MS (FAB) m/z Calcd for C$_{19}$H$_{33}$N$_2$S+: 321.24. Found: 321.35.

Example 2.1.8. N-(p-methylphenyl)-N'-dodecylthiourea (3e)

was prepared using the standard procedure. White powder. $^1$H NMR (C$_6$D$_6$, 500 MHz): δ=0.92 (t, 3H, —CH$_3$), 1.05-1.35 (m, 20H, (CH$_2$)$_{10}$), 1.97 (s, 3H, —CH$_3$), 3.53 (m, 2H, CH2), 5.74 (s, 1H, NH), 6.80 (d, 2H, o-CH), 6.85 (d, 2H, m-CH), 8.78 (s, 1H, NH); $^{13}$C{$^1$H} (125 MHz, C$_6$D$_6$): δ=14.40 (—CH$_3$), 20.81 (o-CH$_3$), 23.15 (CH$_2$), 27.24 (CH$_2$), 29.36 (CH$_2$), 29.70 (CH$_2$), 29.85 (CH$_2$), 30.00 (CH$_2$), 30.05 (CH$_2$), 30.14 (CH$_2$), 30.16 (CH$_2$), 32.38 (CH$_2$), 45.44 (NCH$_2$), 125.44 (o-C), 130.60 (m-C), 134.95 (p-C), 136.32 (i-C), 181.49 (C(S)); Anal. Calcd for C$_{20}$H$_{34}$N$_2$S: C, 69.52; H, 9.04; N, 12.16. Found: C, 69.65; H, 9.31; N, 12.22. MS (FAB) m/z Calcd for C$_{20}$H$_{35}$N$_2$S+: 335.25. Found: 335.38.

Example 2.1.9. N-(p-methoxyphenyl)-N'-dodecylthiourea (3f)

was prepared using the standard procedure. White powder. $^1$H NMR (C$_6$D$_6$, 500 MHz): δ=0.92 (t, 3H, —CH$_3$), 1.06-1.33 (m, 20H, (CH2)10), 3.19 (s, 3H, —OCH$_3$), 3.55 (m, 2H, —CH$_2$), 5.56 (b, 1H, NH), 6.55 (d, 2H, o-CH), 6.79 (d, 2H, m-CH), 8.24 (b, 1H, NH); $^{13}$C{$^1$H} (125 MHz, C$_6$D$_6$): δ=14.40 (—CH$_3$), 23.15 (CH$_2$), 27.21 (CH$_2$), 29.44 (CH$_2$), 29.70 (CH$_2$), 29.85 (CH$_2$), 30.00 (CH$_2$), 30.05 (CH$_2$), 30.14 (CH$_2$), 30.15 (CH$_2$), 32.37 (CH$_2$), 45.46 (NCH$_2$), 54.98 (—OCH$_3$), 100.37 (i-C), 115.21 (m-C), 127.69 (o-C), 158.82 (p-C), 182.04 (C(S)); Anal. Calcd for C$_{20}$H$_{34}$N$_2$OS: C, 68.52; H, 9.78; N, 7.99. Found: C, 69.44; H, 10.03; N, 8.00. MS (FAB) m/z Calcd for C$_{20}$H$_{35}$N$_2$OS+: 351.25. Found: 351.31.

Example 2.1.10. N-phenyl-N'-hexylthiourea (4)

was prepared using the standard procedure. White powder. $^1$H NMR (C$_6$D$_6$, 500 MHz): δ=0.82 (t, 3H, —CH$_3$), 0.98-1.25 (m, 8H, (CH$_2$)$_4$), 3.46 (b, 2H, NCH$_2$), 5.74 (b, 1H, NH), 6.83 (t, 1H, p-CH), 6.94-6.98 (m, 4H, o-CH & m-CH), 8.97 (b, 1H, NH); $^{13}$C{$^1$H} (125 MHz, C$_6$D$_6$): δ=14.20 (—CH$_3$), 22.89 (CH$_2$), 26.82 (CH$_2$), 29.16 (CH$_2$), 31.72 (CH$_2$), 45.42 (NCH$_2$), 125.02 (o-C), 126.34 (p-C), 129.97 (m-C), 137.62 (i-C), 181.22 (C(S)); Anal. Calcd for C$_{13}$H$_{20}$N$_2$S: C, 66.06; H, 8.53; N, 11.85. Found: C, 66.31; H, 8.80; N, 11.73. MS (FAB) m/z Calcd for C$_{13}$H$_{21}$N$_2$S+: 237.14. Found: 237.27.

Example 2.1.11. N-tert-butyl-N'-dodecylthiourea (5)

was prepared using the standard procedure. White powder. $^1$H NMR (C$_6$D$_6$, 500 MHz): δ=0.92 (t, 3H, —CH$_3$), 1.16-1.44 (m, 29H, (CH$_2$)$_{10}$ & (CH$_3$)$_3$), 3.43 (b, 2H, —CH$_2$), 5.54 (b, 1H, NH), 5.76 (s, 1H, NH); $^{13}$C{$^1$H} (125 MHz, C$_6$D$_6$): δ=14.40 (—CH$_3$), 23.16 (CH$_2$), 27.42 (CH$_2$), 29.44 (—CH$_3$), 29.63 (CH$_2$), 29.82 (CH$_2$), 29.86 (CH$_2$), 30.06 (CH$_2$), 30.10 (CH$_2$), 30.16 (CH$_2$), 30.18 (CH$_2$), 32.38 (CH$_2$), 44.98 (NCH$_2$), 52.70 (NC), 182.47 (C(S)); Anal. Calcd for C$_{17}$H$_{36}$N$_2$S: C, 67.94; H, 12.07; N, 9.32. Found: C, 68.21; H, 11.87; N, 9.25. MS (FAB) m/z Calcd for C$_{17}$H$_{37}$N$_2$S+: 301.27. Found: 301.42.

Example 2.1.12. N-iso-propyl-N'-dodecylthiourea (6)

was prepared using the standard procedure. White powder. $^1$H NMR (C$_6$D$_6$, 500 MHz): δ=0.90-0.96 (m, 9H, —CH$_3$), 1.13-1.40 (m, 20H, (CH$_2$)$_{10}$), 3.26 (b, 2H, —CH$_2$), 4.33 (b, 1H, —CH), 5.20 (b, 1H, NH), 5.38 (b, 1H, NH); $^{13}$C{$^1$H} (125 MHz, C$_6$D$_6$): δ=14.40 (—CH$_3$), 22.64 (—CH$_3$), 23.16 (CH$_2$), 27.36 (CH$_2$), 29.59 (CH$_2$), 29.82 (CH$_2$), 29.86 (CH$_2$), 30.06 (CH$_2$), 30.11 (CH$_2$), 30.16 (CH$_2$), 30.19 (CH$_2$), 32.38 (CH$_2$), 44.36 (NCH), 45.92 (NCH$_2$), 182.14 (C(S)); Anal. Calcd for C$_{16}$H$_{34}$N$_2$S: C, 67.07; H, 11.96; N, 9.78. Found: C, 67.31; H, 11.69; N, 9.82. MS (FAB) m/z Calcd for C$_{16}$H$_{35}$N$_2$S+: 287.53. Found: 287.39.

Example 2.1.13. N-cyclohexyl-N'-dodecylthiourea (7)

was prepared using the standard procedure. Pale yellow powder. 1H NMR (C$_6$D$_6$, 500 MHz): δ=0.93 (t, 3H, —CH$_3$), 1.01-1.63 (m, 28H, (CH$_2$)$_{10}$ & 2,3,5,6-CH$_2$), 2.09 (d, 2H, 4-CH$_2$), 3.48 (b, 2H, —CH$_2$), 4.30 (b, 1H, NH), 6.22 (b, 1H, NH), 6.43 (s, 1H, 1-CH); $^{13}$C{$^1$H} (125 MHz, C$_6$D$_6$): δ=14.41 (—CH$_3$), 23.16 (CH$_2$), 27.41 (CH$_2$), 29.43 (CH$_2$), 29.63 (CH$_2$), 29.82 (CH$_2$), 29.86 (CH$_2$), 30.06 (CH$_2$), 30.10 (CH$_2$), 30.16 (CH$_2$), 30.18 (CH$_2$), 32.38 (CH$_2$), 44.98

(NCH$_2$), 52.69 (NCH), 182.48 (C(S)); Anal. Calcd for C$_{19}$H$_{38}$N$_2$S: C, 69.88; H, 11.73; N, 8.58. Found: C, 69.78; H, 11.46; N, 8.33. MS (FAB) m/z Calcd for C$_{19}$H$_{39}$N$_2$S+: 327.28. Found: 327.43.

Example 2.1.14. N-n-hexyl-N'-dodecylthiourea (8)

was prepared using the standard procedure. White powder. $^1$H NMR (C$_6$D$_6$, 500 MHz): δ=0.88 (t, 3H, —CH$_3$), 0.93 (t, 3H, —CH$_3$), 1.11-1.40 (m, 28H, (CH$_2$)$_{10}$ & (CH$_2$)$_4$), 3.26 (b, 4H, —CH$_2$), 5.43 (b, 2H, NH); $^{13}$C{$^1$H} (125 MHz, C$_6$D$_6$): δ=14.27 (—CH$_3$), 14.40 (—CH$_3$), 22.99 (CH$_2$), 23.16 (CH$_2$), 26.97 (CH$_2$), 27.36 (CH$_2$), 29.51 (CH$_2$), 29.60 (CH$_2$), 29.84 (CH$_2$), 29.87 (CH$_2$), 30.08 (CH$_2$), 30.13 (CH$_2$), 30.17 (CH$_2$), 30.20 (CH$_2$), 31.90 (CH2), 32.38 (CH$_2$), 44.46 (NCH$_2$), 44.50 (NCH$_2$), 183.02 (C(S)); Anal. Calcd for C$_{19}$H$_{40}$N$_2$S: C, 69.45; H, 12.27; N, 8.53. Found: C, 69.65; H, 12.09; N, 8.49. MS (FAB) m/z Calcd for C$_{19}$H$_{41}$N$_2$S+: 329.30. Found: 329.44.

Example 2.1.15. N-n-hexyl-N',N'-di-n-butylthiourea (9)

was prepared using the standard procedure. Pale yellow oil. 1H NMR (C$_6$D$_6$, 500 MHz): δ=0.82 (t, 6H, —CH$_3$), 0.86 (t, 3H, —CH$_3$), 1.08-1.26 (m, 10H, (CH$_2$)$_5$), 1.40-1.52 (m, 6H, CH$_2$), 3.34 (t, 4H, N(CH$_2$)$_2$), 3.73 (q, 2H, NCH$_2$), 4.97 (b, 1H, NH); $^{13}$C{$^1$H} (125 MHz, C$_6$D$_6$): δ=14.13 (—CH$_3$), 14.26 (—CH$_3$), 20.52 (CH$_2$), 23.06 (CH$_2$), 27.14 (CH$_2$), 29.89 (CH$_2$), 30.09 (CH$_2$), 31.98 (CH$_2$), 46.28 (NCH$_2$), 50.89 (N(CH$_2$)$_2$), 182.12 (C(S)); Anal. Calcd for C$_{15}$H$_{32}$N$_2$S: C, 66.12; H, 11.84; N, 10.28. Found: C, 66.07; H, 11.57; N, 10.34. MS (FAB) m/z Calcd for C$_{15}$H$_{33}$N$_2$S+: 273.24. Found: 273.30.

Example 2.1.16. N-n-hexyl-N',N'-di-n-octylthiourea (10)

was prepared using the standard procedure. Pale yellow oil. 1H NMR (C$_6$D$_6$, 500 MHz): δ=0.87 (t, 3H, —CH$_3$), 0.91 (t, 6H, —CH$_3$), 1.15-1.33 (m, 26H, (CH$_2$)$_5$ & (CH$_2$)$_3$), 1.49-1.59 (m, 6H, CH$_2$), 3.44 (t, 4H, N(CH$_2$)$_2$), 3.75 (q, 2H, NCH$_2$), 5.13 (b, 1H, NH); $^{13}$C{$^1$H} (125 MHz, C$_6$D$_6$): δ=14.26 (—CH$_3$), 14.38 (—CH$_3$), 23.05 (CH$_2$), 23.10 (CH$_2$), 27.16 (CH$_2$), 27.40 (CH$_2$), 28.05 (CH$_2$), 29.70 (CH$_2$), 29.84 (CH$_2$), 29.90 (CH$_2$), 31.99 (CH$_2$), 32.25 (CH$_2$), 46.29 (NCH$_2$), 51.22 (N(CH$_2$)$_2$), 182.26 (C(S)); Anal. Calcd for C$_{23}$H$_{48}$N$_2$S: C, 71.81; H, 12.58; N, 7.28. Found: C, 72.06; H, 12.44; N, 7.33. MS (FAB) m/z Calcd for C$_{23}$H$_{49}$N$_2$S+: 385.36. Found: 385.30.

Example 2.1.17. N-phenyl-N',N'-di-n-butylthiourea (11)

was prepared using the standard procedure. White powder. 1H NMR (C$_6$D$_6$, 500 MHz): δ=0.67 (t, 6H, —CH$_3$), 0.96 (m, 4H, CH$_2$), 1.31 (m, 4H, CH$_2$), 3.21 (t, 4H, N(CH$_2$)$_2$), 6.54 (b, 1H, NH), 6.82 (t, 1H, p-CH), 7.01 (t, 2H, m-CH), 7.21 (d, 2H, o-CH); $^{13}$C{$^1$H} (125 MHz, C$_6$D$_6$): δ=13.62 (—CH$_3$), 20.05 (CH$_2$), 29.50 (CH$_2$), 51.03 (NCH$_2$), 124.46 (o-CH), 124.65 (p-CH), 128.42 (m-CH), 140.68 (i-C), 182.03 (C(S)); Anal. Calcd for C$_{15}$H$_{24}$N$_2$S: C, 68.13; H, 9.15; N, 10.59. Found: C, 67.95; H, 8.85; N, 10.55. MS (FAB) m/z Calcd for C$_{15}$H$_{25}$N$_2$S+: 265.17. Found: 265.24.

Example 2.2. Synthesis of Lead Oleate (Pb(Oleate)2) from Lead Trifluoroacetate

Figure 5:
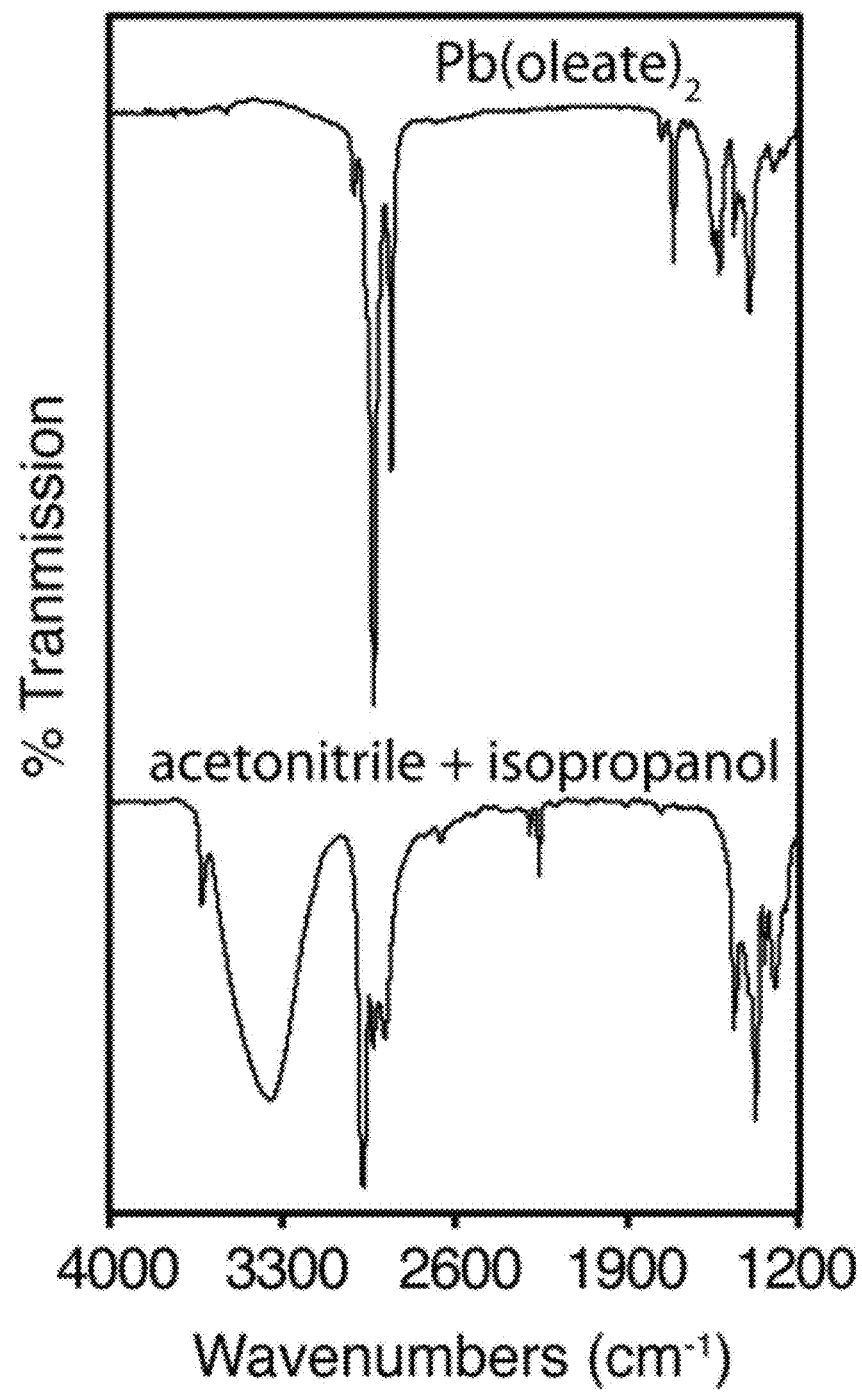
FIG. 5 shows infrared spectra of lead oleate from lead trifluoroacetate. FT-IR spectra were acquired with a liquid cell by dissolving the compounds in tetrachloroethylene. The top spectrum shows the FT-IR of lead oleate, with no obvious peaks from water or lead hydroxide (3700-3100 $cm^{-1}$), or the solvents used during the synthesis (bottom spectrum).

Lead (II) oxide (10.00 g, 44.8 mmol) and acetonitrile (20 mL) were added to a 100 mL round bottom flask. The suspension was stirred while being cooled in an ice bath for ten minutes, after which trifluoroacetic acid (0.7 mL, 8.96 mmol, 0.2 equiv.) and trifluoroacetic anhydride (6.2 mL, 44.8 mmol, 1 equiv.) were added. After fifteen minutes the yellow lead oxide had dissolved, resulting in a clear and colorless solution that was allowed to warm to room temperature. To a 500 mL Erlenmeyer flask, oleic acid (25.437 g, 90.05 mmol, 2.01 equiv.), isopropanol (180 mL), and triethylamine (10.246 g, 101.25 mmol, 2.26 equiv.) were added. The lead trifluoroacetate solution was then added to the oleic acid solution with stirring, resulting in the formation of a white precipitate. The mixture was heated to reflux in order to dissolve the precipitate whereupon a clear and colorless solution was obtained. The heat was then turned off and the flask allowed to slowly cool to room temperature over >2 hours, followed by further cooling in a −20° C. freezer for >2 hours. The resulting white powder was isolated by suction filtration using a glass fritted funnel, the filtrate thoroughly washed with methanol (3×300 mL) being careful to thoroughly stir the slurry to break up any large pieces, and then dried under vacuum for >6 hours. The free flowing white powder was stored in a nitrogen-filled glovebox. Typical yields were 31.1 g-32.8 g (90-95%). This reaction can be run at three times the scale described with no observable changes. $^1$H NMR (C$_6$D$_6$, 500 MHz) δ=0.95 (t, $^3J_{H-H}$=6.8 Hz, 6H), 1.27-1.58 (m, 40H, (CH$_2$)$_6$ and (CH$_2$)$_4$), 1.89 (m, 4H, COCH$_2$CH$_2$), 2.19 (m, 8H, =CHCH$_2$), 2.53 (t, $^3J_{H-H}$=7.7 Hz, 4H, COCH$_2$), 5.56 (m, 4H, =CH—); $^{13}$C NMR (C$_6$D$_6$, 125 MHz) δ=14.43 (CH$_3$), 23.20 (CH$_2$CH$_3$), 26.31 (COCH$_2$CH$_2$), 27.86 (=CHCH$_2$—), 27.95 (=CHCH$_2$—), 29.89 (CH$_2$), 29.91 (CH$_2$), 30.14 (CH$_2$), 30.36 (CH$_2$), 30.38 (CH$_2$), 30.58 (CH$_2$), 32.43 (CH$_2$), 40.04 (COCH$_2$), 130.17 (=CH—), 130.36 (=CH—), 184.22 (OOC); IR (liquid cell in tetrachloroethylene): 1304.79, 1401.77, 1466.38, 1524.19, 1549.93, 1710.59, 1761.22, 2854.97, 2927.3, 3006.15 cm$^{-1}$ (see FIG. 5). Anal. Calcd. For PbO$_4$C$_{36}$H$_{66}$: C, 56.15; H, 8.64; N, 0.0. Found: C, 56.07; H, 8.44; N, <0.02. Residual trifluoroacetate content may be measured by $^{19}$F NMR relative to a C$_6$F$_6$ internal standard (10 μL); typical residual trifluoroacetate content ≤0.1% by mass and may be further reduced by recrystallization from hot isopropanol.

Example 2.2.1. Synthesis of Lead Oleate (Pb(Oleate)2) from Lead Nitrate

Sodium hydroxide (1.800 g, 45 mmol, 2.25 equiv.) was dissolved in methanol (1 L). Oleic acid (12.710 g, 45 mmol, 2.25 equiv.) was slowly added to this solution. A solution of lead (II) nitrate (6.624 g, 20 mmol, 1.0 equiv.) in methanol (250 mL) was then added, the mixture heated until a clear solution was obtained, and the heat and stirring were turned off. After cooling to room temperature, the solution was decanted to remove any insoluble residue, and stored in a 5° C. refrigerator overnight during which time a white powder precipitated. The resulting white powder was isolated by suction filtration, the filtrate thoroughly washed with methanol (3×300 mL), and then dried under vacuum for >6 hours. The fluffy white powder was stored in a nitrogen-filled glovebox. Typical yields were 3.9 g-7.8 g (25-50%). $^1$H NMR (C$_6$D$_6$, 500 MHz) δ=0.93 (t, 3JH-H=7 Hz, 6H), 1.25-1.46 (m, 40H, (CH$_2$)$_6$ and (CH2)4), 1.74 (m, 4H, COCH$_2$CH$_2$), 2.14 (m, 8H, =CHCH$_2$), 2.34 (t, 3JH-H=8 Hz, 4H, COCH$_2$), 5.53 (m, 4H, =CH—); $^{13}$C NMR (C$_6$D$_6$, 125 MHz) δ=14.40 (CH$_3$), 23.15 (CH$_2$CH$_3$), 25.99 (COCH$_2$CH$_2$), 27.79 (=CHCH$_2$—), 27.80 (=CHCH$_2$—), 29.81 (CH$_2$), 29.82 (CH$_2$), 29.99 (CH$_2$), 30.05 (CH$_2$), 30.31

(CH$_2$), 30.35 (CH$_2$), 32.36 (CH$_2$), 38.62 (COCH$_2$), 130.19 (=CH—), 130.33 (=CH—), 182.77 (OOC); IR (DRIFTS): 1311.74, 1345.74, 1404.69, 1425.94, 1468.73, 1486.83, 1657.51, 2826.85, 2850.8, 2871.97, 2918.77, 2952.2, 3003.73 cm$^{-1}$; Anal. Calcd. For PbO$_4$C$_{36}$H$_{66}$: C, 56.15; H, 8.64; N, 0.0. Found: C, 55.96; H, 8.87; N, <0.02.

This reaction was also run at double the scale described with no observable changes. No noticeable difference in reactivity was observed between lead oleate from lead trifluoroacetate or from lead nitrate, however the procedure using lead trifluoroacetate was strongly preferred because of the availability of higher purity PbO, smaller reaction volumes, and greater yields.

Example 2.3. Syntheses of Thiocarbonate Precursors

A library of substituted thiocarbonate precursors were also obtained from thiocarbonyl starting materials such as thiocarbonyl diimidazole, and other thiophosgene derivatives according to Scheme 1. The thiocarbonates were used to produce CdS nanocrystals with exceptionally narrow fluorescence properties (See FIG. 2(C)(D), 10-13). Note that the presence of more electron withdrawing groups in the aryl thiocarbonates leads to a decrease in reactivity (4-Me O-Ph->Ph>4-CF$_3$-Ph-).

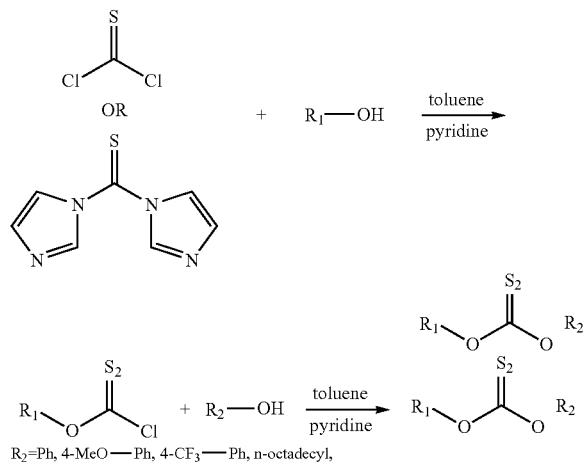

Scheme 1

R$_2$=Ph, 4-MeO—Ph, 4-CF$_3$—Ph, n-octadecyl,

Example 3. Synthesis and Characterization of Nanocrystals

Example 3.1. Synthesis of PbS Nanocrystals

Figure 6:
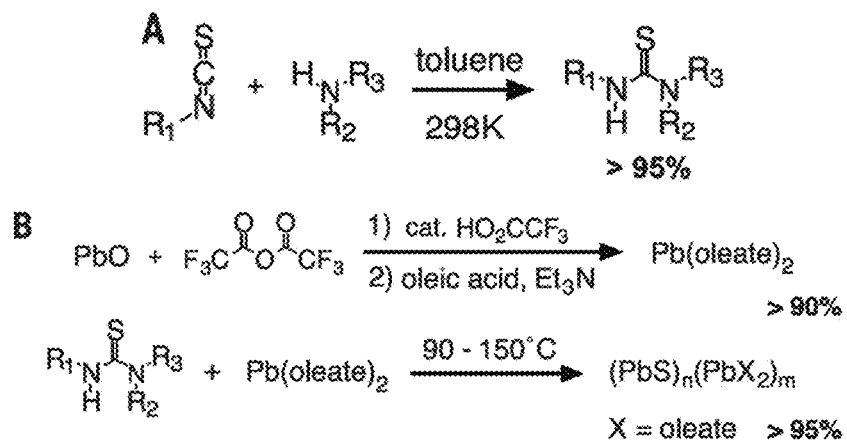
FIG. 6 shows at least part of the library of thioureas that have been accessed in a single step and used to prepare PbS nanocrystals with highly reproducible control over the final size. (A) Synthesis of substituted thiourea precursors. (B) Synthesis of lead oleate from lead oxide and synthesis of PbS nanocrystals from substituted thioureas and lead oleate. Et, ethyl group. (C) Table of substituted thiourea precursor structures. Me=methyl; Ph=phenyl. (D) Ultraviolet-visible-near-infrared (UV-Vis-NIR) absorption spectra of PbS nanocrystals synthesized using substituted thioureas: 1 and 2 (95° C.); 3b, c, d, and f (120° C.); 6 and 8 (150° C.). a.u., arbitrary units.
Figure 6:
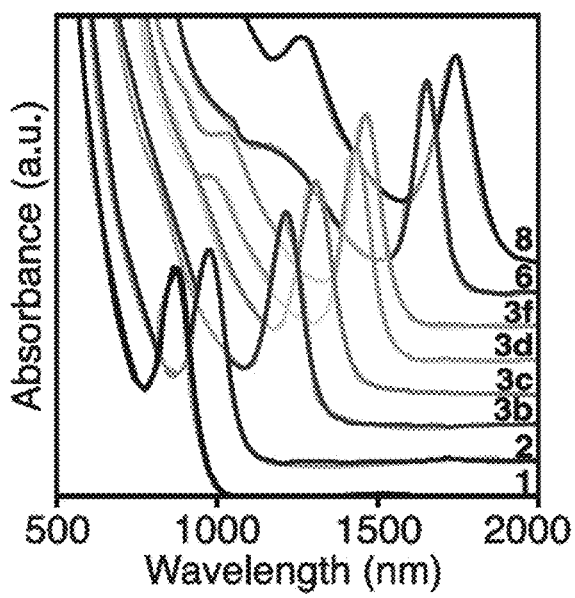
Figure 7:
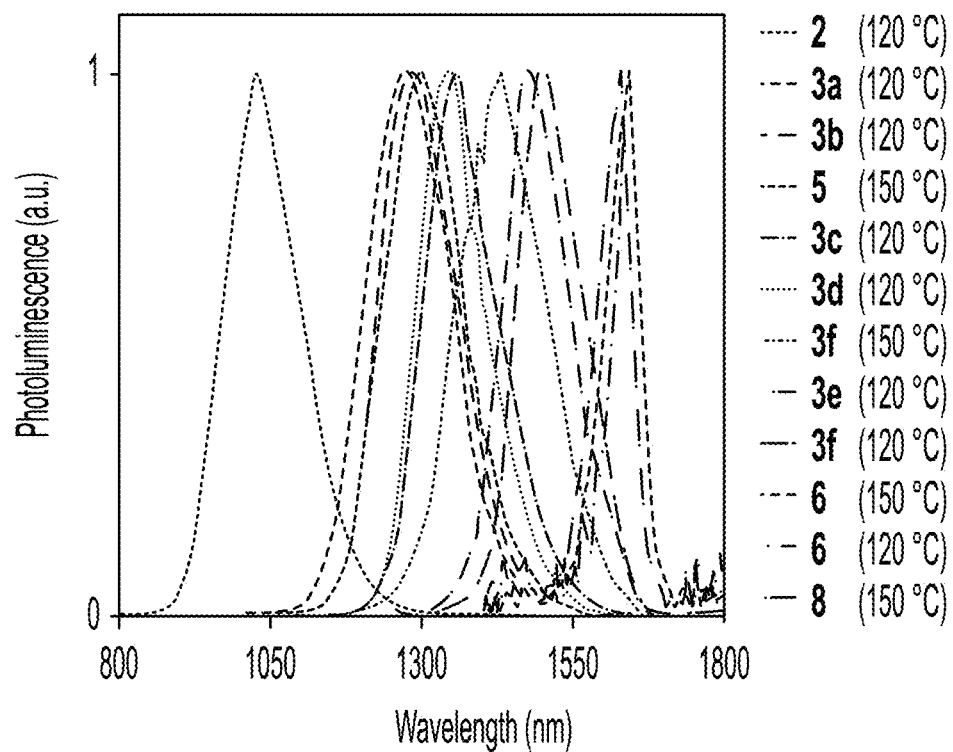
FIG. 7 shows representative photoluminescence spectra of PbS nanocrystals. See Example 3.1.
Figure 8:
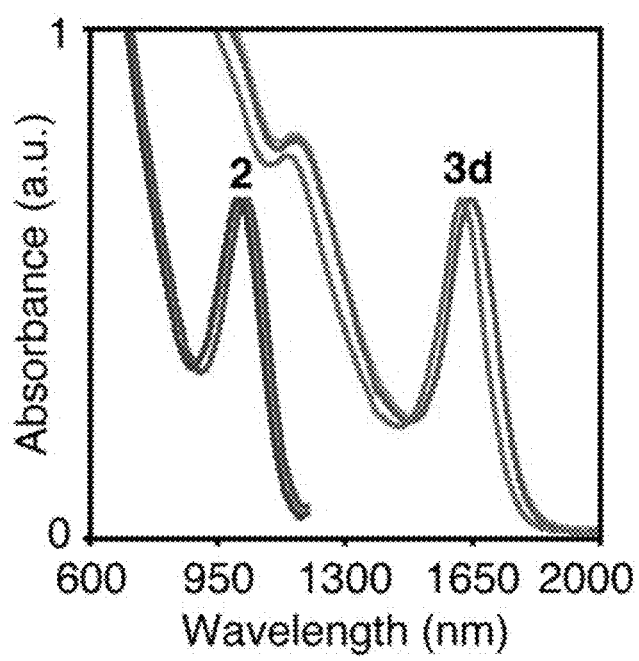
FIG. 8 shows absorbance spectra of PbS crystals derived from large-scale PbS synthesis. See Example 3.3.

In a nitrogen-filled glovebox, lead oleate (1-2: 231.0 mg, 0.30 mmol, 1.5 equiv.; 3a-3f, 5-8: 184.8 mg, 0.24 mmol, 1.2 equiv.) and hexadecane (7.344 g, 9.5 mL) were added to a 40 mL vial equipped with a stir bar and sealed with a rubber septum. The vial was removed from the glovebox, and the septum pierced with an argon inlet needle and submerged in an oil bath at the desired temperature (1-2: 95° C.; 3a-3f, 5: 120° C.; 3f, 5-8: 150° C.). Separately, the thiourea (0.30 mmol) was dissolved in diphenyl ether (0.805 g, 0.75 mL) by heating the mixture in the same oil bath. After reaching thermal equilibrium (10 minutes) the thiourea solution (500 µL, 0.20 mmol, 1.0 equiv.) was injected into the lead oleate solution. An aliquot (125 µL) was removed after 5 minutes from reactions at 95° C. and after 20 minutes from reactions at 120 or 150° C. The aliquot was dissolved in tetrachloroethylene (2.35 mL) for absorption and photoluminescence spectroscopies. FIGS. 6, 7, and 8 illustrate the UV-Vis-NIR absorbance and photoluminescence spectra of the PbS nanocrystals.

FIG. 7 shows photoluminescence spectra of PbS nanocrystals. Photoluminescence measurements were conducted using excitation from a 6-picosecond supercontinuum laser. After spectral filtering, the excitation light (590±10 nm, <25 nJ cm$^{-2}$ per pulse) was focused onto a dilute solution of nanocrystals. The emission was collected using reflective optics, dispersed by a ⅓-meter spectrometer, and detected with an InGaAs photodiode and lock-in amplifier. The grating angle was scanned to acquire spectra. All yields and spectra were corrected for grating and detector efficiency, and the measurements were conducted under inert atmosphere with weak excitation and stirring to prevent experimental artifacts due to oxidation, multiple excitation, and photocharging.

Example 3.2. Large-Scale Synthesis of 3.4 nm PbS Nanocrystals

In a nitrogen-filled glove box, lead oleate (8.812 g, 11.44 mmol, 1.5 equiv) and 1-octene (105.5 g, 147.5 mL) were added to a 250 mL 3-neck round bottom flask equipped with a stir bar, the flask sealed with two rubber septa and an air-free vacuum adapter. In a 20 mL scintillation vial, N,N'-diphenylthiourea (1.742 g, 7.63 mmol) and diglyme (5 mL) were mixed and the vial sealed with a rubber septum. Both vessels were transferred to a Schlenk line where they were attached to an argon inlet and brought to 95° C. in an oil bath. After the temperature of the reaction vessel was stable (15 minutes), the solution of thiourea was quickly injected into the clear colorless solution. The stirring was vigorous and the injection completed prior to the darkening of the mixture (<1 second). Simultaneous injection using two syringes was helpful. The reaction was allowed to run for 60 seconds before the flask was removed from the hot oil bath. Once cooled to room temperature, the septa were replaced with glass stoppers under positive argon flow and the volatiles removed under vacuum. The flask was sealed under vacuum and brought into a glove box whereupon toluene (40 mL) was added. The resulting slurry was split between four 50 mL centrifuge tubes and centrifuged (7000 rpm, 10 minutes). The dark nanocrystal solution was decanted and any remaining solids discarded. Methyl acetate (120 mL) was then added to the toluene solution to precipitate the nanocrystals. After centrifugation (7000 rpm, 10 minutes), the clear, pale brown solution was discarded and the remaining nanocrystal residue redissolved in toluene (40 mL). The cycle of precipitation from toluene with methyl acetate was performed six times in total to reach a ligand coverage of 5.7 oleate ligands per square nanometer as measured by UV-Visible-NIR absorption and $^1$H NMR spectroscopy. Yield of (PbS)(Pb(oleate)$_2$)$_{0.26}$: 2.67 g (79.5%). Commercially available anhydrous octane (b.p.=125-126° C.) was also successfully used in place of 1-octene.

Example 3.3. Large-Scale Synthesis of 6.5 nm PbS Nanocrystals

In a nitrogen-filled glove box, lead oleate (14.099 g, 22.88 mmol, 1.2 equiv) and 1-octene (105.5 g, 147.5 mL) were added to a 250 mL 3-neck round bottom flask equipped with a stir bar, that was then sealed with two rubber septa and an air-free vacuum adapter. In a 20 mL scintillation vial, N-dodecyl-N'-phenylthiourea (4.890 g, 15.26 mmol) and diglyme (5 mL) were mixed and the vial sealed with a rubber septum. Both vessels were transferred to a Schlenk line where they were attached to an Argon inlet and brought to 120° C. in an oil bath. Once the temperature was stable (15 minutes), the solution of thiourea was quickly injected into the clear colorless solution. Simultaneous injection using two syringes was helpful. The reaction was allowed to run for 10 minutes before the flask was removed from the oil bath. Once cooled to room temperature, the septa were replaced with glass stoppers under positive argon flow and the volatiles removed under vacuum. The flask was then sealed under vacuum and brought into a nitrogen glovebox. Toluene (60 mL) was added and the resulting slurry split between six 50 mL centrifuge tubes and centrifuged (7000 rpm, 10 minutes). The dark nanocrystal solution was decanted and any remaining solids discarded. Methyl acetate (180 mL) was then added to the toluene solution to precipitate the nanocrystals. After centrifugation (7000 rpm, 10 minutes), the clear, pale brown solution was discarded and the remaining nanocrystal residue redissolved in toluene. The cycle of precipitation from toluene with methyl acetate was performed six times in total to reach a ligand coverage of 2.9 oleate ligands per square nanometer as measured by UV-Visible-NIR absorption and $^1$H NMR spectroscopy. Commercially available anhydrous octane (b.p.=125-126° C.) could also be used in place of 1-octene.

Figure 9:
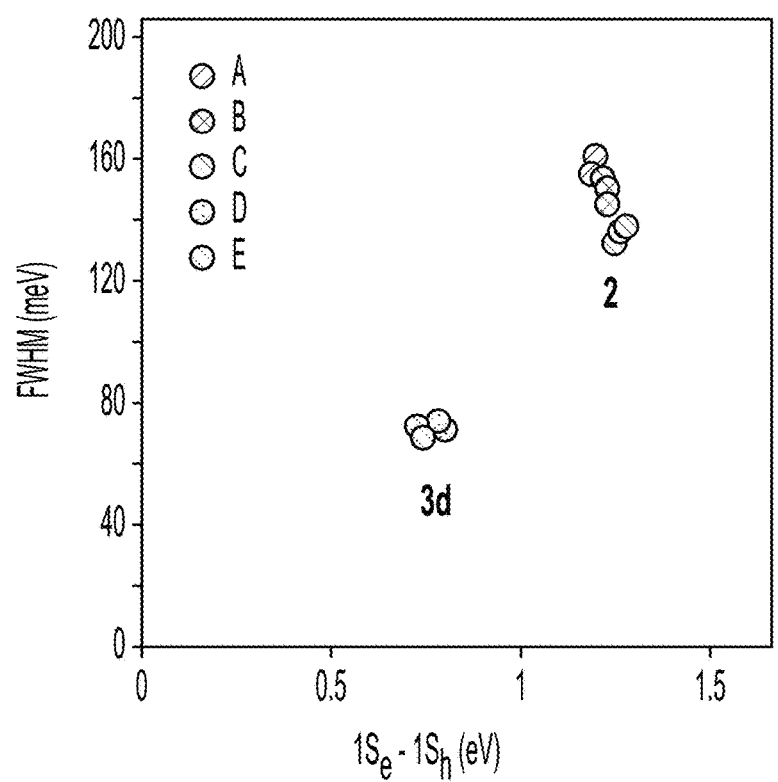
FIG. 9 shows reaction conditions for reproducibility study. See Example 3.3.

FIG. 8 show the absorbance spectra used for the reproducibility study obtained from independent reactions, the results of which are shown in FIG. 9. Reactions were run as described for large-scale synthesis of 3.4 nm PbS nanocrystals with N,N'-diphenylthiourea (2) and for large-scale synthesis of 6.5 nm PbS nanocrystals with N-phenyl-N'-n-dodecylthiourea (3d). Each synthesis was run using a different batch of lead oleate. In FIG. 9, each dot represents data from an absorbance spectrum obtained from an independent reaction. Reactions were run as described for large-scale synthesis of 3.4 nm PbS nanocrystals with N,N'-diphenylthiourea (2) and for large-scale synthesis of 6.5 nm PbS nanocrystals with N-phenyl-N'-n-dodecylthiourea (3d), with the following adjustments: A: ran as described for 3.4 nm PbS nanocrystals; B: 1/15 scale and thiourea concentration reduced by half resulting in 75 mM Pb(oleate)2 and 25 mM 3d; C: 1/15 scale; D: 1/15 scale; E: ran as described for 6.5 nm PbS nanocrystals.

Figure 10:
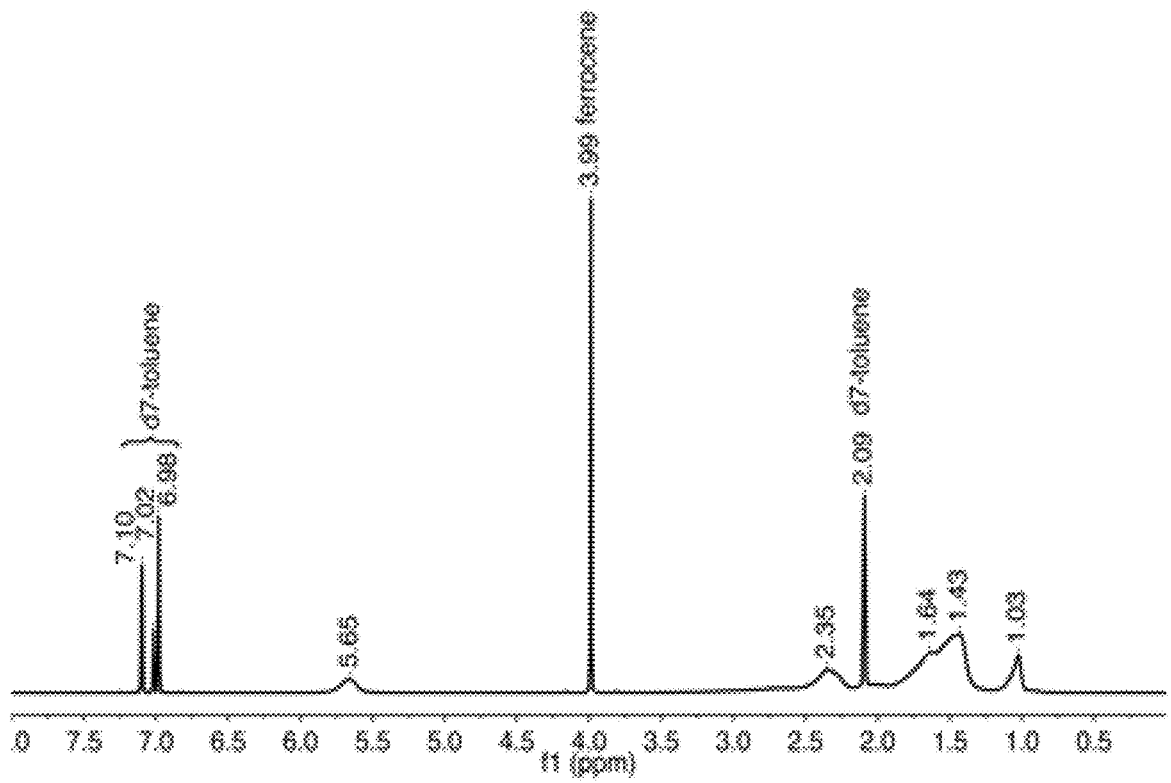
FIG. 10 shows an exemplary $^1H$ nuclear magnetic resonance spectrum of isolated PbS nanocrystals. The lead sulfide nanocrystals were isolated from a large-scale reaction. The broad peak at 5.65 ppm indicates surface-bound lead oleate complexes. See Example 3.3.

FIG. 10 shows an exemplary $^1$H nuclear magnetic resonance spectrum of lead sulfide nanocrystals were isolated from a large-scale reaction. The broad peak at 5.65 ppm indicates surface-bound lead oleate complexes. The concentrations of oleate, PbS, and nanocrystals were determined by a combination of $^1$H NMR and UV-Vis-NIR absorption spectroscopies. A toluene solution of purified nanocrystals was dried under vacuum and dissolved in d8-toluene. Ferrocene dissolved in d8-toluene (100 µL, 51 mM) was added to a known volume of the nanocrystal stock solution and used as an internal standard for $^1$H NMR. The concentration of ligands was determined relative to the ferrocene internal standard by integrating the ligand vinyl and ferrocene resonances and normalizing for the number of hydrogens, respectively (2:10). 1H NMR spectra were acquired with sufficient relaxation delay to allow complete relaxation between pulses (30 s). The molar concentration of PbS in these stock solutions was determined by diluting 10-50 µL to a known volume with tetrachloroethylene and measuring the absorbance at λ=400 nm. At this wavelength, the extinction coefficient was independent of size and proportional to the concentration of PbS formula units. The wavelength of the lowest energy absorption maximum was used to determine the average nanocrystal diameter. From this diameter, the number of PbS units per nanocrystal were calculated by assuming a spherical shape and the molar volume of the bulk. The concentration of nanocrystals, the ratio of ligands per nanocrystal, and the ligand surface density were calculated from the number of PbS units per nanocrystal, the molar concentration of PbS, and ligands in the stock solution.

Figure 11:
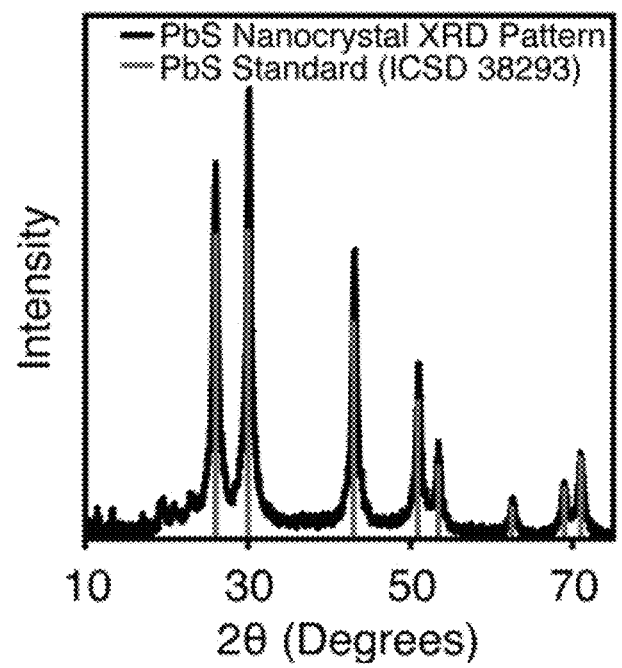
FIG. 11 shows an exemplary powder X-ray diffraction (PXRD) patterns of (A) PbS nanocrystals (Example 3.3) and (B) PbSe nanocrystals (Example 3.4) prepared by the inventive methods described herein. The PbSe nanocrystals (d=5.6 nm) were synthesized from N,N-diallyl-N'-butylselenourea and lead oleate. In both cases, an exponential function has been applied to the nanocrystal pattern in order to remove scattering at low angles.
Figure 11:
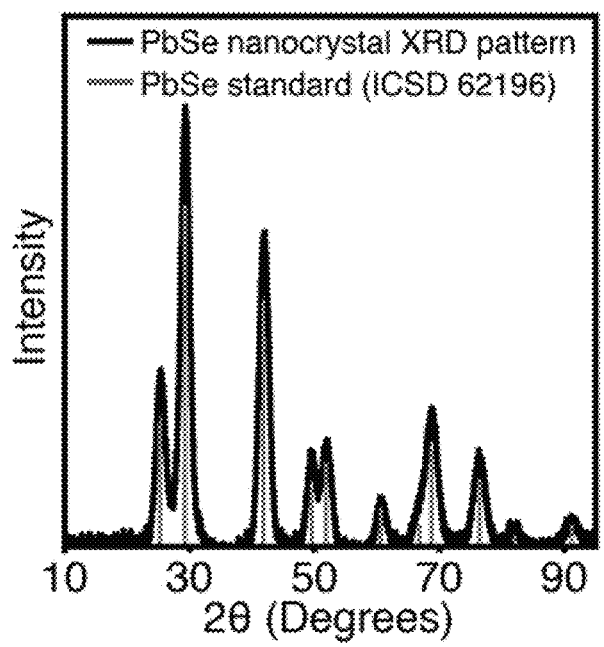

FIG. 11(A) show a powder X-ray diffraction (PXRD) pattern of PbS nanocrystals isolated from a reaction under conditions similar to those described for the large-scale synthesis of 6.5 nm PbS nanocrystals, but the scale was doubled and diphenyl ether was used as the injection solvent rather than diglyme. An exponential baseline correction was applied to the data to remove signal from scattering. The bar graph spectrum PbS standard was obtained from the International Crystallographic Structure Database (ICSD) as coll. code 38293.

Example 3.4. Cadmium Sulfide Nanocrystals

Figure 12:
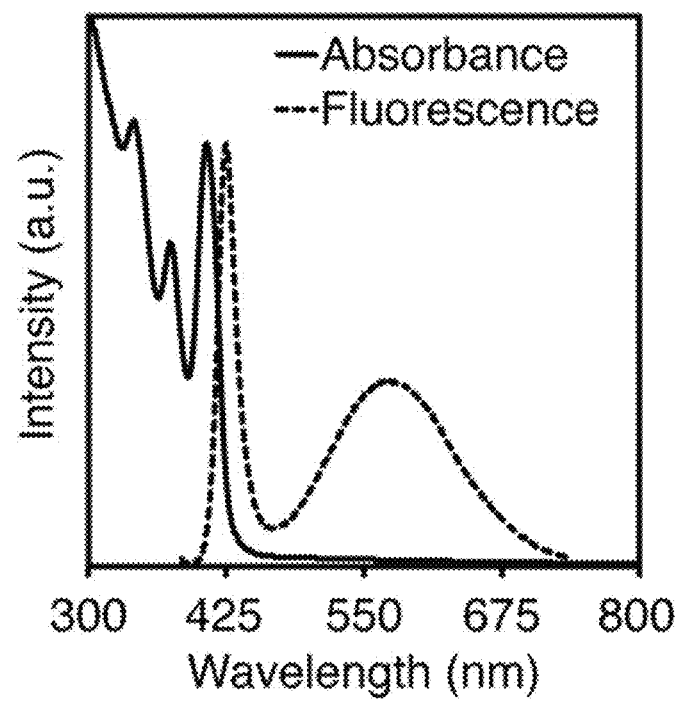
FIG. 12 shows UV-Visible absorption (solid line) and photoluminescence (dashed line) spectra from cadmium sulfide nanocrystals. See Example 3.4.

In a nitrogen-filled glovebox, cadmium tetradecanoate (136 mg, 0.24 mmol, 1.2 equiv.) and hexadecane (7.344 g, 9.5 mL) were added to a vial loaded with a stir bar and sealed with a rubber septum. The vial was removed from the glovebox, the septum pierced with an argon inlet needle and submerged in an oil bath heated to 160° C. Separately, N-n-hexyl-N',N'-di-n-butylthiourea (9) (54.5 mg, 0.2 mmol, 1.0 equiv.) was dissolved in diphenyl ether (0.537 g, 0.5 mL) by heating the mixture in the same oil bath. After both solutions reach thermal equilibrium (10 minutes), the thiourea solution was injected into the cadmium tetradecanoate solution and a timer started. After one hour the temperature was increased to 200° C. at an average rate of 2° C. min$^{-1}$. The reaction was held at 200° C. for another 3.67 hours (for a full reaction time of 5 hours) and an aliquot was removed and dissolved in toluene for absorption and photoluminescence analysis. See FIG. 12.

FIG. 11(B) shows the powder X-ray diffraction pattern of PbSe nanocrystals (d=5.6 nm) synthesized from N,N-dialyl-N'-butylselenourea and lead oleate, compared to a PbSe standard. An exponential function was been applied to the nanocrystal pattern in order to remove scattering at low angles Additionally, CdS nanocrystals were synthesized from cadmium carboxylate and N,N,N'-trialkyl substituted thioureas at intermediate temperatures (200-240° C.) on multi-gram scales.

Example 3.5. Zinc Sulfide Nanocrystals

Figure 13:
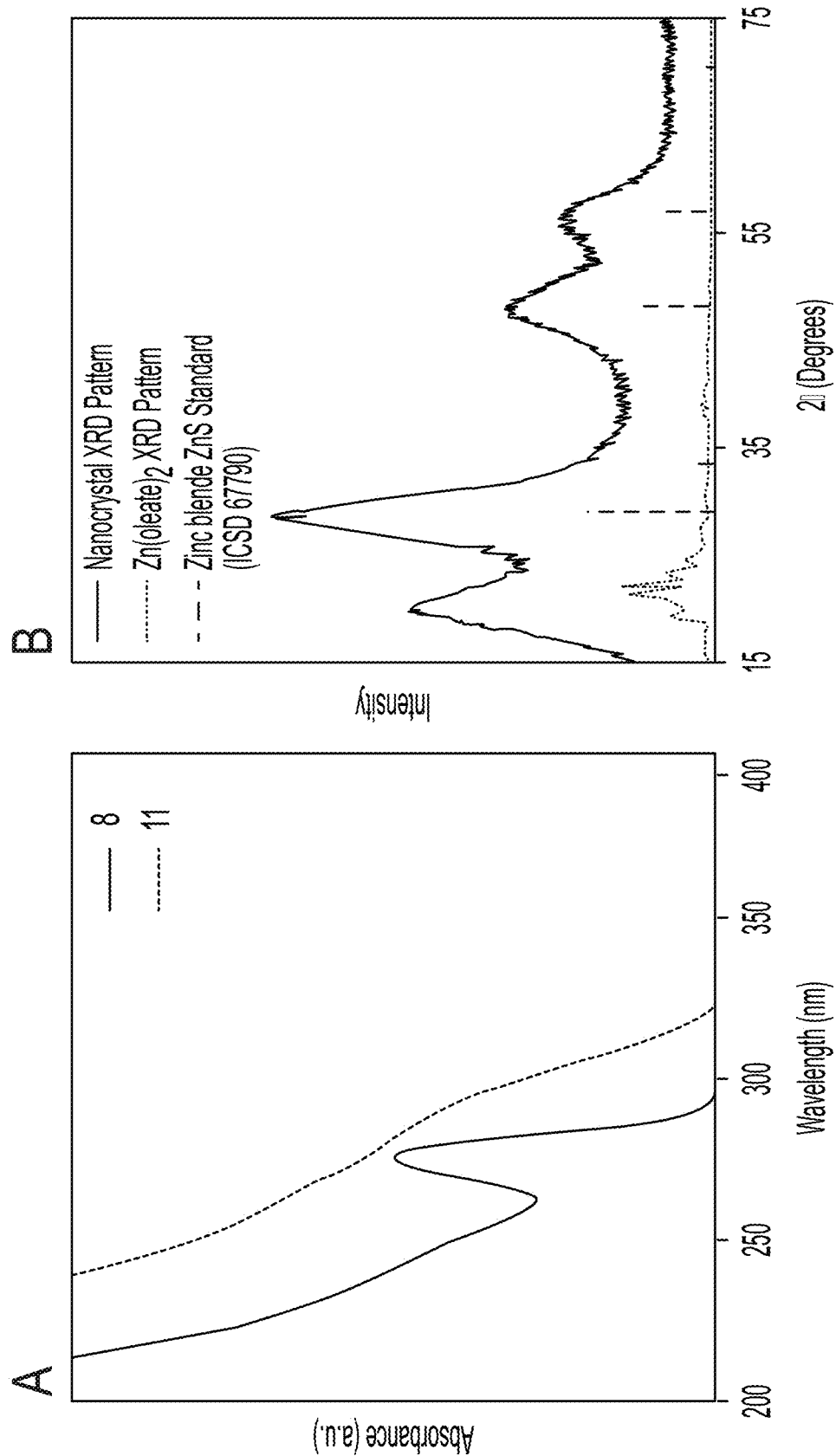
FIG. 13 shows (A) UV-Vis absorption spectrum of ZnS nanocrystals synthesized from N-hexyl-N'-dodecylthiourea (8) and N-phenyl-N',N'-di-n-butylthiourea (11). (B) Powder X-ray diffraction pattern of ZnS nanocrystals after isolation as described below. An exponential baseline correction was applied to the data to remove signal from scattering. The peak at 20° is attributed to zinc oleate associated with nanocrystals. The ZnS standard was obtained from International Crystallographic Structure Database (ICSD) as coll. Code 67790, (C) Transmission electron micrograph of ZnS nanocrystals synthesized from N-hexyl-N'-dodecylthiourea (8) with a measured diameter of 1.8+0.2 nm (D) Transmission electron micrograph of ZnS nanocrystals synthesized from N-phenyl-N',N'-di-n-butylthiourea (11) with a measured diameter of 2.5±0.4 nm (E) $^1$H NMR. Spectrum of isolated ZnS nanocrystals. (*) Sharp signal at δ=4.0 is a reference ferrocene internal standard. See Example 3.5.

In a nitrogen-filled glovebox, zinc oleate (188.5 mg, 0.30 mmol, 1.5 equiv) and octadecene (9.5 mL) were loaded into a 3-neck round bottom flask equipped with a rubber septum, Schlenk adapter, and thermocouple adapter. The desired thiourea (0.20 mmol) and tetraglyme (0.5 mL) were loaded into a vial and sealed with a septum. Both vessels were transferred to a Schlenk line. The zinc oleate solution was heated to 240° C. and the thiourea solution was heated to 100° C. Once both temperatures stabilized, the thiourea solution was rapidly injected into the zinc oleate solution. After 5 minutes of stirring at 240° C., the flask was allowed to cool to room temperature. Acetone (30 mL) was added to the reaction mixture to induce precipitation. This mixture was centrifuged (7000 rpm, 15 minutes) and the clear supernatant was discarded. The remaining residue was dissolved in hexane (1 mL), precipitated with acetone (14 mL), and centrifuged (7000 rpm, 15 minutes). This procedure was repeated twice more, and the resulting white solid was dissolved in hexane for analysis. This reaction may be run at 2.5 times the concentration and twice the scale written above with little noticeable difference. The ratio of zinc oleate and ZnS in the product can estimated by dissolving a known mass of purified and dried nanocrystals in d6-benzene (500 µL) with a ferrocene standard and measuring the ratio of the vinyl and ferrocene resonances. $^1$H NMR spectra were acquired with sufficient relaxation delay to allow complete relaxation between pulses (30 s). From the measured zinc oleate concentration, a mass fraction of the sample due to zinc oleate may be calculated and subtracted from the total sample mass. Assuming ZnS was the only other chemical species present in the sample, a molar ratio of zinc oleate to zinc sulfide, and therefore zinc to sulfur, may be estimated: Zn:S=1.6±0.2. This near starting Zn:S ratio of the precursors of 1.5 to 1. See FIG. 13 for additional information.

Example 3.6. CdSe/CdS/ZnS Core/Shell/Shell Nanostructures

Figure 14:
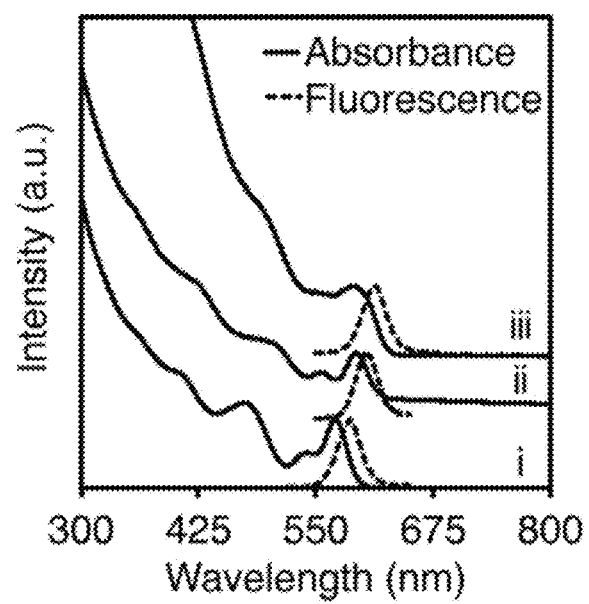
FIG. 14 shows UV-Vis absorbance and photoluminescence spectra of (i) CdSe cores, (ii) CdSe/CdS core/shell heterostructures, and (iii) CdSe/CdS/ZnS core/shell/shell heterostructures synthesized as described in Example 3.6. The photoluminescence quantum yield of the nanocrystals increased from 30% for the unshelled cores to 55% when shelled with CdS and ZnS.

Synthesis of Cadmium Selenide Cores:
Cadmium oxide (77 mg, 0.6 mmol) and oleic acid (0.68 g, 2.4 mmol) were added to 1-octadecene (6.0 g), degassed under Ar flow for 30 minutes at room temperature, and then heated to 240° C. until clear (15 minutes). This solution was then cooled to <70° C. and trioctylphosphine (1.5 g) and octadecylamine (4.5) were added under an overpressure of Ar. The reaction solution was degassed under Ar flow for 15 minutes and then heated to 270° C. Once stable at this temperature, 3.0 g of tributylphosphine selenide, diluted in 1-octadecene (Se, 1.4 g, 17.6 mmol; tributylphosphine, 3.84 g, 18.8 mmol; 1-octadecene, 12.3 g), was injected rapidly and the temperature reduced to 250° C. The reaction was allowed to proceed until the desired nanocrystal size was reached (3 minutes), at which point the heating source was removed and the solution cooled with an oil bath. Once the temperature reached <80° C., hexane was added (10 mL). The hexane solution was washed twice with methanol and stored in the dark. Shelling procedure: CdS and ZnS shells were grown on the preformed CdSe cores using an alternating addition strategy. CdSe cores dissolved in hexane (100 nmol in QDs as determined by absorbance at the first excitonic transition) were added to octadecylamine (1.5 g) and 1-octadecene (5.0 g) and degassed under vacuum at 100° C. to remove all of the hexane (30 minutes). The reaction solution was then heated to 240° C. under Ar and the temperature allowed to stabilize for 30 minutes. Next, alternating additions of cadmium oleate (0.04 M in 1-octadecene; CdO, 62 mg, 0.48 mmol; oleic acid, 1.08 g, 3.83 mmol; 1-octadecene, 8.5 g) and N-n-hexyl-N'-di-n-octylthiourea (10) (0.04 M in 1-octadecene; N-n-hexyl-N',N'-di-n-octylthiourea (10), 154 mg, 0.4 mmol; 1-octadecene, 7.9 g) were added dropwise to the reaction for the formation of CdS layers. Following the growth of CdS, alternating additions of zinc oleate (0.04 M in 1-octadecene; zinc acetate dihydrate, 44 mg, 0.20 mmol; oleic acid, 0.24 g, 0.85 mmol; 1-octadecene, 6.0 g) and N-n-hexyl-N',N'-di-n-octylthiourea (10) (0.04 M in 1-octadecene) were added dropwise for the formation of the ZnS layers. The molar amount for each metal cation addition was calculated to produce one half-monolayer based on a diameter change of 0.35 nm for one full monolayer assuming the bulk density of CdSe. The molar amount for each S addition was 2:3 compared to the metal-cation addition due to the complete conversion of the thiourea precursors. Following each addition, the mixture was allowed to react for 10 minutes. After the last addition, the solution was allowed to cool to <80° C. before the addition of toluene (10 mL). After centrifugation (5000 rpm, 5 min), the clear nanocrystal solution was decanted and the solid precipitates discarded. Sufficient methyl acetate was added to form a cloudy suspension (approximately 10 mL), which was then centrifuged (7000 rpm, 10 min.) The solid nanocrystal residue as suspended in toluene and stored in the dark. In some cases, residual organic solids were removed at this stage either by centrifugation or filtration. See FIG. 14 for additional information.

Figure 15:
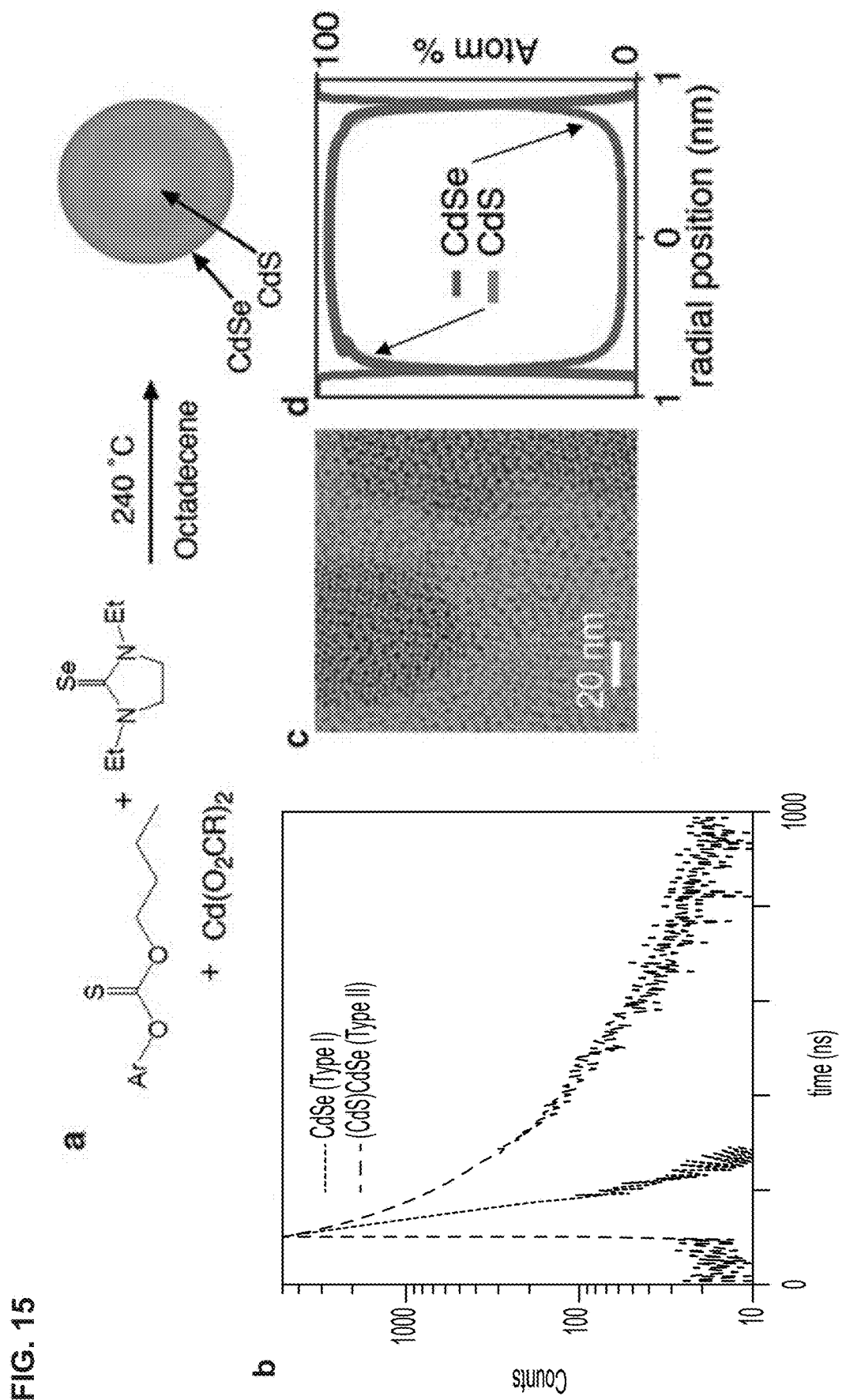
FIG. 15 shows an exemplary synthesis of a graded CdS/CdSe QD (a), comparing the long luminescence decay expected by the Type II structure compared with the short decay expected of pure CdSe (b). The figure further represents the monodisperse QDs (d=2.5 nm packed into superlattices (c) and the radial atomic distribution of sulfur and selenium calculated from the relative conversion constants (d). See Example 3.6.

Controlled conversion kinetics limited the steady state monomer supersaturation and prevented homogeneous nucleation during the synthesis of CdSe/CdS/ZnS core/shell/shell heterostructures using existing step-wise shelling approaches. For example, using N-n-hexyl-N',N'-di-n-octylthiourea, the existing sulfur precursor could be replaced in a successive ion layer adsorption reaction and prepare a CdSe/CdS/ZnS core/shell/shell heterostructures with bright photoluminescence (PLQY=60±5%). Howver, the thioureas underwent quantitative conversion allowing the sulfur addition to be precisely and reliably controlled and the moles of the precursor to be reduced compared to the traditional approach using sulfide and oleylamine precursors Preliminary studies demonstrate the success of the one pot graded alloy approach. In situ kinetics data were independently obtained on a pair of sulfur and selenium precursors shown in FIG. 15. The conversion rate constants (sec$^{-1}$) extracted from those investigations show a slightly faster (8×) sulfide supply rate constant (sec$^{-1}$) [k(sulfide)>k(selenide)] and quantitative formation of cadmium chalcogenide. Simultaneous injection of these precursors into the same reaction produces a graded alloy with sulfur concentrated at the crystal core and selenium at the crystal surface, as plotted by the kinetics simulation FIG. 15(d). Unusually long luminescence lifetimes ($\tau_{average}$~170 ns) support the quasi-Type-II band offset calculated for a QD with the kinetically predicted spherical quantum well structure, an order of magnitude longer than the pure CdSe luminescence decay shown in the sample plot (FIG. 15(b)). Moreover, the homogeneous size distribution evident in TEM images (FIG. 15(c)) confirmed that one-pot syntheses of graded alloys was achieved.

Figure 16:
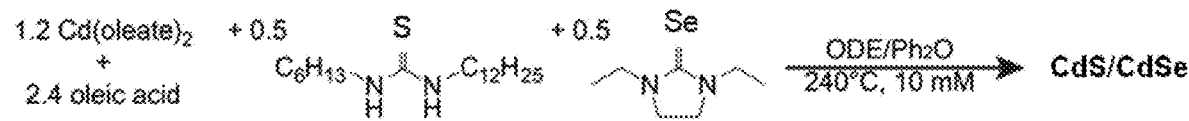
FIG. 16 shows the reaction scheme for combined precursor reaction (A). Kinetics of single component precursor conversion at 5 mM chalcogen precursor via UV-Vis (B) and $^1$H NMR. The single component 1H NMR data is compared with the one-pot core/shell HNMR data (C). UV-Vis and fluorescence spectra of aliquots of this reaction (D). See Example 3.6.
Figure 16:
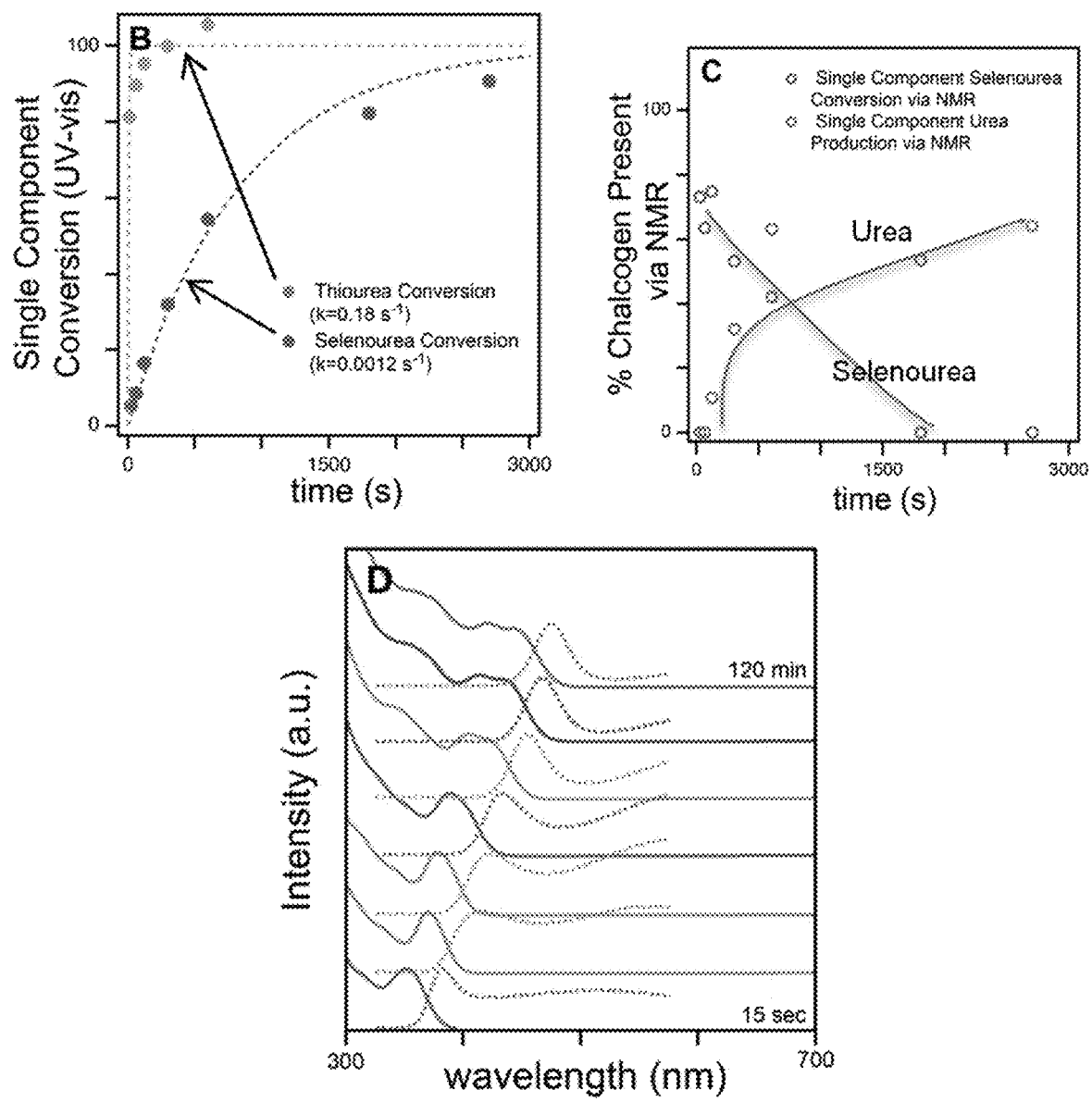

As described elsewhere herein, when combining a "fast" precursor and a "slow" precursor, the fast precursor determines the outcome of the nanocrystal nucleation and can be used to control the concentration of nanocrystals and the final core size and shell thickness of the core shell nanocrystals. The terms "fast" and slow" are used in relative terms, but it should be appreciated that the precursor with the faster kinetics (larger $k_{obs}$, "fast" precursor") defines the number and size of the nanoparticles. Another example case is shown below in FIG. 16 using N-hexyl-N'-dodecyl thiourea as the fast precursor to nucleate a CdS core and 1,3-diethylimidazolidine selenone to more slowly grow a CdSe shell. At 5 mM in thiourea and 12 mM in cadmium oleate, the kinetics of this thiourea were sufficiently slowed so that this precursor could be used in a hot injection reaction. UV-Vis and $^1$H NMR measurements indicated that 1,3-diethylimidazolidine selenone is ~10% converted upon complete reaction of N,-hexyl, N'-dodecyl thiourea under these conditions. See FIG. 16(B). It appears to be more favorable for CdSe monomer units to grow onto the preexisting CdS nuclei than to build up in solution and have a secondary nucleation event of CdSe. Chalcogen exchange is not observed via $^1$H-NMR. Aliquots showing the reaction progress as measured by UV-VIS indicate the formation of a material with a large Stokes shift between the absorption and emission, as well as the formation of a green emitting nanocrystal. Together with the data presented elsewhere herein, these data support the formation of a CdS/CdSe core/shell nanocrystal, as the individual constituents led to different absorption and luminescence features when used on their own.

By switching a fast core precursor to a slightly slower one, such as N-phenyl, N',N'-dibutyl thiourea or N-methyl, N,N'-diphenylthiourea, the alloying between the CdS core and the CdSe shell appears to increase.

Figure 17:
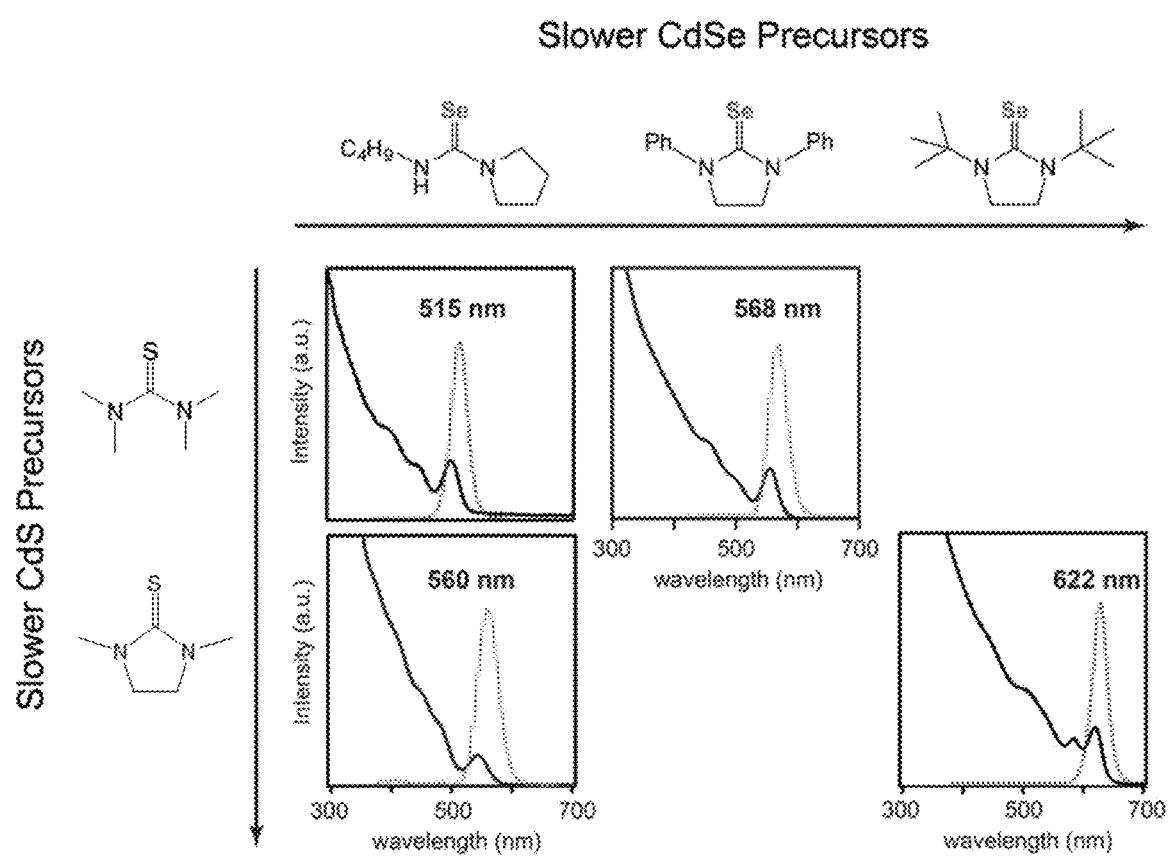
FIG. 17 shows that the of mixing of thio- and selenourea precursors results in different color emitting. See Example 3.6.

Additional examples CdSe/CdS core/shell quantum dots that use a selenium precursor with different kinetics to determine the size of the core are shown in FIG. 17. The faster tri-substituted seleno urea produced a higher concentration of smaller cores and a shorter final emission wavelength, while the slower tetrasubstituted precursor gave rise to a lower concentration of core nanocrystals with a larger size with a longer emission wavelength. A much slower tetrasubstituted thiourea such as tetramethyl thiourea or a substituted thione deposited CdS shells onto these CdSe cores at an even slower rate. The final emission characteristics are shown below in FIG. 17 illustrating the results. These examples of one-pot CdSe/CdS core/shell nanocrystals have high quantum yields (65-77% PLQY).

In the particular case of Cd(Se$_{1-x}$,S$_x$) compositions, the precursor conversion kinetics are sensitive to reaction conditions including concentration of the sulfur- and/or selenium containing precursors, the concentration of excess fatty (e.g., oleic) acid, and concentration of cadmium oleate (or other cadmium fatty acid salt). Even within this framework, there are also some major differences between CdS and CdSe nanocrystal nucleation. Notably, for a given precursor conversion rate, CdSe generally nucleate with fewer nanocrystals than does CdS. This has a non-trivial effect on combined precursor reactions to create one-pot core/shell nanocrystals. Some secondary nucleation of CdS nanocrystals have been observed in some CdSe/CdS core/shell reactions. Without intending to be bound by any particular theory, it is possible that this occurs when the core precursor nucleates too few cores compared to what the shell precursor alone would have nucleated. The shell precursor builds up monomer in solution until enough monomer has accumulated to trigger another nucleation event. Supporting this theory, no CdSe secondary nucleation has been observed during CdS/CdSe core/shell syntheses.

Example 3.7. Copper Sulfide Nanoplatelets

Figure 18:
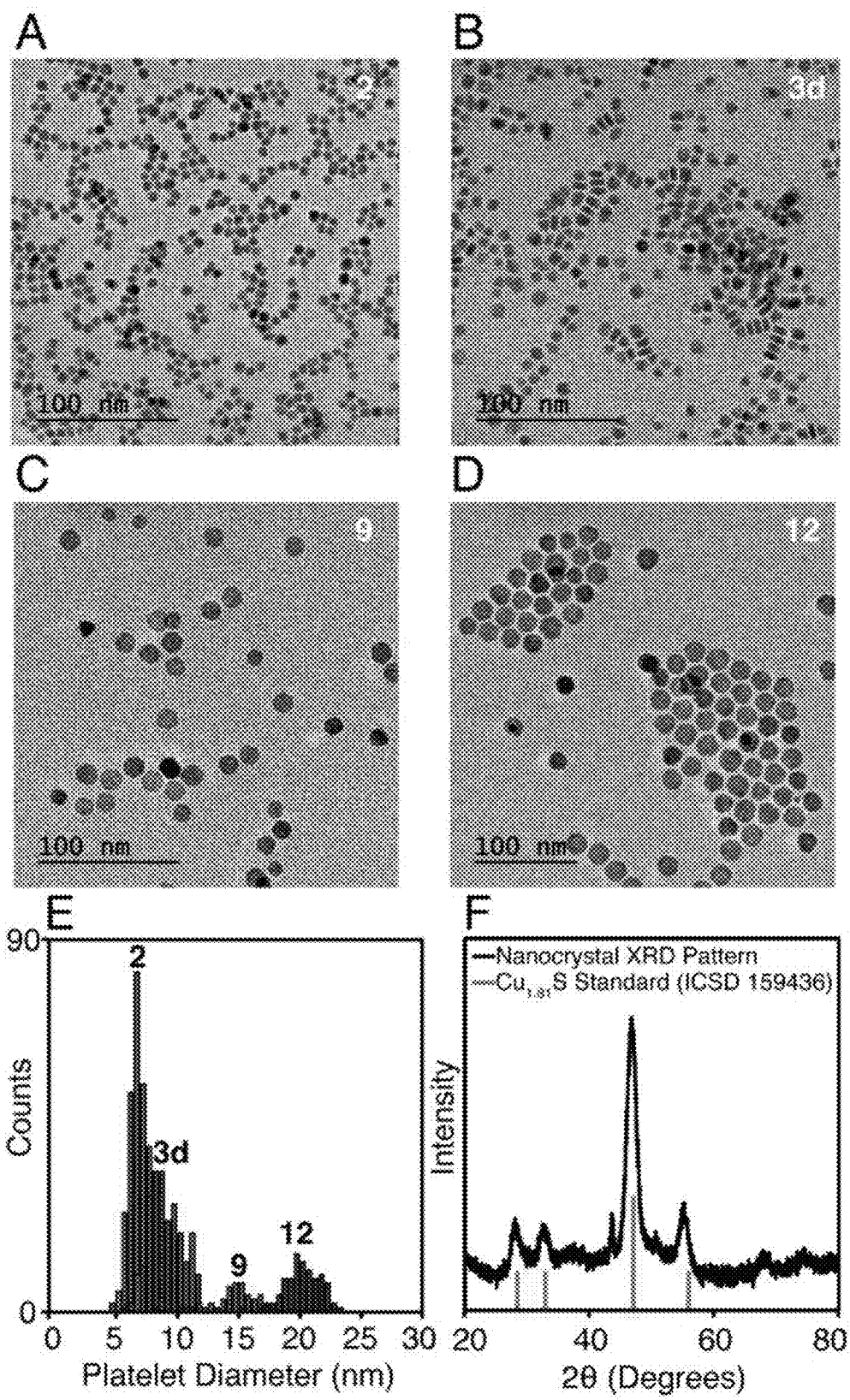
FIG. 18 shows transmission electron micrographs of $Cu_{2-x}S$ nanocrystals synthesized with (A) N—N'-diphenylthiourea (2), (B) N-phenyl-N'-n-dodecylthiourea (3d), (C) N-n-hexyl-N'—N'-di-n-butylthiourea (9), and (D) N—N—N'—N'-tetramethylthiourea (12). A histogram of the platelet diameters (ignoring the platelet depth, e.g. the short lengths in (B)) is shown in (E), clearly demonstrating a systematic variation in size. (F) X-ray powder diffraction data from $Cu_{2-x}S$ nanocrystals synthesized from 2. The $Cu_{1.8}S$ standard was obtained from the International Crystallographic Structure Database (ICSD) as coll. code 159436. An exponential baseline correction was applied to the data to remove signal from scattering. See Example 3.7.

Synthesis of copper sulfide nanoplatelets: In a nitrogen-filled glovebox, copper (II) acetylacetonate (0.2616 g, 1 mmol), 1-octadecene (7.89 g, 10 mL), and distilled oleylamine (1.605 g, 6.0 mmol) were combined in a septum-sealed vial. The vial was removed from the glovebox, pierced with an argon inlet needle, and submerged in an oil bath heated to 160° C. After five minutes in the oil bath, a solution of substituted thiourea (0.5 mmol) in diphenyl ether (0.5 mL) was injected. The reaction was allowed to proceed for 30 minutes, after which the vial was removed from the oil bath and cooled to room temperature. The nanocrystals were isolated by precipitation with 20 mL methyl acetate, centrifugation (5 minutes, 7000 rpm), decanting the liquor, and re-dissolving the remaining nanocrystal residue in 5 mL hexane. This was repeated twice more using 10 mL methyl acetate to precipitate the nanocrystals. See FIG. 18 for additional information.

Example 3.8. Nickel Sulfide Nanocrystals

Figure 19:
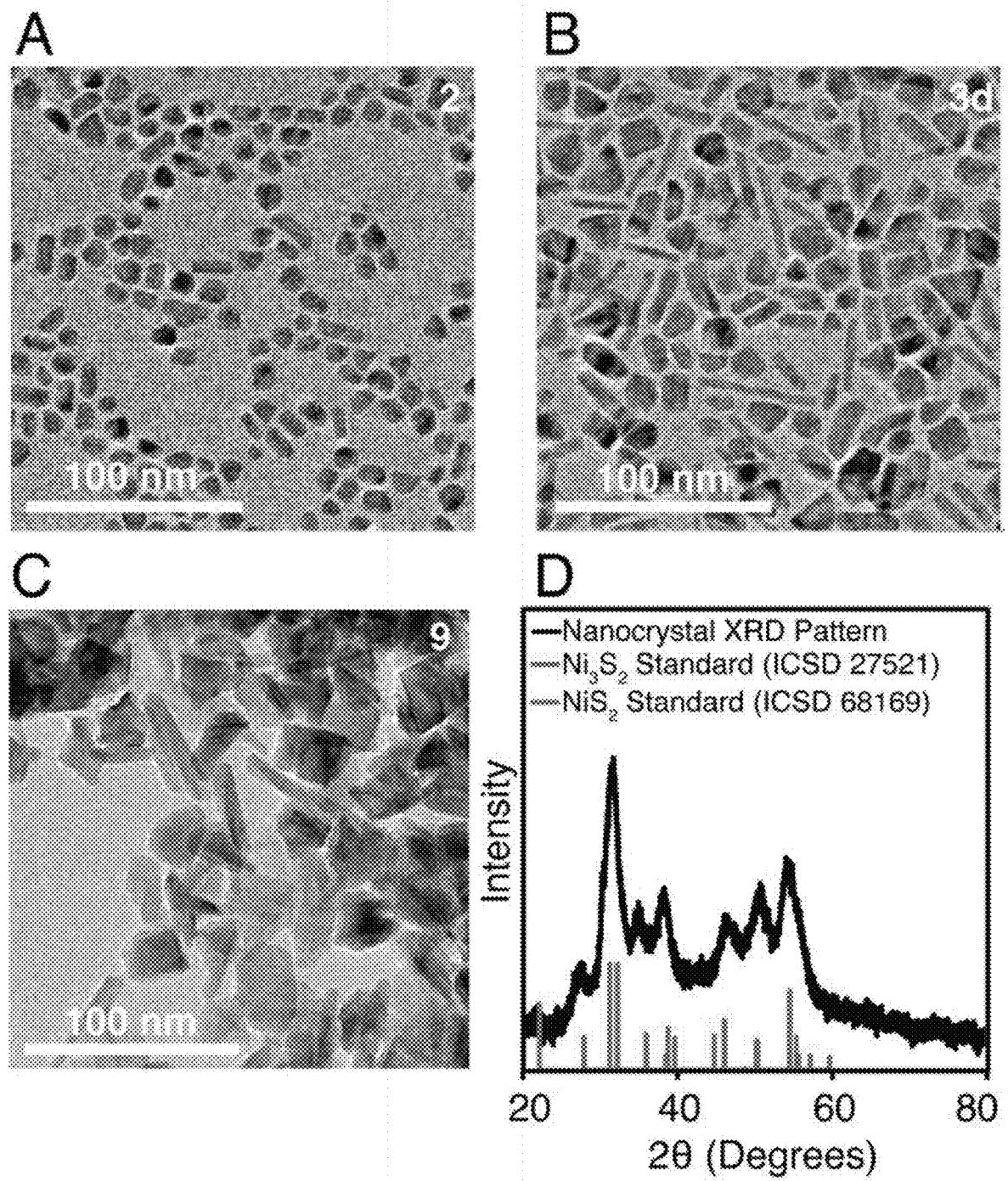
FIG. 19 shows transmission electron micrographs of NiS nanocrystals synthesized with (A) N—N'-diphenylthiourea (2), (B) N-phenyl-N'-n-dodecylthiourea (3d), and (C) N-n-hexyl-N'—N'-di-n-butylthiourea (9). (D) X-ray powder diffraction data nickel sulfide nanocrystals synthesized from 2. The standard were obtained from the International Crystallographic Structure Database (ICSD) as coll. codes 27521 and 68169. An exponential baseline correction was applied to the data to remove signal from scattering. See Example 3.8.

Nickel (II) stearate (62.6 mg, 0.1 mmol) and distilled oleylamine (10 mL, 8.13 g) were combined in a septum-sealed vial in a nitrogen-filled glovebox. The vial was removed from the glovebox, pierced with an argon inlet needle, and submerged in an oil bath heated to 200° C. After five minutes in the oil bath, a solution of substituted thiourea (0.1 mmol) in oleylamine (0.5 mL) was injected. The reaction was allowed to proceed for 30 minutes, after which the vial was removed from the oil bath and cooled to room temperature. The nanocrystals were isolated by precipitation with 20 mL methyl acetate, centrifugation (5 minutes, 7000 rpm), decanting the liquor, and redissolving the remaining nanocrystal residue in 5 mL hexane. This was repeated twice more using 10 mL methyl acetate to precipitate the nanocrystals. See FIG. 19 for additional information.

Example 3.9. Kesterite CZTS Nanocrystals

Figure 20:
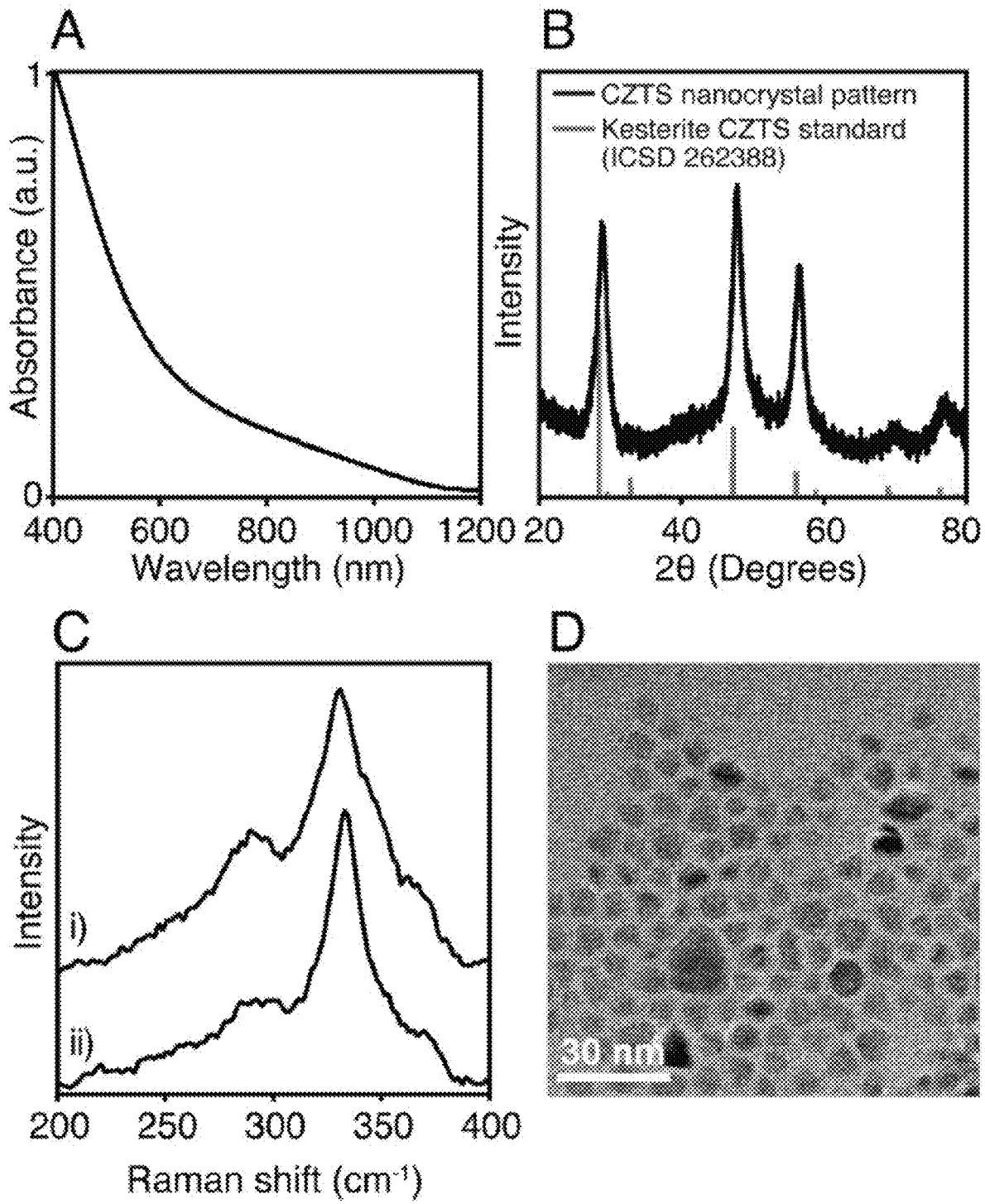
FIG. 20 shows (A) UV-Vis-NIR absorbance spectrum of CZTS nanocrystals dissolved in chloroform. (B) Powder X-ray diffraction pattern of CZTS nanocrystals (CZTS standard was obtained from International Crystallographic Structure Database (ICSD) as coll. code 262388). (C) Raman spectra of CZTS nanocrystals i) as synthesized and ii) after annealing at 400° C. under vacuum for 5 minutes. (D) Transmission electron micrograph of CZTS nanocrystals. See Example 3.9.
Figure 21:
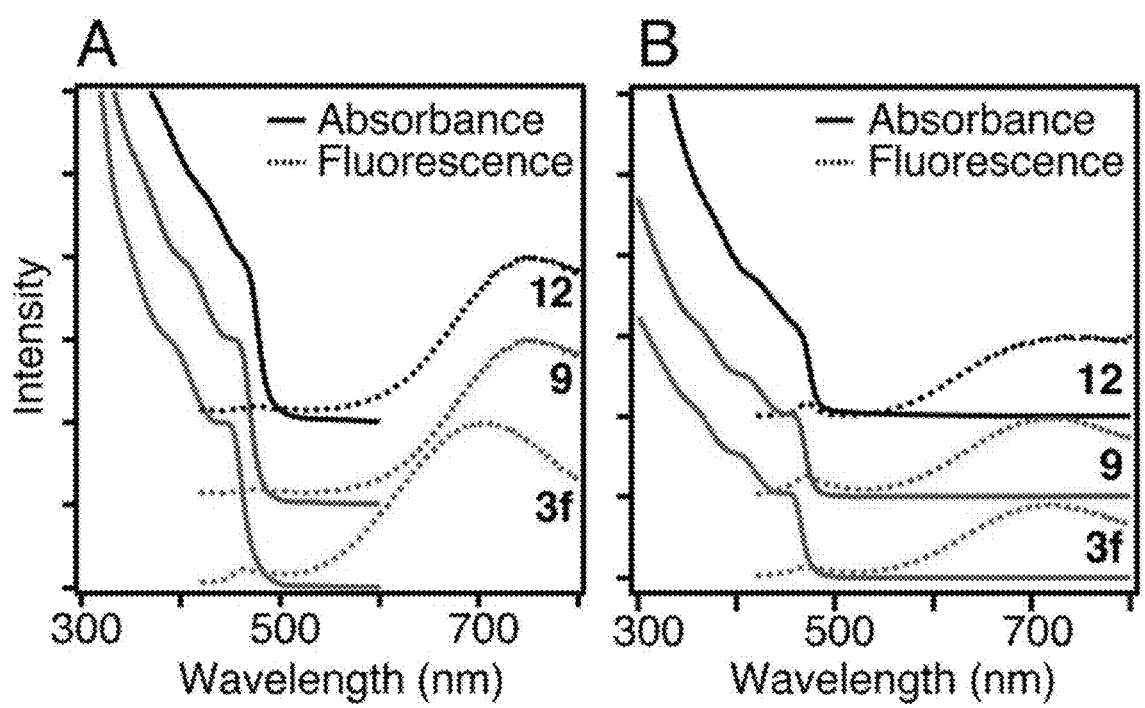
FIG. 21 shows UV-Vis and photoluminescence spectra of CdS nanorods synthesized with tetramethylthiourea (12), N-n-hexyl-N',N'-di-n-butylthiourea (9), and N-(p-methoxyphenyl)-N'-n-dodecylthiourea (3f). Panels show data collected from syntheses with (A) 12 mol % hexylphosphonic acid and (B) 6 mol % hexylphosphonic acid. See Example 3.10.

Briefly, copper (I) iodide (667 mg, 3.5 mmol, 0.4375 equiv.), tin (IV) chloride hexahydrate (701 mg, 2.0 mmol, 0.250 equiv), and zinc chloride (340 mg, 2.5 mmol, 0.3125 equiv.) were added to oleylamine (16 mL) and degassed under vacuum for 60 minutes at 100° C., giving a blue-green solution, and then placed under argon. During this time, N,N'-diphenylthiourea (2) (571 mg, 2.5 mmol, 0.3125 equiv.), tetramethylthiourea (12) (727 mg, 5.5 mmol, 0.6875 equiv.), and tetraglyme (2 mL) were added to a scintillation vial and heated to 100° C., giving a pale yellow solution. The thiourea solution was rapidly injected into the metal solution, giving a dark reaction mixture. The mixture was stirred at 100° C. for 60 minutes, then heated to 250° C. and held there for 60 minutes, then heated to 290° C. and held there for 10 minutes, and finally allowed to cool to 60° C. The reaction mixture was then opened to air, diluted with chloroform (7.5 mL), precipitated with acetone (12.5 mL) and methanol (12.5 mL), and centrifuged (4000 rpm, 5 minutes), giving a clear pale yellow supernatant. The dark residue was dissolved in chloroform (5 mL) and centrifuged (4000 rpm, 5 minutes) to remove a small amount of aggregated material (<20% of product). The dark brown solution was decanted, precipitated with ethanol (5 mL), and centrifuged (4000 rpm, 5 minutes), giving a clear colorless supernatant. The dark residue was dissolved in chloroform (5 mL) and dried under vacuum, giving a brown-black nanocrystal solid. See FIG. 20 for additional information Example 3.10. Synthesis and Optical Characterization of CdS Nanorods Cadmium sulfide nanorods were synthesized by mixing cadmium oxide (56 mg, 0.44 mmol) with a mixture of hexylphosphonic acid (10-20 mg, 0.06-0.12 mmol) and octadecylphosphonic acid (274-294 mg, 0.82-0.88 mmol) where the total amount of phosphonic acids was held at 0.94 mmol in 1.75 g recrystallized trioctylphosphine oxide. This solution was first degassed under vacuum (50 mTorr) for 30 min at 100° C., followed by heating to 320° C. under Ar for 20 min resulting in a clear solution. After lowering the temperature to 120° C., the solution was degassed a second time under vacuum for 60 min to remove water and then heated back to 320° C. under Ar. Trioctylphosphine (2.0 g)

was added and the temperature was allowed to stabilize at 320° C. Separately, a solution of the respective thiourea (0.36 mmol) (tetramethylthiourea (12), N-n-hexyl-N',N'-di-n-butylthiourea (9), and N-(p-methoxyphenyl)-N'-n-dodecylthiourea (3f)) was dissolved in 0.5 g trioctylphosphine with gentle heating and then injected to the cadmium phosphonate solution. Aliquots were periodically removed and monitored using UV-Vis spectroscopy and the reaction was allowed to proceed for 60-120 min. After cooling to <100° C., acetone (30 mL) was added to precipitate the sample, which was then centrifuged at 8000 rpm for 5 min. The precipitate was re-suspended in dichloromethane (5 mL) and octylamine (5 mL), then acetone was added (20-30 mL) until the solution became turbid. The solution was then centrifuged again at 8000 rpm for 10 min and re-suspended in hexane. Any solids that precipitated were removed. The products are characterized in FIG. 21.

Figure 22:
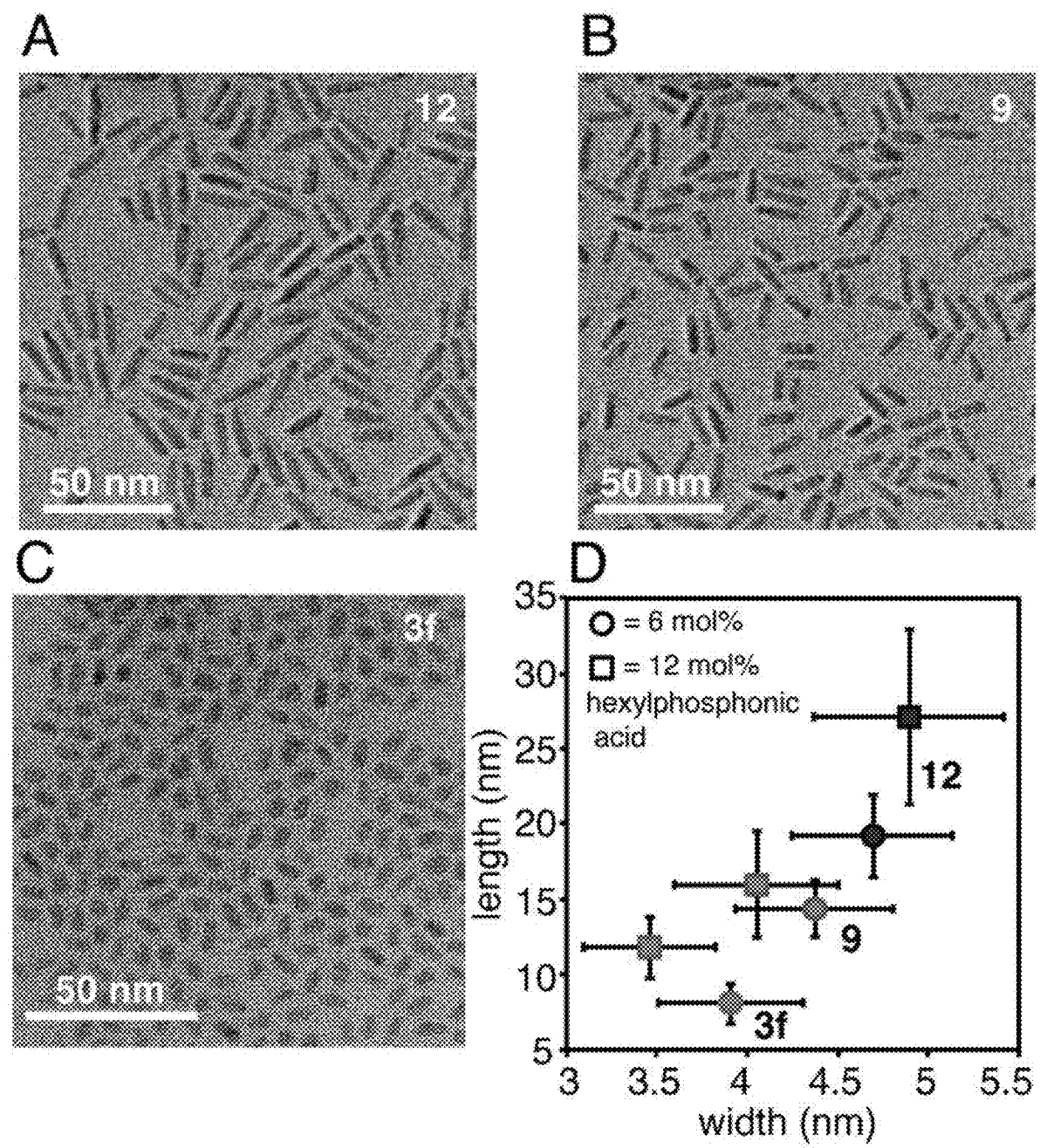
FIG. 22 shows transmission electron microscope images of CdS nanorods synthesized with 6 mol % hexylphosphonic acid and thiourea (A) 12, (B) 9, and (C) 3f; samples were prepared without any intentional size selective precipitation. (D) Average nanorod dimensions for samples synthesized with the three precursors at both hexylphosphonic acid concentrations. The values are calculated by measuring the images of at least 200 nanorods in each sample. Error bars represent one standard deviation. See Example 3.10.

FIG. 22 shows transmission electron microscope images of CdS nanorods synthesized with 6 mol % hexylphosphonic acid and thiourea (A) 12, (B) 9, and (C) 3f; samples were prepared without any intentional size selective precipitation. (D) Average nanorod dimensions for samples synthesized with the three precursors at both hexylphosphonic acid concentrations. The values were calculated by measuring the images of at least 200 nanorods in each sample. Error bars represent one standard deviation. See.

Figure 23:
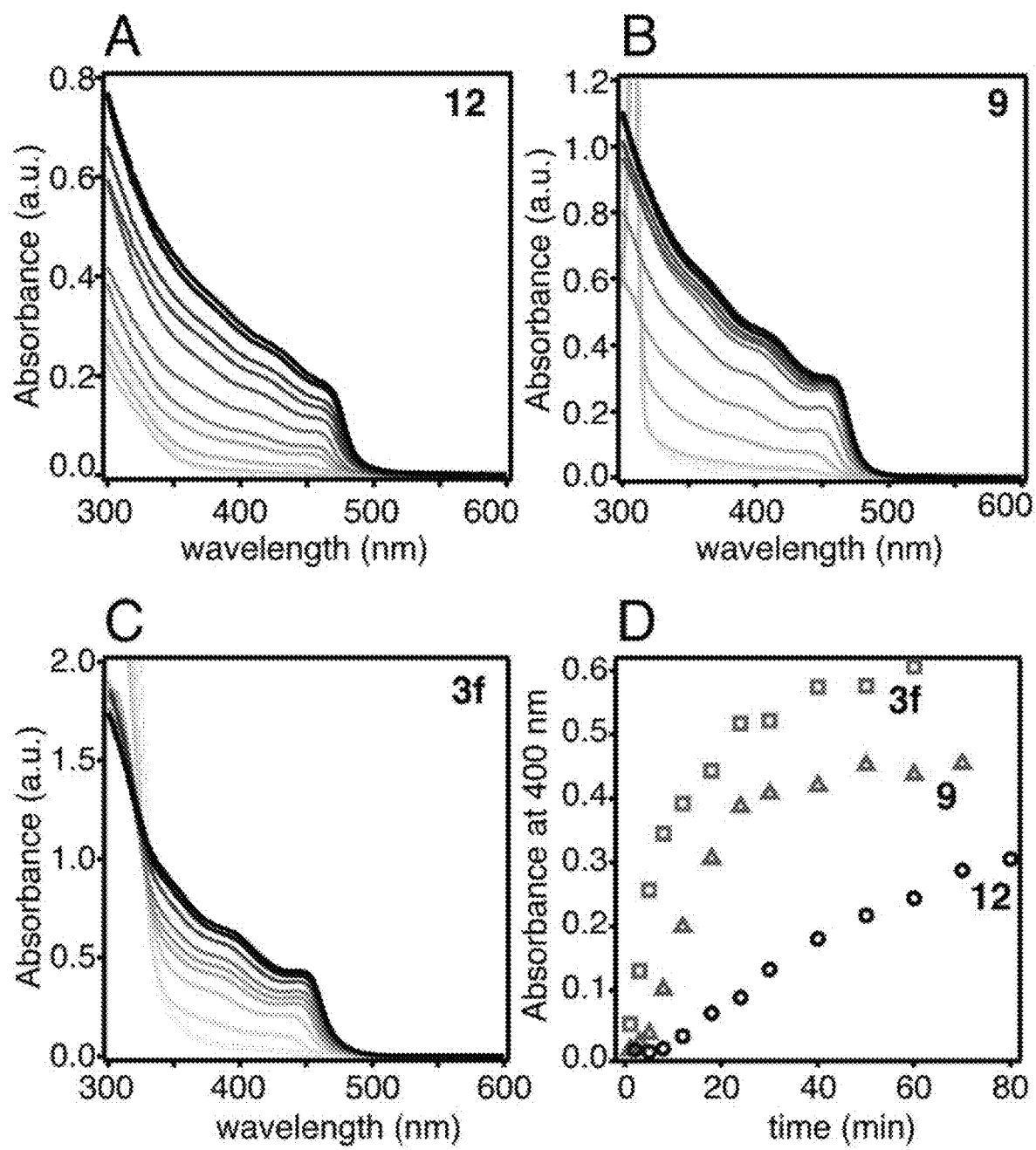
FIG. 23 shows UV-Vis absorbance spectra of reaction aliquots taken from the syntheses of CdS nanorods synthesized with 12 mol % hexylphosphonic acid and thiourea (A) 12, (B) 9, and (C) 3f. (D) Absorbance measured at 400 nm from each aliquot versus time gives a rough estimate of reaction kinetics for each synthesis. Taken in total with the TEM data, it is concluded that since faster precursors formed a greater number of nuclei, and the CdS nanorod aspect ratio decreases with increasing thiourea precursor conversion kinetics. See Example 3.10.

UV-Vis absorbance spectra of reaction aliquots taken from the syntheses of CdS nanorods synthesized with 12 mol % hexylphosphonic acid and thiourea as shown in FIG. 23. (A) 12, (B) 9, and (C) 3f. (D). Absorbance measured at 400 nm from each aliquot versus time gives a rough estimate of reaction kinetics for each synthesis. Taken in total with the TEM data, we conclude that since faster precursors form a greater number of nuclei, CdS nanorod aspect ratio decreases with increasing thiourea precursor conversion kinetics.

Example 3.11. Tin Sulfide Nanoplatelets

Synthesis of Tin Sulfide Nanosheets:
Tin (II) acetate (24 mg, 0.10 mmol) and oleylamine (20 mL) were sonicated for 10 minutes, forming an opalescent mixture. The mixture was then degassed under vacuum at 120° C. for 10 min. After cooling to 90° C. under Ar, hexamethyldisilazane (1.0 mL, 4.77 mmol) was added. In a separate vessel, N-n-hexyl-N'-dodecylthiourea (8) (36 mg, 0.11 mmol) was mixed with diphenyl ether (0.5 mL) and briefly heated to form a homogenous solution. The thiourea solution was added to the metal solution at 90° C., and the temperature was then increased to 180° C. over 10 minutes, turning brown after approximately 4 min at 180° C. After 30 minutes at 180° C., the reaction mixture was allowed to cool to room temperature. The reaction mixture was then opened to air, washed with an acetone/toluene/hexane mixture (30 mL, 3:1:1 ratio), and centrifuged. The precipitate was washed twice more with a toluene/methanol mixture (20 mL, 1:1 ratio) prior to characterization.

Figure 24:
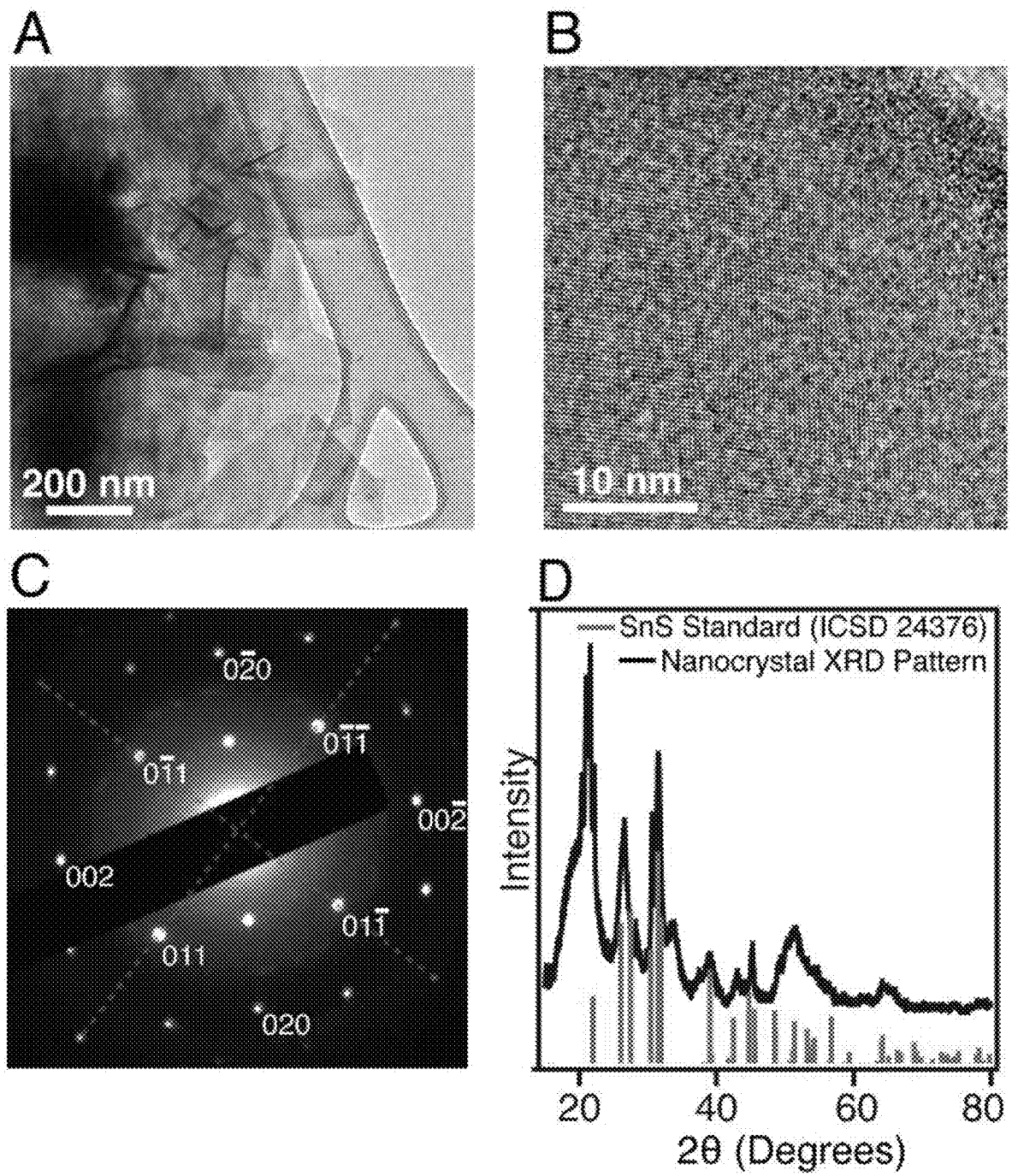
FIG. 24 shows (A) Transmission electron micrograph of SnS nanosheets; (B) High resolution transmission electron micrograph showing the crystallinity of the nanosheet product. (C) Electron diffraction of a single SnS nanosheet, indexed according to reference 27. The diffraction shows a slight distortion from the bulk orthorhombic phase. (D) Powder X-ray diffraction pattern of SnS nanocrystals. An exponential baseline correction was applied to the XRD data to remove signal from scattering. The α-SnS standard was obtained from the International Crystallographic Structure Database (ICSD) as coll. code 24376. See Example 3.11.

FIG. 24 shows transmission electron micrograph of SnS nanosheets (A) and high resolution transmission electron micrograph showing the crystallinity of the nanosheet product (B). Electron diffraction of a single SnS nanosheet is shown in (C). The diffraction shows a slight distortion from the bulk orthorhombic phase as seen previously. Powder X-ray diffraction pattern of SnS nanocrystals are shown in (D). An exponential baseline correction was applied to the XRD data to remove signal from scattering. The α-SnS standard was obtained from the International Crystallographic Structure Database (ICSD) as coll. code 24376.

Example 3.12. Studies with Lead Selenide Nanocrystals

Example 3.12.1. Synthesis of Small PbSe Nanocrystals

Lead oleate and trialkyl selenoureas were reacted in mixtures of 1-octene and dibutyl ether at 100° C. to generate small PbSe nanocrystals (d<3 nm) according to the following reaction scheme:

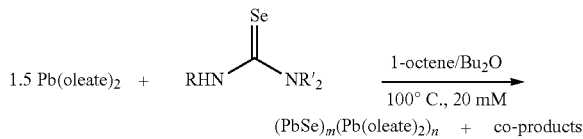

Figure 25:
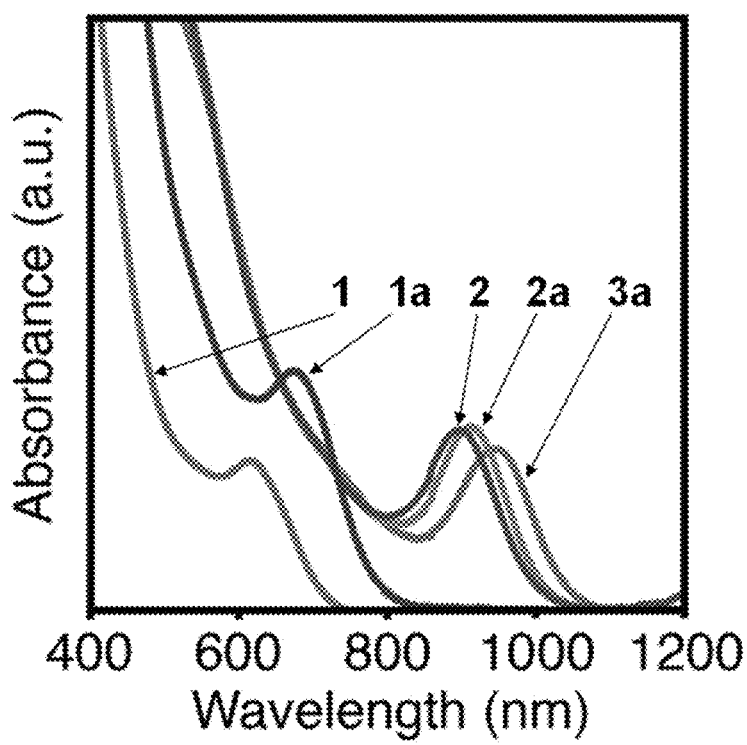
FIG. 25 shows the UV-Vis-NIR spectra of extremely small PbSe nanocrystals (d<3 nm) synthesized as described in Example 3.12.1 from 1) N'-cyclohexyl-N,N-diisopropylselenourea, 1a) N'-butyl-N,N-diisopropylselenourea, 2) N,N-dibutyl-N'-cyclohexylselenourea, 2a) N'-cyclohexyl-N,N-diisobutylselenourea, and 3a) N'-butyl-N,N-diisobutylselenourea.

The UV-Vis-NIR spectra of these PbSe nanocrystals, 1) N'-cyclohexyl-N,N-diisopropylselenourea, 1a) N'-butyl-N,N-diisopropylselenourea, 2) N,N-dibutyl-N'-cyclohexylselenourea, 2a) N'-cyclohexyl-N,N-diisobutylselenourea, and 3a) N'-butyl-N,N-diisobutylselenourea are shown in FIG. 25.

Example 3.12.2. Demonstration of Size Tunability Using Injection Solvent

Lead oleate and two trialkyl selenoureas were were reacted in mixtures of 1-octene and either dibutyl ether or diglyme at 100° C. to test the effect of the injection solvent on the nature of the produced PbSe nanocrystals according to the following scheme:

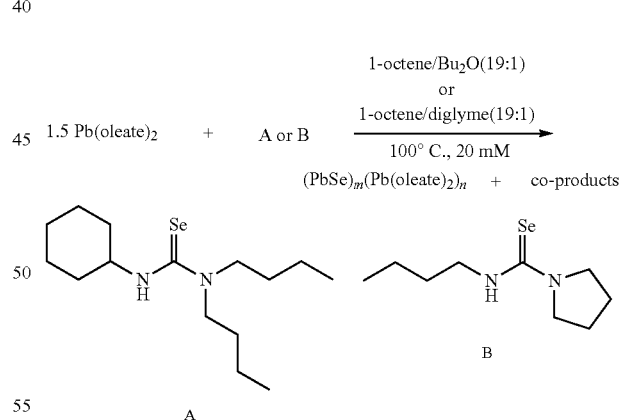

Figure 26:
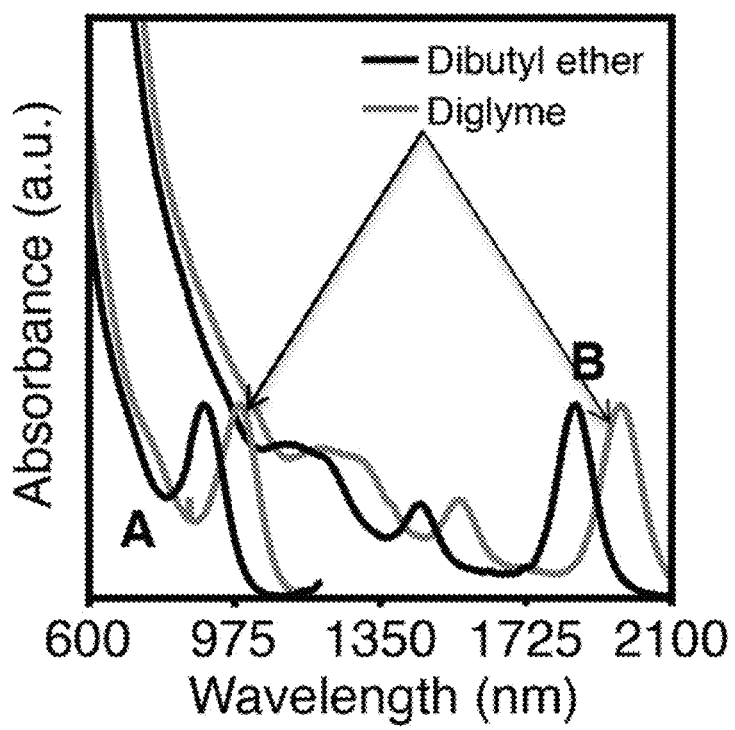
FIG. 26 shows the UV-Vis-NIR spectra of PbSe nanocrystals prepared as described in Example 3.12.2 from A) N,N-dibutyl-N'-cyclohexylselenourea and B) N-butylpyrrolidine-1-carboselenoamide using dibutyl ether or diglyme solvent.

It was observed that changing the injection solvent from dibutyl ether to diglyme resulted in a ~100 nm red shift in the lowest-energy electronic transition under these conditions. Reactions were conducted under identical conditions except for the choice of injection solvent comprising 5% of the final reaction mixture. The UV-Vis-NIR spectra of PbSe nanocrystals are shown in FIG. 26 above from A) N,N-dibutyl-N'-cyclohexylselenourea and B) N-butylpyrrolidine-1-carboselenoamide. The spectra are normalized to the peak height.

Example 3.12.3. Demonstration of Reproducibility at Large Scale

Lead oleate and two trialkyl selenoureas were were reacted in mixtures of 1-octene and either dibutyl ether or diglyme at 100° C. to test the effect of scale (A is at 1 gram scale; B is at 5 gram scale) on the nature of the produced PbSe nanocrystals according to the following scheme:

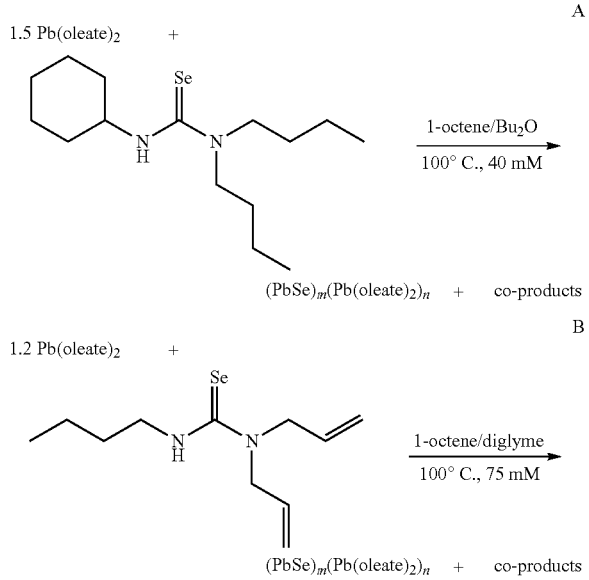

Figure 27:
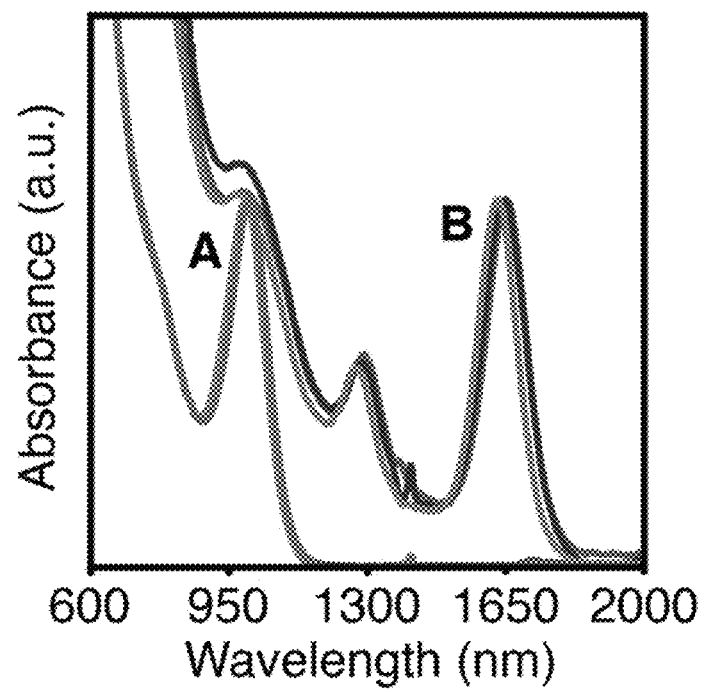
FIG. 27 shows the UV-Vis-NIR spectra of PbSe nanocrystals prepared as described in Example 3.12.3 A) at 1 gram scale and B) at 5 gram scale.

The resulting UV-Vis-NIR spectra of PbSe nanocrystals are shown in FIG. 27.

Example 3.12.4. Demonstration of Fine Size Tuning at Large Scale

Lead oleate and three trialkyl selenoureas were were reacted in mixtures of 1-octene and diglyme at 100° C. to test the ability to tune the properties of the nanocrystals at 1 gram scale according to the following scheme:

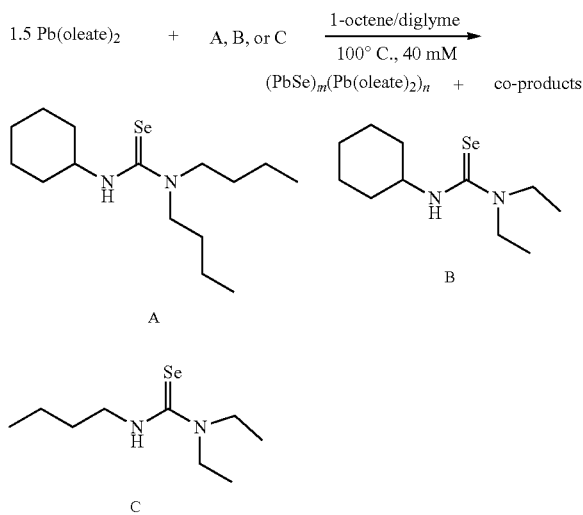

Figure 28:
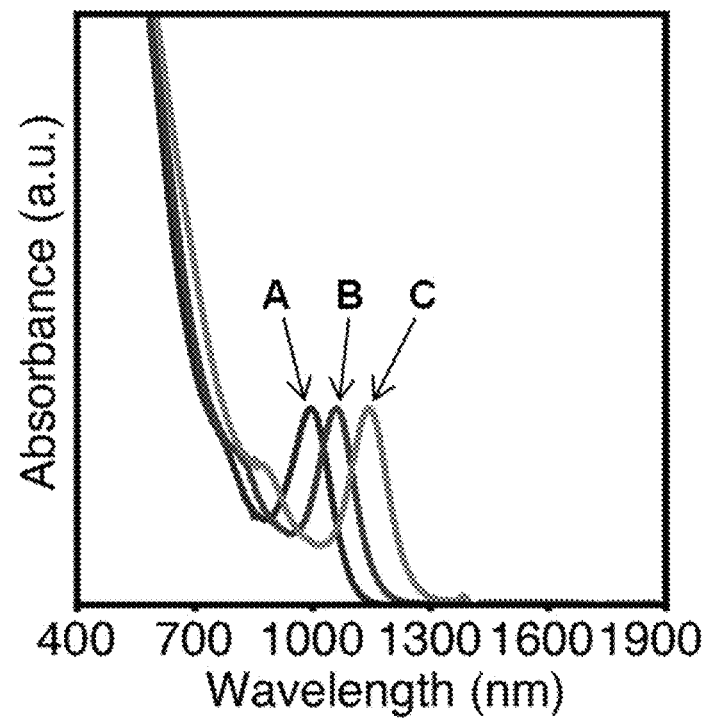
FIG. 28 shows the UV-Vis-NIR spectra of PbSe nanocrystals prepared at 1 gram scale as shown in Example 3.12.4 from A) N,N-dibutyl-N'-cyclohexylselenourea, B) N'-cyclohexyl-N,N-diethylselenourea, and C) N'-butyl-N,N-diethylselenourea.

The resulting properties are described in Table 1 and FIG. 28.

TABLE 1

Properties of PbSe nanocrystals prepared at 1 gram scale from A) N,N-dibutyl-N'-cyclohexylselenourea, B) N'-cyclohexyl-N,N-diethylselenourea, and C) N'-butyl-N,N-diethylselenourea.

| Label | A | B | C |
|---|---|---|---|
| Peak position (nm) | 995 | 1060 | 1144 |
| Peak position (eV) | 1.25 | 1.17 | 1.08 |
| Diameter (nm) | 2.36 | 2.67 | 3.07 |
| Volume ($nm^3$) | 6.90 | 9.94 | 15.08 |
| PbSe per nanocrystal | 118 | 170 | 258 |
| Oleates per nanocrystal | 82.2 | 104.1 | 135.9 |
| Oleates per $nm^2$ | 4.69 | 4.66 | 4.60 |
| Pb:Se ratio | 1.35 | 1.31 | 1.26 |
| Yield (g, %) | 1.064 (83.4%) | 1.1613 (96.7%) | 1.0007 (89.0%) |

Example 3.12.5. Effect of Concentration on Final Nanocrystal Size

Aliquots were removed at the completion of four syntheses reactions, each of which was conducted at a different concentration, the reactions characterized schematically as:

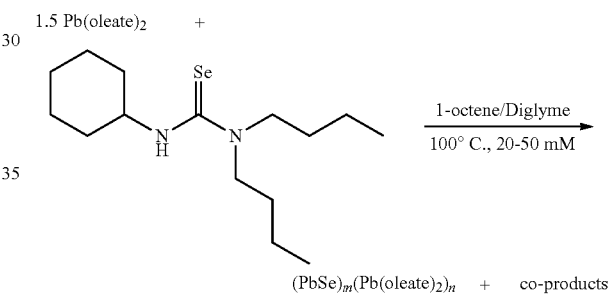

The resulting UV-Vis-NIR spectra are shown in FIG. 29, showing only minor shifts in the wavelength maxima. Spectra are normalized to the peak height.

Example 3.12.6. Demonstration of Slow Ostwald Ripening of PbSe Systems

Experiments were conducted to test the effect of Ostwald ripening, the reactions characterized schematically as:

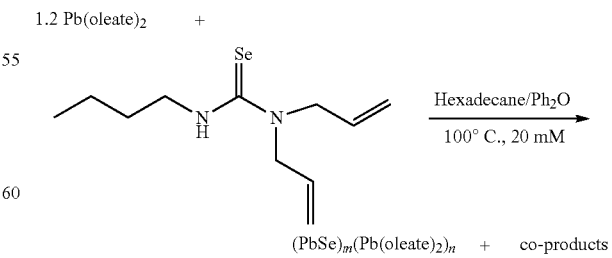

UV-Vis-NIR spectra of aliquots removed from the PbSe nanocrystal synthesis reaction shown above at several times are shown in FIG. 30. The retention of the peak shape and negligible broadening indicates that Ostwald ripening is very slow under these conditions.

Example 4. Kinetics

Example 4.1. Lead Sulfide Kinetics Experiments

In a nitrogen-filled glovebox, lead oleate (0.166 g, 0.216 mmol) and hexadecane (19 mL), were added to a three neck round bottom flask equipped with a stir bar and the flask sealed with two rubber septa and an air-free vacuum adapter. The vessel was attached to a Schlenk line via an argon inlet and one of the septa replaced with a homemade air-free adapter for an in situ optical absorption dip-probe. The flask was covered in foil to eliminate ambient light and immersed in a silicon oil bath of the desired temperate. A stock solution of the desired thiourea (0.216 mmol) in diphenyl ether (1.25 g, 1.2 mL) was prepared in a 2 mL scintillation vial. After allowing the flask to reach thermal equilibrium with the oil bath (10 minutes), the vial containing the thiourea stock solution is immersed in the oil bath for 30 seconds. Continuous recording of the absorbance at 400 nm was initiated and the thiourea stock solution (1 mL, 0.18 mmol thiourea) quickly injected into the flask with vigorous stirring. This results in 20 mL of total solution, and an initial lead oleate concentration of 10.8 mM and thiourea concentration of 9 mM. The reaction was run for 20 minutes after the injection, at which time a 250 µL aliquot was removed to measure the full UV-Vis-NIR spectrum and a 150 µL aliquot was removed for TEM analysis. The UV-Vis-NIR aliquot was dissolved in tetrachloroethylene (2.25 mL), and the TEM aliquot was dissolved in hexane (3 mL). The kinetics data was corrected by setting t=0 as the initial appearance of absorbance at 400 nm. The baseline was also zeroed at λ=400 nm prior to injection. The data were fit to single exponential functions, allowing first-order rate constants to be extracted. Relative rate constants were computed versus the rate of N-n-hexyl-N'-dodecyl-thiourea (8) at 150° C. Relative rates were determined over a range of temperatures by running some precursors at two temperatures (3b: 90, 120° C. and 3f: 120, 150° C.).

FIG. 31 exemplifies the first-order fits to these kinetics data. The reactions were run as described for kinetics experiments with N-phenyl-N'-n-dodecylthiourea (3d) (left) and N-(p-methoxyphenyl)-N'-n-dodecylthiourea (3f) (right). The upper plots show the formation of PbS as a function of time, fit with a first order trace in red. The lower plots show the same data plotted against ln([PbS]), the linearity of which supports the ability to model the data as first order.

Following the same procedure described above for the synthesis of PbS nanocrystals for absorbance and photoluminescence spectroscopies, N-phenyl-N'-n-dodecylthiourea was injected into the lead oleate solution at 120° C. Aliquots (125 µL) were removed at 20 minutes, 1 hour, 2 hours, 3 hours, 4 hours, and 20 hours after injection and dissolved in tetrachloroethylene (2.35 mL) for absorption spectroscopy. FIG. 32 shows the effect of the slow Ostwald ripening under these conditions.

Example 4.1.2. Observation of Variable Incubation Periods Following Injection of Sulfur Precursor Reactions were conducted according to the following synthetic scheme to test the incubation periods of nanocrystal formation using various N-p-X-phenyl-N'-n-dodecylthioureas

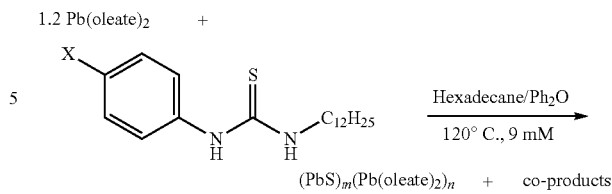

The kinetics traces showing these incubation time of various N-p-X-phenyl-N'-n-dodecylthioureas reacting with lead oleate under standard kinetics conditions are shown in FIG. 33. In this plot, t=0 is the initial thiourea injection and the incubation time constitutes the period of time before appreciable conversion begins.

Example 4.1.3. Incubation Time Versus Reaction Temperature

Reactions were conducted according to the following synthetic scheme to test the incubation periods of nanocrystal formation as a function of temperature:

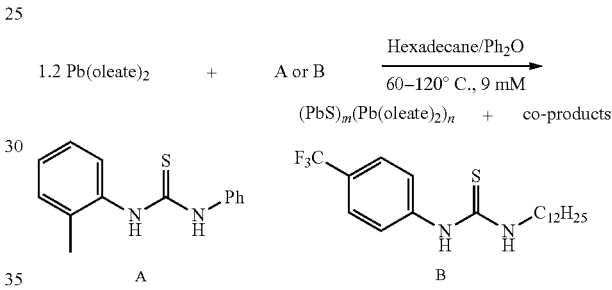

The results are shown in FIG. 34.

Example 4.1.4. Demonstration of PbS Nanocrystal Synthesis Below 90° C.

For the reaction shown schematically as:

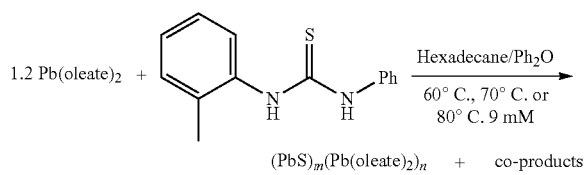

aliquots were removed from PbS nanocrystal synthesis reactions conducted at 80° C., 70° C., and 60° C. The resulting spectra are shown in FIG. 35. All three exhibit narrow linewidths and thus low polydispersity.

Example 4.2. Cadmium Sulfide Kinetics Experiments

Cadmium sulfide kinetics experiments were run similarly to those described for lead sulfide kinetics, with the following changes. Cadmium oleate was used in the place of lead oleate and was prepared by analogous methods. The reactions were monitored at 300 nm rather than 400 nm (except for precursor 11 in which the formation of CdS was monitored using the extinction coefficient reported previously due to an observable intermediate absorbing at high energy at early times). All reactions were run at 150° C. For slower precursors (11, 12), the absorbance was monitored by removing aliquots from the reaction and diluting in toluene rather than using the in-situ dip probe. The precursor conversion reaction was considered complete when the absorbance at 300 nm stopped increasing, at which time a final aliquot was removed and used to determine the final nanocrystal volume using the Peng sizing formula. Final nanocrystal concentration was calculated by dividing the theoretical CdS yield by the nanocrystal volume.

The tunable conversion kinetics was also be used to precisely adjust the concentration of nanocrystals, allowing a desired size to be reproducibly obtained in quantitative yield. The plots shown in FIGS. 36 and 37 show that increasing thiourea conversion reactivity produces a higher nanocrystal concentration and a smaller final nanocrystal diameter. (A) Nanocrystal concentration and final diameter plotted versus the rate constant of lead sulfide formation ($k_{obs}$) for 3a to 3f ([Nanocrystal]$_t$ is proportionate to [PbS] t/($r_t^3$), where t is time and r is the nanocrystal radius at time t). (B to D) Transmission electron micrographs of PbS nanocrystals synthesized under reaction conditions used for kinetics experiments (3a, 3d, and 3f).

Final nanocrystal concentration and diameter were plotted versus $k_{obs}$ (top) and log ($k_{obs}$) (bottom) for a variety of substituted thiourea precursors: N,N'-diphenylthiourea (2), N-phenyl-N'-n-dodecylthiorea (3d), N-n-hexyl-N'-n-dodecylthiourea (8), and N-phenyl-N'-di-n-butylthiourea (11). See FIG. 37. The reactivity trend was the same as was observed for reaction of these compounds with lead oleate: the conversion rate slowed as the substituents changed from aryl to alkyl and as the number of substituents increased from di-substituted thioureas to trisubstituted thioureas. However, the nanocrystal number and size had a weaker dependence on conversion rate for CdS, therefore requiring larger changes in rate to span a similar range of size. Diphenyl thiourea (2) converted at a rate that was near the t of mixing kinetics under these conditions, so the measured rate was likely an underestimate. Tetramethylthiourea (12) was also tested and found to react most slowly. As expected, the nanocrystals were larger but the conversion rate required extremely long reaction times at 150° C. and eventually produced an insoluble precipitate. As a result it was omitted from the plot.

Example 5. Discussion

These results show the ability to kinetically control the composition of various sulfide and selenide compositions that readily convert to metal chalcogenide nanocrystals using inexpensive and air-stable substituted organic precursors.

The conversion reactivity of these precursor compositions can be finely tuned over seven orders of magnitude by adjusting the organic substituents. The widely tunable reactivity allows an optimum chalcogen precursor to be matched with the reactivity of a metal complex at a desired reaction temperature. By controlling the monomer supply kinetics, the extent of nucleation could be adjusted in syntheses of lead sulfide, cadmium sulfide, zinc sulfide, and copper sulfide nanocrystals so as to be able to reliably prepare a desired size with a narrow size distribution and in quantitative yield. The tunability allows favorable conversion kinetics over a wide range of temperatures 100-350° C. Simple exponential conversion kinetics were observed that vary smoothly over a factor of 1,000,000 depending on the thiourea structure. Multigram quantities of air-stable N,N'-disubstituted and N,N,N'-trisubstituted thioureas were obtained in quantitative yields. In many cases, the electrophilicity of isothiocyanates made the reaction with amines rapid at room temperature, allowing N,N'-diaryl; N,N'-dialkyl; mixed N-alkyl-N'-aryl; and N,N,N'-trialkylthiourea structures to be prepared (1 to 11).

In the case of thioureas, conversion reactivity depended on the number of substituents and their electronic and steric properties. The rate decreased as the number of substituents increases. Tetrasubstituted thioureas converted most slowly. Trisubstituted and then disubstituted derivatives converted increasingly faster. Thus, it was possible to use the substitution pattern to optimize monomer supply kinetics at the desired crystallization temperature. For example, monodisperse lead sulfide nanocrystals were synthesized from lead oleate and reactive disubstituted thioureas at temperatures from 90° to 150° C. Monodispersed CdS nanocrystals required higher temperature conditions (150° to 250° C.). Disubstituted thioureas converted at a rate that was limited by mixing during the injection. Instead, less-reactive N,N,N'-trialkylthioureas (9 to 11) or N,N,N',N'-tetramethylthiourea (12) were found to have the appropriate, controllable conversion reactivity. Monodisperse zinc sulfide nanocrystals could also be obtained, but only at high temperatures (≥240° C.). However, the lower reactivity of zinc oleate compared with cadmium oleate allowed more-reactive disubstituted thioureas to be used. In each case, the conversion reactivity could be optimized to induce nucleation shortly after injection at the temperature needed to obtain narrow size distributions. In this manner, a wide variety of metal sulfides were synthesized—including photoluminescent core-shell nanocrystals (CdSe/CdS/ZnS), plasmonic nanocrystals ($Cu_{2-x}S$), catalyst materials (NiS), complex compound semiconductors ($CuZnSnS_4$), and one-dimensional (1D) and 2D anisotropic nanostructures (CdS nanorods, SnS nanosheets)—across a diverse set of growth media, including amine, carboxylate, and phosphonate surfactant mixtures (FIGS. 12 to 25).

In addition to matching the demands of the crystallization and co-reactants, tunable monomer supply controlled the number of nanocrystals and thereby defined a desired size after 100% yield was reached. This principle was demonstrated by optimizing an inexpensive synthesis of lead sulfide nanocrystals with diameters from 2.5 to 7.2 nm [wavelength λmax ($1S_e$-$1S_h$) ~850 to 1800 nm, full width at half maximum (FWHM) ~30 to 160 meV] on multigram scales and in quantitative yield (as determined by the final absorbance at λ=400 nm, where the extinction coefficient was proportional to the concentration of lead sulfide formula units within nanocrystals) (FIG. 6(D). To ensure highly reproducible reactivity, 100-g batches of pure, hydroxide-free lead oleate were prepared by dissolving lead oxide in trifluoroacetic anhydride solution and neutralizing the lead trifluoroacetate product with oleic acid and triethylamine (FIG. 6(B)). N,N' disubstituted thioureas (1 to 8) reacted with lead oleate at temperatures at or below 150° C., providing access to colloidal PbS nanocrystals with linewidths of the $1S_e$-$1S_h$ absorption that are among the narrowest reported, including at sizes relevant for PbS solar cells. Concentrated conditions also proved accessible, allowing up to 6 g of nanocrystals to be prepared in 150 ml of solvent with a high degree of reproducibility. FIG. 9 shows the results of nine syntheses conducted using N,N'-diphenylthiourea (2) and six syntheses conducted using N-dodecyl-N'-phenylthiourea (3d) that produced between 0.2 and 6 g of nanocrystals. Within one set of conditions, a final size and size distribution were reliably obtained (FIG. 9). Moreover, little change in the final size and size distribution was observed as the scale, concentration, and stoichiometry were varied (10 to 150 ml, 25 to 100 mM, 1.2:1 to 3:1 Pb:S) (FIG. 9). The reproducibility and monodispersity were unusual given the high nanocrystal concentrations (up to 0.12 mM), illustrating the reliability and homogeneity provided by well-defined lead and thiourea precursors. To determine the relationship between conversion reactivity and the final size, the kinetics of lead sulfide formation were monitored in situ by tracking the absorbance at λ=400 nm. Lead sulfide formation approaches 100% yield within a few minutes and can be approximated by a single exponential process (FIG. 31), from which rate constants [$k_{obs(1)}$ to $k_{obs(8)}$ ($s^{-1}$)] were extracted. By normalizing $k_{obs(1)}$ through $k_{obs(8)}$ to the rate constant of the slowest precursor [$k_{obs(8)}$], the relative first-order rate constants [$k_{rel(1)}$ to $k_{rel(8)}$] were determined across a range of temperatures (90° to 150° C.), allowing the reactivity to be quantitatively compared over more than three orders of magnitude. These measurements showed a well-defined dependence of the conversion reactivity on the thiourea structure that was defined by the substituents. Within the disubstituted thiourea derivatives, the conversion rate constants decreased over three orders of magnitude upon replacing electron-withdrawing aryl substituents with alkyl substituents. Thus, N,N'-diarylthioureas such as N-(3,5,-bis-trifluoromethylphenyl)-N'-phenylthiourea (1) converted most rapidly, whereas N,N'-di-n-alkylthioureas (8) reacted 4000-fold more slowly. Similar reactivity trends were found with cadmium oleate (FIG. 37). Mixed N-alkyl-N'-aryl variants showed intermediate reactivity toward lead oleate that can be finely adjusted by appending electron withdrawing or donating substituents on the aromatic ring. The conversion rate constants of para-substituted N-p-X-phenyl-N'-n-dodecylthioureas (3a to 3f, where X=CN, $CF_3$, Cl, H, Me, MeO) increased by a factor of 20 as the para-substituent becomes increasingly electron withdrawing. The logarithms of the observed first-order rate constants were plotted versus the Hammett sigma parameter of the para-substituent in FIG. 38(D). A linear relationship was observed, demonstrating the well-behaved dependence of conversion kinetics on the thiourea acidity. A large positive slope (r=1.3) indicates a build-up of negative charge during the conversion reaction. These results can be explained by rate-limiting deprotonation of the thiourea or nucleophilic attack on the thiocarbonyl carbon. Conversion of 3d was faster in the presence of tri-n-butylamine and slower when oleic acid was present, both of which suggest that deprotonation of the thiourea precedes the formation of lead sulfide. Deprotonation of thiourea in water is known to speed its hydrolysis to cyanamide. Increasing steric bulk of the thiourea substituents also sped the rate of conversion (5 to 8); the increased bulk may have accelerated the elimination of lead sulfide from an intermediate lead thioureate complex formed by deprotonation of a lead-bound thiourea. Although detailed work is required to determine the precise conversion mechanism, these observations highlight the importance of the microscopic steps leading to the rate-determining precursor conversion step, which varied depending on the surfactants used as well as the nature of the metal co-reactant.

The nanocrystal concentrations obtained from 3a to 3f are plotted versus $k_{obs}$ in FIG. 39(D), where an eightfold increase in the conversion rate led to a fourfold increase in the nanocrystal concentration. The finely tuned monomer supply kinetics controlled the extent of nucleation, because the rate of Ostwald ripening was negligibly slow under these conditions. A similar dependence was observed in studies of zinc sulfide, copper sulfide, nickel sulfide, and cadmium sulfide nanocrystals. Tuning the precursor reactivity can also be used to finely control the aspect ratio of CdS nanorods; thioureas of decreasing reactivity (3f, 9, and 12) led to a systematic increase in the volume and rod aspect ratio, a trend that resulted from the lower nanocrystal concentration produced by slower conversion kinetics.

Without intending to be bound by the correctness of this theory, it is believed that the correlation between the concentration of nanocrystals and the precursor conversion rate during nucleation results from a nucleation process that continues until the collective consumption of monomers by growing nuclei exceeds monomer production by precursor conversion. At this point, the concentration of nuclei was sufficiently high to cause the supersaturation to drop and the nucleation process to end. Controlling the final size with the precursor reaction rate rather than modifying the crystallization medium (e.g., reaction temperature, solvent, and surfactant concentration), or limiting the conversion, greatly simplified the nanocrystal composition because both the starting materials as well as the reaction by-products can bind the nanocrystals.

Tuning size with precursor reactivity and running reactions to full conversion allowed the final ratio of lead sulfide product and unconverted lead oleate to be determined by the amounts of reactants used. This advance enabled a standard purification procedure to be optimized to reproducibly control the final oleate ligand shell and nanocrystal stoichiometry. Moreover, by using preformed lead oleate, syntheses run at or below 120° C. can be conducted in low-boiling solvents like 1-octene that were conveniently distilled under vacuum after completion of the synthesis. This reduced the volume of solvent used during the isolation and facilitates large-scale reactions. For example, nanocrystals with a 3.4-nm diameter were synthesized on a 3-g scale from a 1.5:1 lead oleate-to-2 mixture and isolated with 5.7 oleates per square nanometer of surface area, from which a Pb:S ratio of 1.26 was estimated. Larger nanocrystals (6.5 nm) with a lower surface area-to-volume ratio were synthesized on a 6-g scale with a lower lead oleate-to-3d ratio (1.2:1) and isolated with 2.9 oleates $nm^{-2}$, from a Pb:S ratio of 1.07 was estimated. In both cases, the purification was greatly simplified compared with methods where the conversion was limited. Rather than removing a large excess of unreacted metal precursor—a process that was complicated by the polymeric structures and low solubilities of zinc, cadmium, and lead carboxylates, phosphonates, and halides—a desired amount of remaining metal precursor can be chosen by the starting metal-to-sulfur ratio. Thus, obtaining a desired size at complete conversion was an important step toward reproducibly defining the surface structure and optoelectronic properties at large reaction scales.

As those skilled in the art will appreciate, numerous modifications and variations of the present invention are possible in light of these teachings, and all such are contemplated hereby. For example, in addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article, and such combinations are considered within the scope of this invention.

The disclosures of each patent, patent application, and publication cited or described in this document and the references cited therein are hereby incorporated herein by reference, each in its entirety, for all purposes.

What is claimed:

1. A method of preparing metal sulfide, metal selenide, metal sulfide/selenide, mixed metal sulfide, mixed metal selenide, or mixed metal sulfide/selenide nanoparticles, the method comprising:
   (a) contacting at least two precursor metal salts with a sulfur-containing precursor, a selenium-containing precursor, or a combination or mixture of the sulfur- and selenium-containing precursors, or
   (b) contacting a precursor metal salt with a sulfur-containing precursor, a selenium-containing precursor, or a mixture of sulfur- and selenium-containing precursors,
   in each case where plural precursor metal salts and/or sulfur-/seleno-containing precursors are employed, the contacting being done simultaneously or sequentially in either order in a solution, each precursor metal salt being capable of reacting with each sulfur- and selenium-containing precursor to form the corresponding metal sulfide and metal selenide, the contacting giving rise to reaction conditions sufficient to control at least one parameter of particle size, particle distribution, and particle composition of the nanoparticles to a predetermined architecture, the sulfur- or selenium-containing precursor each independently having a structure of Formula (I), Formula (II), or Formula (III), or an isomer, salt, or tautomer thereof,

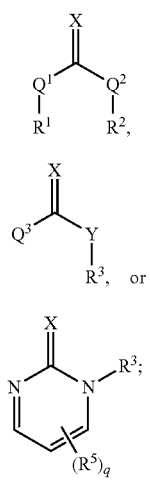

wherein
$Q^1$ is independently —O—, —S—, Se—, —$CR^3R^4$—, —N($R^4$)— or P($R^4$)—;
$Q^2$ is independently —O—, —S—, Se—, —$CR^3R^4$—, —N($R^3$)— or P($R^3$)—;
$Q^3$ is an optionally substituted aryl or optionally substituted heteroaryl;
$R^1$, $R^2$, $R^3$, and $R^4$ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

or any two of $R^1$, $R^2$, $R^3$, and $R^4$ are, within the same structure, linked to form a 5- to 10-membered heterocycle comprising an optionally substituted alkylene or an optionally substituted and/or conjugated alkenylene linkage;

or optionally one or more of $R^1$, $R^2$, and $R^3$ is not H;

$R^5$ is halogen, —CN, —$NO_2$, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;

X is S or Se; and

Y is a bond —O—, —S—, or —N($R^3$)—;

with the provisos that, in Formula (I):
  when $Q^1R^1$ is $NH_2$, then $Q^2R^2$ is not $CH_3$;
  when $Q^2R^2$ is $NH_2$, then $Q^1R^1$ is not $CH_3$; and
  when $Q^1$ is —N($R^4$)— and $Q^2$ is —N($R^3$)—, then $R^1$ and $R^2$ are linked to form a 5- or 6-membered heterocycle comprising an optionally substituted alkylene linkage or a 6-membered heterocycle comprising an optionally substituted alkenylene linkage.

2. The method of claim 1, comprising contacting two precursor metal salts with the sulfur-containing precursor, the selenium-containing precursor, or a combination of the sulfur- and selenium-containing precursors to form the nanoparticles.

3. The method of claim 1 comprising contacting a precursor metal salt with a combination of a sulfur-containing precursor and a selenium-containing precursor to form the nanoparticles.

4. The method of claim 1 comprising contacting a precursor metal salt with a sulfur-containing precursor, a selenium-containing precursor, or a mixture of sulfur-containing and selenium-containing precursors, each sulfur-containing or selenium-containing precursor independently having a structure of Formula (IA), Formula (II), or Formula (III), or an isomer, salt, or tautomer thereof, in solution under controlled nucleation and growth conditions for the formation of the monodispersed nanoparticles:

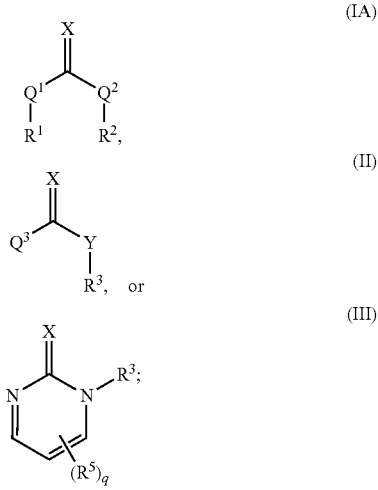

wherein
$Q^1$ is independently —O—, —S—, Se—, —$CR^3R^4$—, —N($R^4$) or P($R^4$)—;
$Q^2$ is independently —O—, —S—, Se—, —$CR^3R^4$—, —N($R^3$) or P($R^3$)—;

Q³ is optionally substituted aryl or optionally substituted heteroaryl;

R¹ and R² are independently at each occurrence optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

R³ and R⁴ are independently at each occurrence H, optionally substituted $C_{1-24}$ alkyl, optionally substituted $C_{3-12}$ cycloalkyl, optionally substituted $C_{2-24}$ alkenyl, optionally substituted $C_{3-12}$ cycloalkenyl, optionally substituted aryl, optionally substituted aralkyl, optionally substituted heteroaryl, or optionally substituted heteroaralkyl;

or any two of R¹, R², R³, and R⁴ are, within the same structure, linked to form an optionally substituted 5- to 10-membered heterocycle comprising an optionally substituted alkylene or an optionally substituted and/or conjugated alkenylene linkage;

or optionally one or more of R¹, R², and R³ is not H;

R⁵ is halogen, —CN, —NO₂, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl;

q is 0, 1, 2, or 3;

X is S or Se; and

Y is a bond —O—, —S— or —N(R³)—;

with the provisos that, in Formula (IA):
when Q¹R¹ is NH₂, then Q²R² is not CH₃;
when Q²R² is NH₂, then Q¹R¹ is not CH₃; and
when Q¹ is —N(R⁴)— and Q² is —N(R³)—, then R¹ and R² are linked to form a 5- or 6-membered heterocycle comprising an optionally substituted alkylene linkage or a 6-membered heterocycle comprising an optionally substituted alkenylene linkage.

5. The method of claim 4, wherein a mixture of a sulfur- and a selenium-containing precursor is used, the sulfur- and selenium-containing precursors exhibiting pseudo first order kinetics with respect to the metal precursor salt, the pseudo first kinetics of each having an associated pseudo first order rate constant, the ratio of the pseudo first order rate constants being in a range of from 1 to 10, under the reaction conditions employed.

6. The method of claim 5, wherein the pseudo-first order rate constants, $k_{obs}$ (s⁻¹) associated with at least one of the sulfur- or selenium-containing precursors with the metal containing precursor salt is in a range from $1 \times 10^{-4}$ to $1 \times 10^{-1}$.

7. The method of claim 1, wherein at least one of the sulfur- or selenium-containing precursors has a structure according to

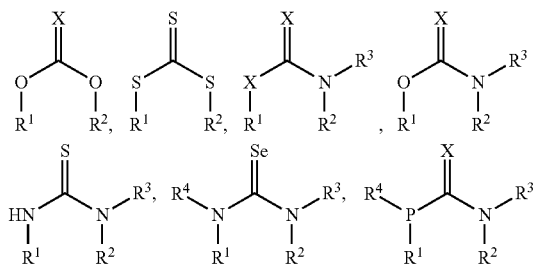

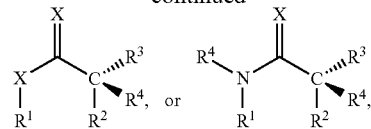

or an isomer, salt, or tautomer thereof.

8. The method of claim 1, wherein R¹ and R² are, within the same structure, linked to form a 5- to 10-membered heterocycle comprising an optionally substituted alkylene or an optionally substituted and/or conjugated alkenylene linkage.

9. The method of claim 1, wherein at least one of the sulfur- or selenium-containing precursors has a structure according to:

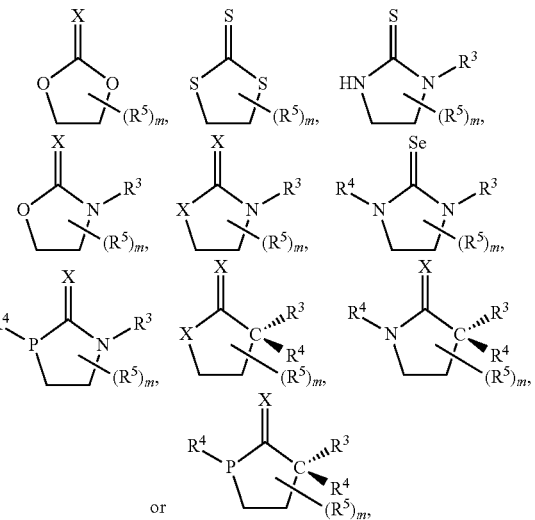

or an isomer, salt, or tautomer thereof, wherein m is 0, 1, 2, 3, or 4; and

R⁵ is halogen, —CN, —NO₂, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl.

10. The method of claim 1, wherein at least one of the sulfur- or selenium-containing precursors has a structure according to:

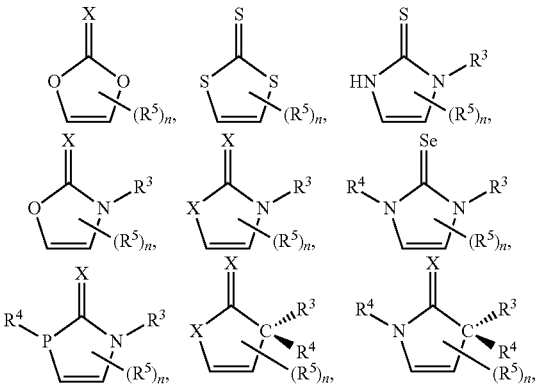

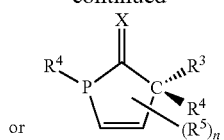

or an isomer, salt, or tautomer thereof, wherein n is 0, 1, or 2; and $R^5$ is halogen, —CN, —NO$_2$, C$_{1-6}$ alkoxy, C$_{1-6}$ alkyl, C$_{3-6}$ cycloalkyl, C$_{2-6}$ alkenyl, optionally substituted aryl, optionally substituted aryloxy, optionally substituted aralkyl, optionally substituted heteroaryl, or optionally substituted heteroaralkyl.

11. The method of claim 1, wherein at least one of the sulfur- or selenium-containing precursors has a structure according to:

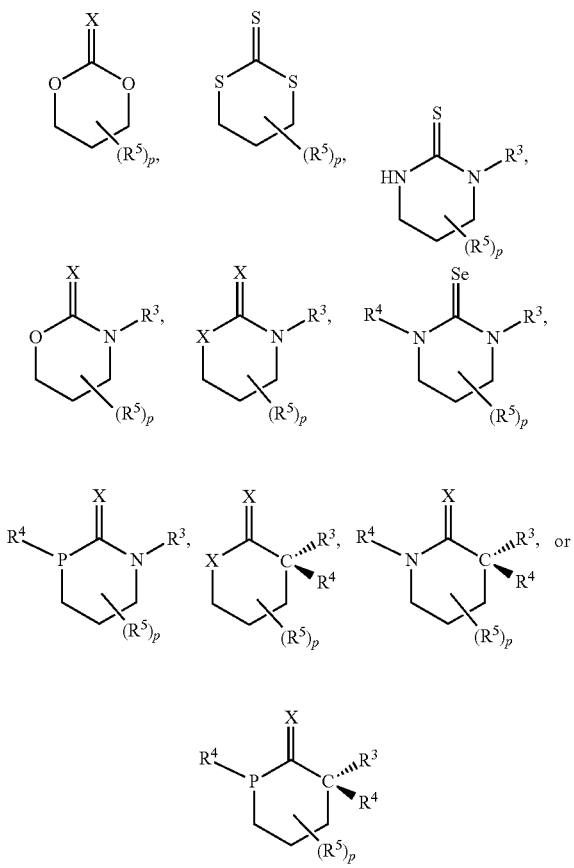

or an isomer, salt, or tautomer thereof, wherein p is 0, 1, 2, 3, 4, 5, or 6; and $R^5$ is halogen, —CN, —NO$_2$, C$_{1-6}$ alkoxy, C$_{1-6}$ alkyl, C$_{3-6}$ cycloalkyl, C$_{2-6}$ alkenyl, optionally substituted aryl, optionally substituted aryloxy, optionally substituted aralkyl, optionally substituted heteroaryl, or optionally substituted heteroaralkyl.

12. The method of claim 1, wherein at least one of the sulfur- or selenium-containing precursors has a structure according to:

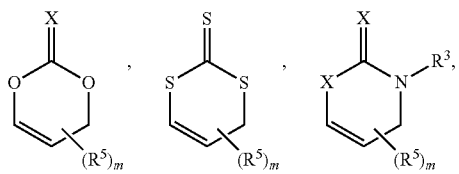

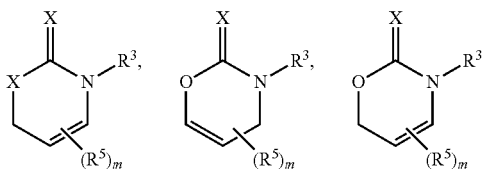

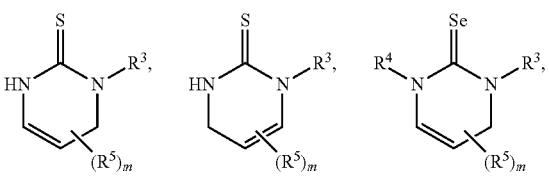

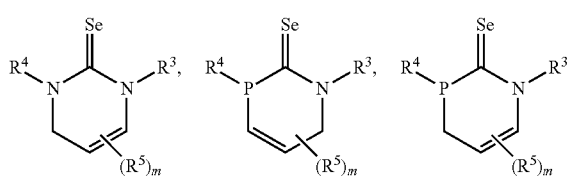

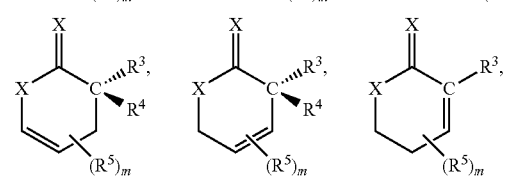

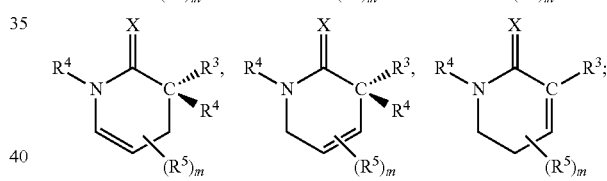

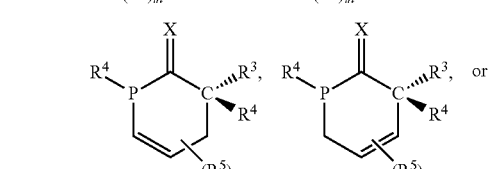

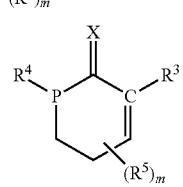

or an isomer, salt, or tautomer thereof, wherein m is 0, 1, 2, 3, or 4; and $R^5$ is halogen, —CN, —NO$_2$, C$_{1-6}$ alkoxy, C$_{1-6}$ alkyl, C$_{3-6}$ cycloalkyl, C$_{2-6}$ alkenyl, optionally substituted aryl, optionally substituted aryloxy, optionally substituted aralkyl, optionally substituted heteroaryl, or optionally substituted heteroaralkyl.

13. The method of claim 1, wherein at least one of the sulfur- or selenium-containing precursors has a structure according to:

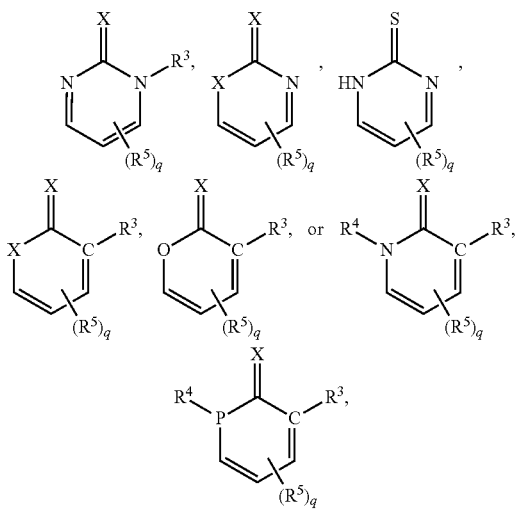

or an isomer, salt, or tautomer thereof,
wherein q is 0, 1, 2, or 3; and
R⁵ is halogen, —CN, —NO₂, $C_{1-6}$ alkoxy, $C_{1-6}$ alkyl, $C_{3-6}$ cycloalkyl, $C_{2-6}$ alkenyl, optionally substituted aryl, optionally substituted aryloxy, optionally substituted aralkyl, optionally substituted heteroaryl, or optionally substituted heteroaralkyl.

14. The method of claim 1, wherein at least one of the sulfur- or selenium-containing precursors has a structure according to:

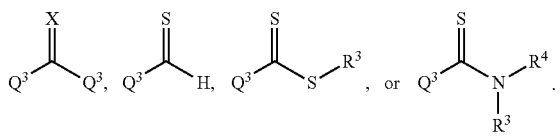

15. The method of claim 14, wherein $Q^3$ is phenyl or pyridinyl, optionally substituted with 0, 1, 2, 3, or 4 halogen, —CN, —NO₂, $C_{1-6}$ alkoxy, $C_{1-6}$ alkyl, $C_{3-6}$ cycloalkyl, $C_{2-6}$ alkenyl, optionally substituted aryl, optionally substituted aralkyloxy, optionally substituted aralkyl, optionally substituted heteroaryl, or optionally substituted heteroaralkyl.

16. The method of claim 1, wherein $R^3$ and $R^4$ are independently optionally substituted alkyl, optionally substituted aryl, or optionally substituted aralkyl.

17. The method of claim 1, wherein $R^5$ in Formula (III) is an optionally substituted alkyl, optionally substituted aryl, or optionally substituted aralkyl.

18. The method of claim 1 or claim 4, wherein X is S.

19. The method of claim 1 or claim 4, wherein X is Se.

20. The method of claim 1 or claim 4, wherein at least one of the precursor metal salts comprises Cd, Cu, Fe, Ga, Hg, In, Mn, Mo, Ni, Pb, or Zn.

21. The method of claim 1, wherein at least one of the precursor metal salts comprises a $C_{2-30}$ carboxylate, thiocarboxylate, (alkyl)phosphonate, alkylsulfonate, alkylphosphate, alkyl sulfate, alkylphosphonamide, or halide.

22. The method of claim 1, wherein at least one precursor metal salts comprises Cd, Cu, Fe, Ga, Hg, In, Mn, Mo, Ni, Pb, or Zn.

23. The method of claim 1, wherein the method comprises contacting a first and second precursor metal salt with a sulfur-containing precursor or a selenium-containing precursor in solution under controlled nucleation and growth conditions.

24. The method of claim 23, wherein the first and second precursor metal salts are contacted with the sulfur-containing precursor or the selenium-containing precursor at the same time.

25. The method of claim 23, wherein the first and second precursor metal salts are contacted with the sulfur-containing precursor or the selenium-containing precursor sequentially in either order.

26. The method of claim 1, wherein the method comprises contacting a precursor metal salt with a sulfur-containing precursor and a selenium-containing precursor in solution under controlled nucleation and growth conditions.

27. The method of claim 26, wherein the precursor metal salt is contacted with the sulfur-containing precursor and the selenium-containing precursor, at the same time.

28. The method of claim 26, wherein the precursor metal salt is contacted with the sulfur-containing precursor and the selenium-containing precursor sequentially in either order.

29. The method of claim 26, wherein the resulting nanoparticles having different amounts of metal sulfide and metal selenide therewithin.

30. The method of claim 1 or claim 4, resulting in a plurality of monodispersed nanoparticles, each nanoparticle exhibiting a variable composition of metal sulfide/metal selenide throughout its structure.

31. The method of claim 28, wherein the nanoparticles produced by the method comprise continuously varying graded metal sulfide/metal selenide structures.

32. The method of claim 28, wherein the nanoparticles produced by the method comprise discontinuously varying core-shell metal sulfide/metal selenide varies discontinuously core-shell structures.

33. The method of claim 1 or claim 4, wherein the solution is non-aqueous.

34. The method of claim 1 or claim 4, wherein the solution is or comprises an alkane, alkene, aromatic hydrocarbon, ether or a polyether, or a trialkyl- or triaylphosphine or trialkylphosphine oxide.

35. The method of claim 1, wherein the nanoparticles prepared by the method are substantially spherical, the nanoparticles having an average mean diameter in a range of from about 1 nm to about 10 nm.

36. The method of claim 1, wherein the nanoparticles prepared by the method are cylindrical having at least one dimension in a range of from about 1 nm to about 25 nm.

37. The method of claim 1, wherein nanoparticles prepared by the method exhibit a monodispersity characterized by a standard deviation variance of particle size of less than 5%, relative to the mean particle size of the nanoparticle, as measured by statistical samples of TEM micrographs.

38. The method of claim 1, wherein the metal sulfide, metal selenide, or mixed metal sulfide/selenide nanoparticles prepared by the method are crystalline.

39. The method of claim 1, wherein the metal sulfide, metal selenide, metal sulfide/selenide, mixed metal sulfide, mixed metal selenide, or mixed metal sulfide/selenide nanoparticles prepared by the method exhibit the characteristics of quantum dots.

40. The method of claim 1, wherein the nanoparticles prepared by the method comprise CdS, CdSe, CuS, CuSe, GaS, GaSe, InS, InSe, NiS, NiSe, PbS, PbSe, ZnS, ZnSe or a combination thereof.

41. The method of claim 1, wherein the size of each nanoparticle prepared by the method is greater than the Exciton Bohr radius of that material.

42. The method of claim 1, wherein the nanoparticles prepared by the method exhibit:
  (a) quantum yields of at least 80%;
  (b) less than 5% thermal droop at operating temperatures of 100° C.;
  (c) less than 10% flux density saturation at a flux of 100 mW/mm$^2$;
  (d) emission wavelengths within 5 nm precision while maintaining a linewidth in a range of 25 nm to 35 nm;
  (e) or any combination of two or more of (a)-(d).

* * * * *